United States Patent
Hinoue et al.

(10) Patent No.: US 10,950,627 B1
(45) Date of Patent: Mar. 16, 2021

(54) THREE-DIMENSIONAL MEMORY DEVICE INCLUDING SPLIT MEMORY CELLS AND METHODS OF FORMING THE SAME

(71) Applicant: SANDISK TECHNOLOGIES LLC, Addison, TX (US)

(72) Inventors: Tatsuya Hinoue, Yokkaichi (JP); Takaaki Iwai, Nagoya (JP); Shunsuke Takuma, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/707,541

(22) Filed: Dec. 9, 2019

(51) Int. Cl.
| | |
|---|---|
| H01L 27/11582 | (2017.01) |
| H01L 27/11519 | (2017.01) |
| H01L 27/1157 | (2017.01) |
| H01L 27/11556 | (2017.01) |
| H01L 27/11565 | (2017.01) |
| H01L 27/11524 | (2017.01) |

(52) U.S. Cl.
CPC .... *H01L 27/11582* (2013.01); *H01L 27/1157* (2013.01); *H01L 27/11519* (2013.01); *H01L 27/11524* (2013.01); *H01L 27/11556* (2013.01); *H01L 27/11565* (2013.01)

(58) Field of Classification Search
CPC ......... H01L 27/11582; H01L 27/11519; H01L 27/1157; H01L 27/11565; H01L 27/11556; H01L 27/11524
See application file for complete search history.

(56) References Cited

U.S. PATENT DOCUMENTS

| | | | |
|---|---|---|---|
| 5,915,167 A | 6/1999 | Leedy | |
| 9,620,514 B2 * | 4/2017 | Kai | H01L 27/11519 |
| 9,627,399 B2 | 4/2017 | Kanakamedala et al. | |
| 9,666,594 B2 | 5/2017 | Mizuno et al. | |
| 9,728,546 B2 | 8/2017 | Serov et al. | |
| 9,837,431 B2 | 12/2017 | Nishikawa et al. | |
| 9,935,123 B2 | 4/2018 | Nishikawa et al. | |
| 9,935,124 B2 | 4/2018 | Nishikawa et al. | |
| 10,381,376 B1 | 8/2019 | Nishikawa et al. | |
| 10,700,078 B1 * | 6/2020 | Cui | H01L 27/11575 |

(Continued)

OTHER PUBLICATIONS

U.S. Appl. No. 16/020,505, filed Jun. 27, 2018, SanDisk Technologies LLC.

(Continued)

*Primary Examiner* — Allison Bernstein
(74) *Attorney, Agent, or Firm* — The Marbury Law Group PLLC

(57) ABSTRACT

A three-dimensional memory device includes alternating stacks of insulating layers and electrically conductive layers located over a substrate. Each of the alternating stacks laterally extend along a first horizontal direction, and neighboring pairs of the alternating stacks are laterally spaced apart along a horizontal direction by laterally alternating sequences of memory openings and dielectric pillar structures. Each of the memory openings contains a respective memory opening fill structure that includes a dielectric core, a first vertical semiconductor channel, a second vertical semiconductor channel, a first memory film, and a second memory film. The dielectric core contacts a pair of dielectric pillar structures among the dielectric pillar structures of the laterally alternating sequences.

20 Claims, 64 Drawing Sheets

(56) References Cited

U.S. PATENT DOCUMENTS

| | | | |
|---|---|---|---|
| 10,700,086 B2* | 6/2020 | Makala | H01L 27/11524 |
| 10,700,090 B1* | 6/2020 | Cui | H01L 29/7926 |
| 10,720,444 B2* | 7/2020 | Nishikawa | H01L 29/40117 |
| 2009/0296476 A1 | 12/2009 | Shin et al. | |
| 2016/0071860 A1 | 3/2016 | Kai et al. | |
| 2016/0071861 A1 | 3/2016 | Serov et al. | |
| 2016/0071876 A1 | 3/2016 | Mizuno et al. | |
| 2016/0126292 A1 | 5/2016 | Yanagida et al. | |
| 2016/0260725 A1 | 9/2016 | Jung | |
| 2017/0025431 A1 | 1/2017 | Kanakamedala et al. | |
| 2017/0148805 A1 | 5/2017 | Nishikawa et al. | |
| 2017/0148808 A1 | 5/2017 | Nishikawa et al. | |
| 2017/0148809 A1 | 5/2017 | Nishikawa et al. | |
| 2018/0040623 A1 | 2/2018 | Kanakamedala et al. | |
| 2018/0323208 A1 | 11/2018 | Sugino et al. | |
| 2019/0221575 A1 | 7/2019 | Dong et al. | |
| 2019/0252405 A1 | 8/2019 | Tsutsumi | |
| 2020/0006375 A1* | 1/2020 | Zhou | H01L 27/1157 |
| 2020/0098773 A1* | 3/2020 | Kaneko | H01L 27/11519 |
| 2020/0098787 A1* | 3/2020 | Kaneko | H01L 21/31144 |

OTHER PUBLICATIONS

U.S. Appl. No. 16/021,899, filed Jun. 28, 2018, SanDisk Technologies LLC.
U.S. Appl. No. 16/136,652, filed Sep. 20, 2018, SanDisk Technologies LLC.
U.S. Appl. No. 16/142,447, filed Sep. 28, 2018, SanDisk Technologies LLC.
U.S. Appl. No. 16/278,426, filed Feb. 18, 2019, SanDisk Technologies LLC.
U.S. Appl. No. 16/278,488, filed Feb. 18, 2019, SanDisk Technologies LLC.
U.S. Appl. No. 16/423,500, filed May 28, 2019, SanDisk Technologies LLC.
Notification of Transmittal of the International Search Report and Written Opinion of the International Search Authority or International Patent Application No. PCT/US2020/024818, dated Sep. 8, 2020, 9 pages.

* cited by examiner

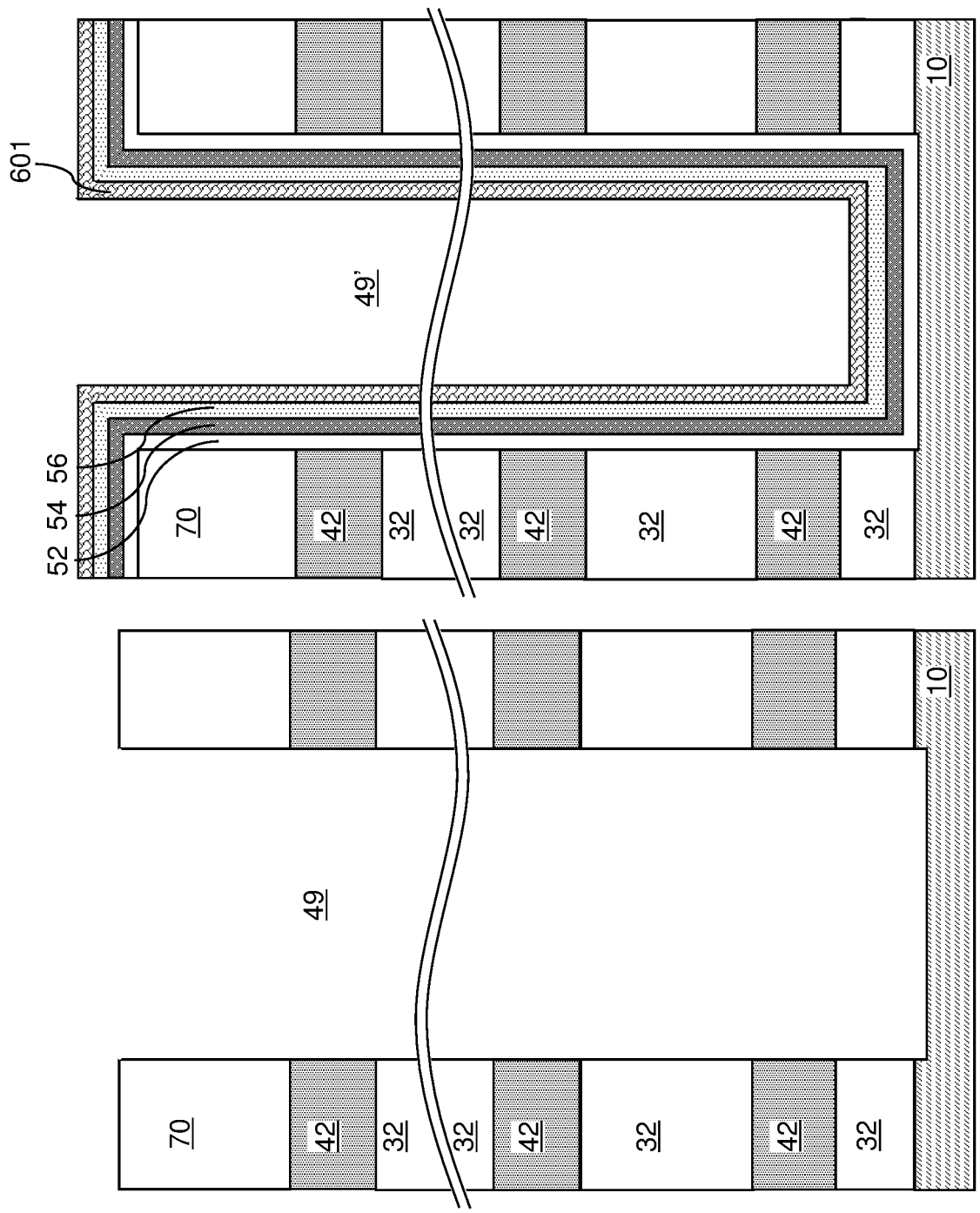

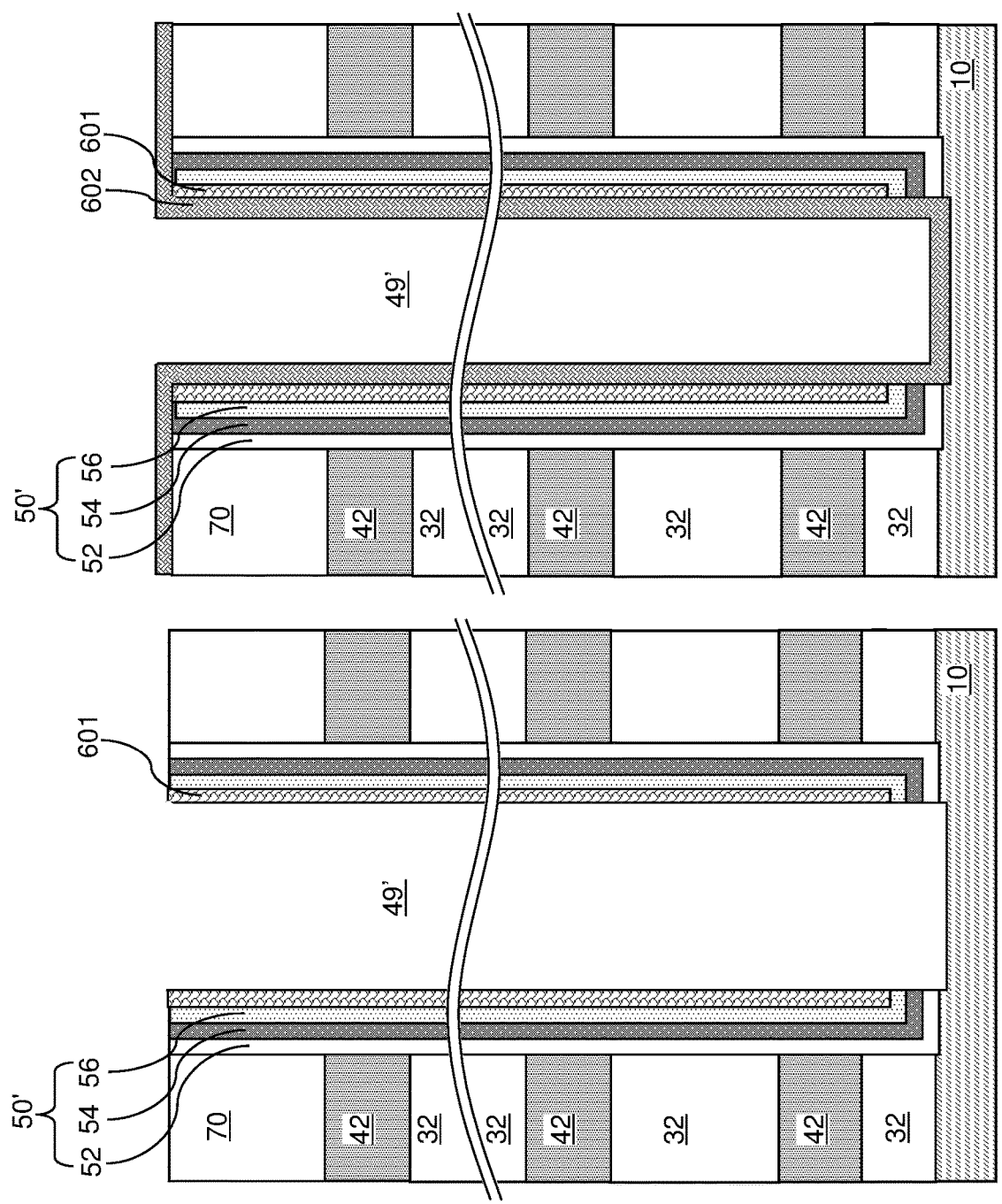

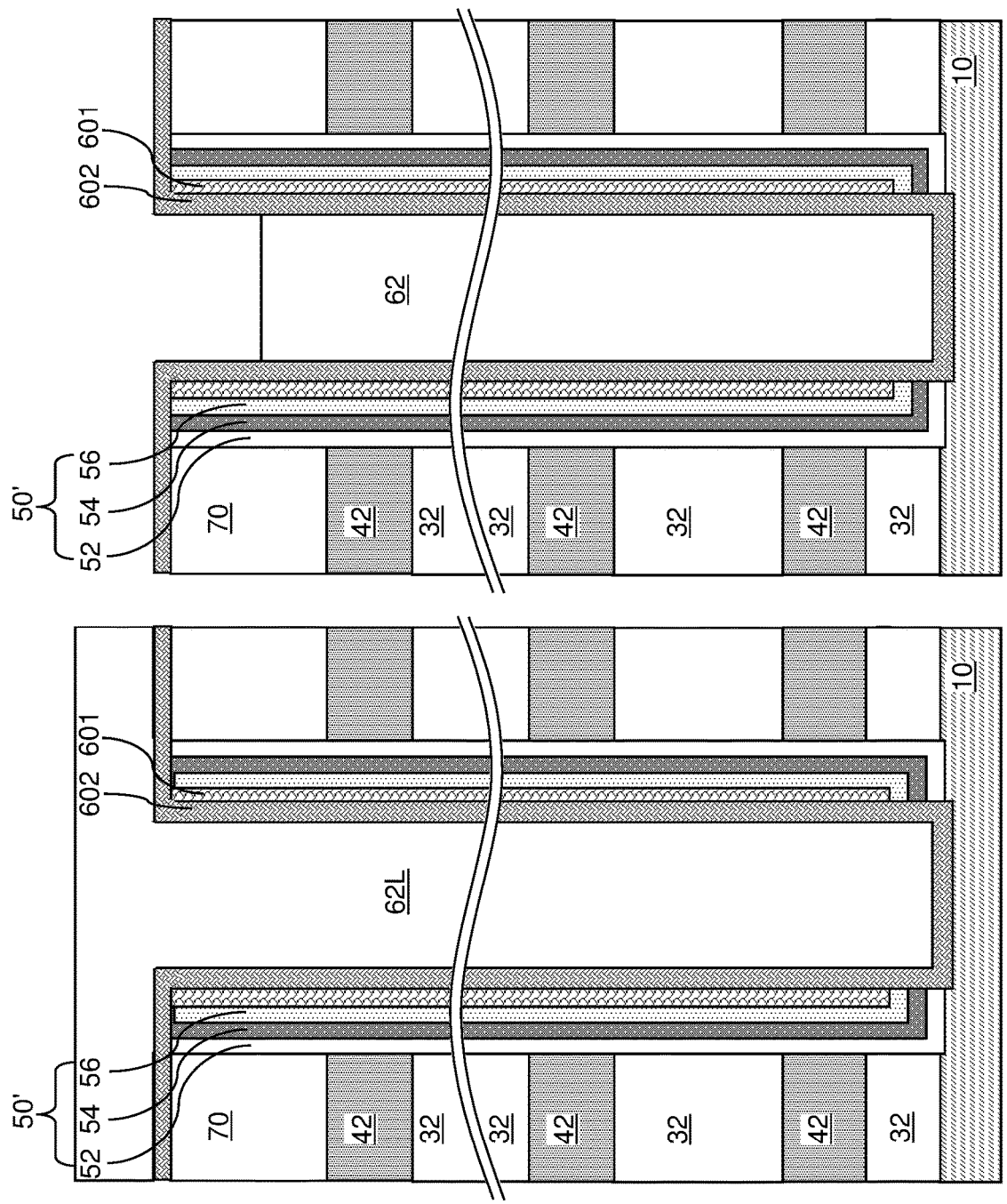

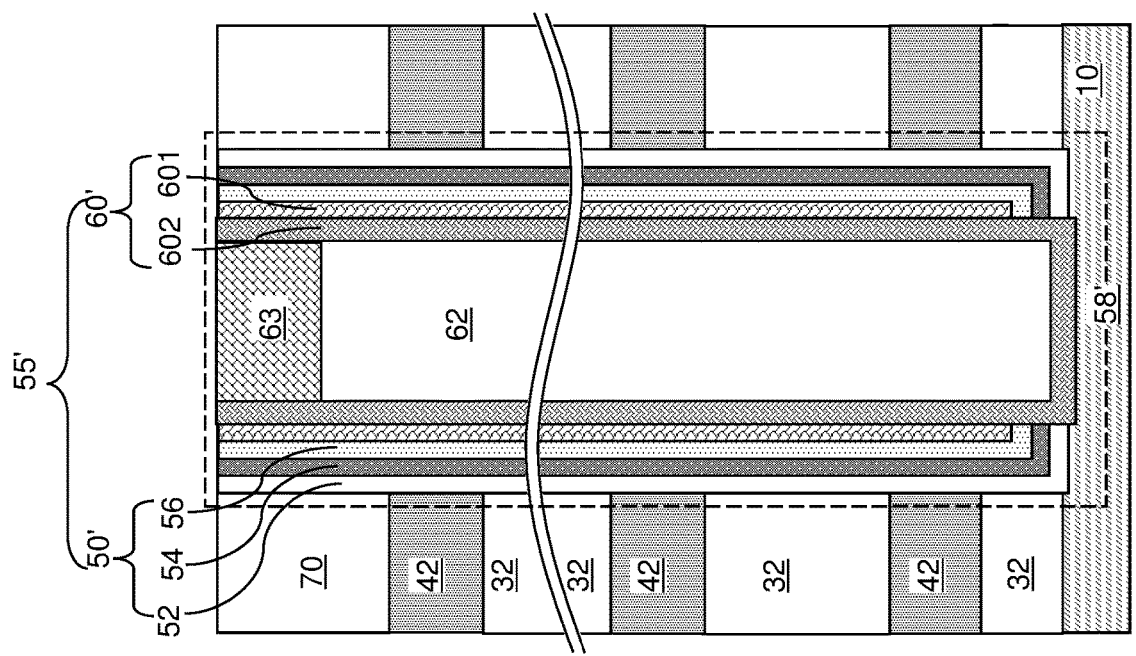

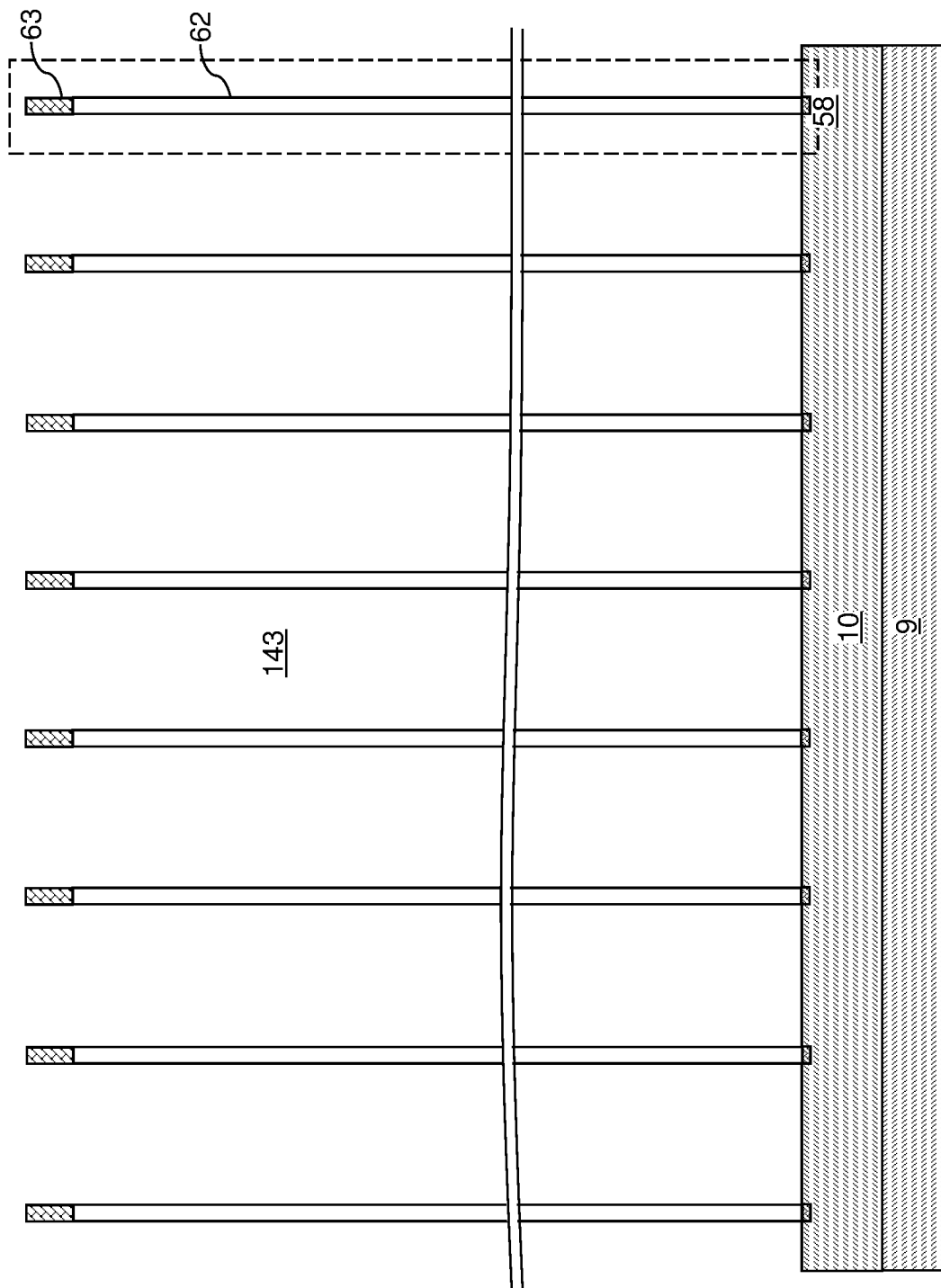

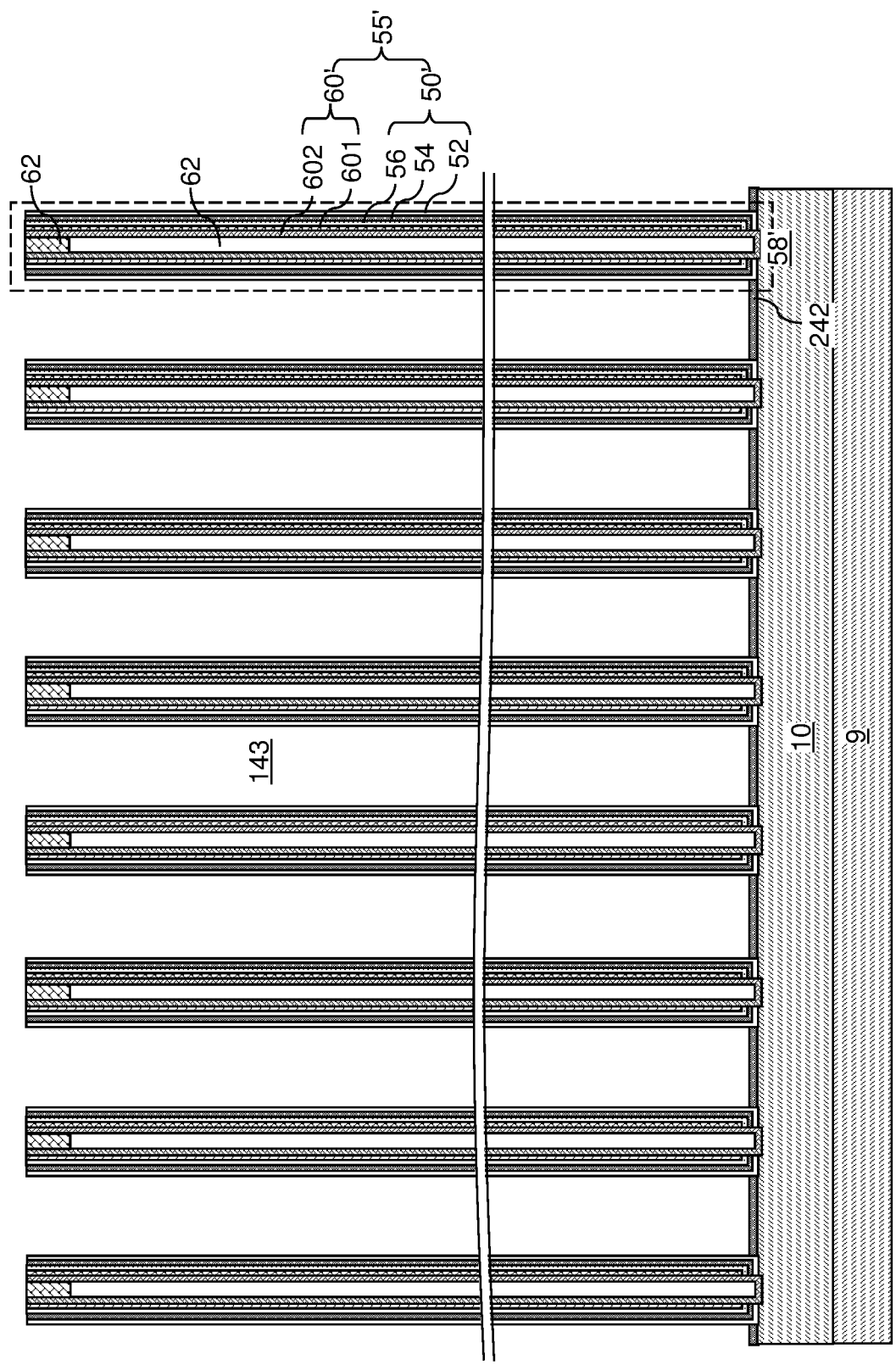

THREE-DIMENSIONAL MEMORY DEVICE INCLUDING SPLIT MEMORY CELLS AND METHODS OF FORMING THE SAME

FIELD

The present disclosure relates generally to the field of semiconductor devices and specifically to a three-dimensional memory device including split memory cells and methods of forming the same.

BACKGROUND

Recently, ultra high density storage devices have been proposed using a three-dimensional (3D) stacked memory stack structure sometimes referred to as a Bit Cost Scalable (BiCS) architecture. For example, a 3D NAND stacked memory device can be formed from an array of alternating conductive and dielectric layers. A through-stack opening is formed through the layers to define many memory layers simultaneously. A NAND string is then formed by filling the through-stack opening with appropriate materials.

SUMMARY

According to an aspect of the present disclosure, a three-dimensional memory device is provided, which comprises: alternating stacks of insulating layers and electrically conductive layers located over a substrate, wherein each of the alternating stacks laterally extend along a first horizontal direction and neighboring pairs of the alternating stacks are laterally spaced apart along a second horizontal direction by laterally alternating sequences of memory openings and dielectric pillar structures, wherein: each of the memory openings comprises a respective memory opening fill structure that includes a dielectric core, a first vertical semiconductor channel located on a first segment of a sidewall of the dielectric core, a second vertical semiconductor channel located on a second segment of the sidewall of the dielectric core and is physically disjoined from the first vertical semiconductor channel, a first memory film contacting the first vertical semiconductor channel, and a second memory film contacting the second vertical semiconductor channel; and the dielectric core contacts a pair of dielectric pillar structures among the dielectric pillar structures of the laterally alternating sequences.

According to another aspect of the present disclosure, a method of forming a three-dimensional memory device is provided, which comprises: forming a vertically alternating sequence of continuous insulating layers and continuous spacer material layers over a substrate; forming laterally alternating sequences of sacrificial pillar structures and memory openings through the vertically alternating sequence, wherein each of the laterally alternating sequences extends along a first horizontal direction and the vertically alternating sequence is divided into alternating stacks of insulating layers and spacer material layers by the laterally alternating sequences of the sacrificial pillar structures and the memory openings; forming in-process memory opening fill structures in the memory openings, wherein each of the in-process memory opening fill structures comprises an in-process memory film and an in-process vertical semiconductor channel; removing the sacrificial pillar structures selective to the in-process memory opening fill structures; dividing each of the in-process memory films into a respective pair of a first memory film and a second memory film; and dividing each of the in-process vertical semiconductor channels into a respective pair of a first vertical semiconductor channel and a second vertical semiconductor channel.

the continuous spacer material layers comprise a sacrificial material; and

Figure 3:
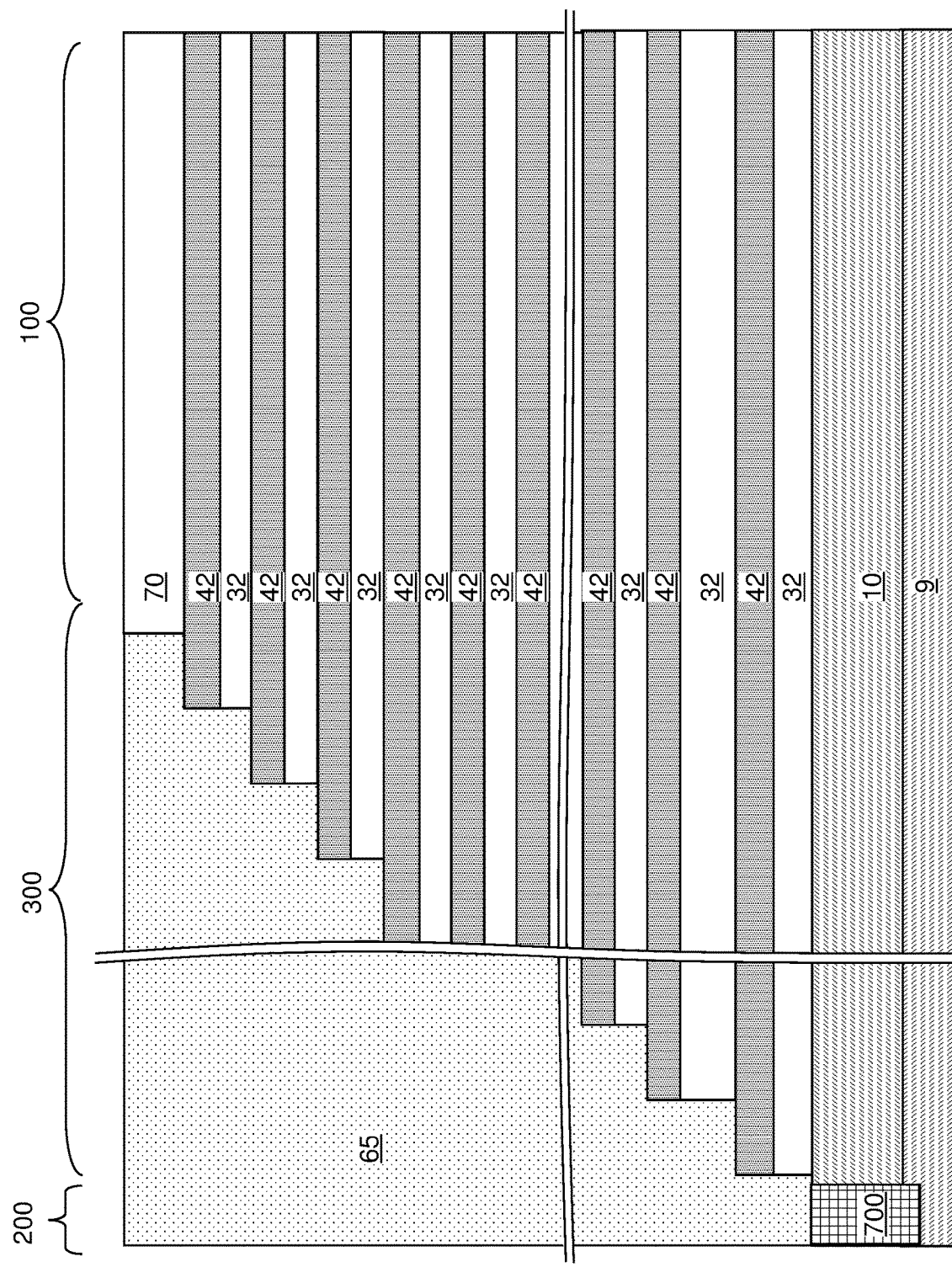

FIG. 3 is a vertical cross-sectional view of the first exemplary structure after formation of stepped terraces and a retro-stepped dielectric material portion according to the first embodiment of the present disclosure.

Figure 4A:
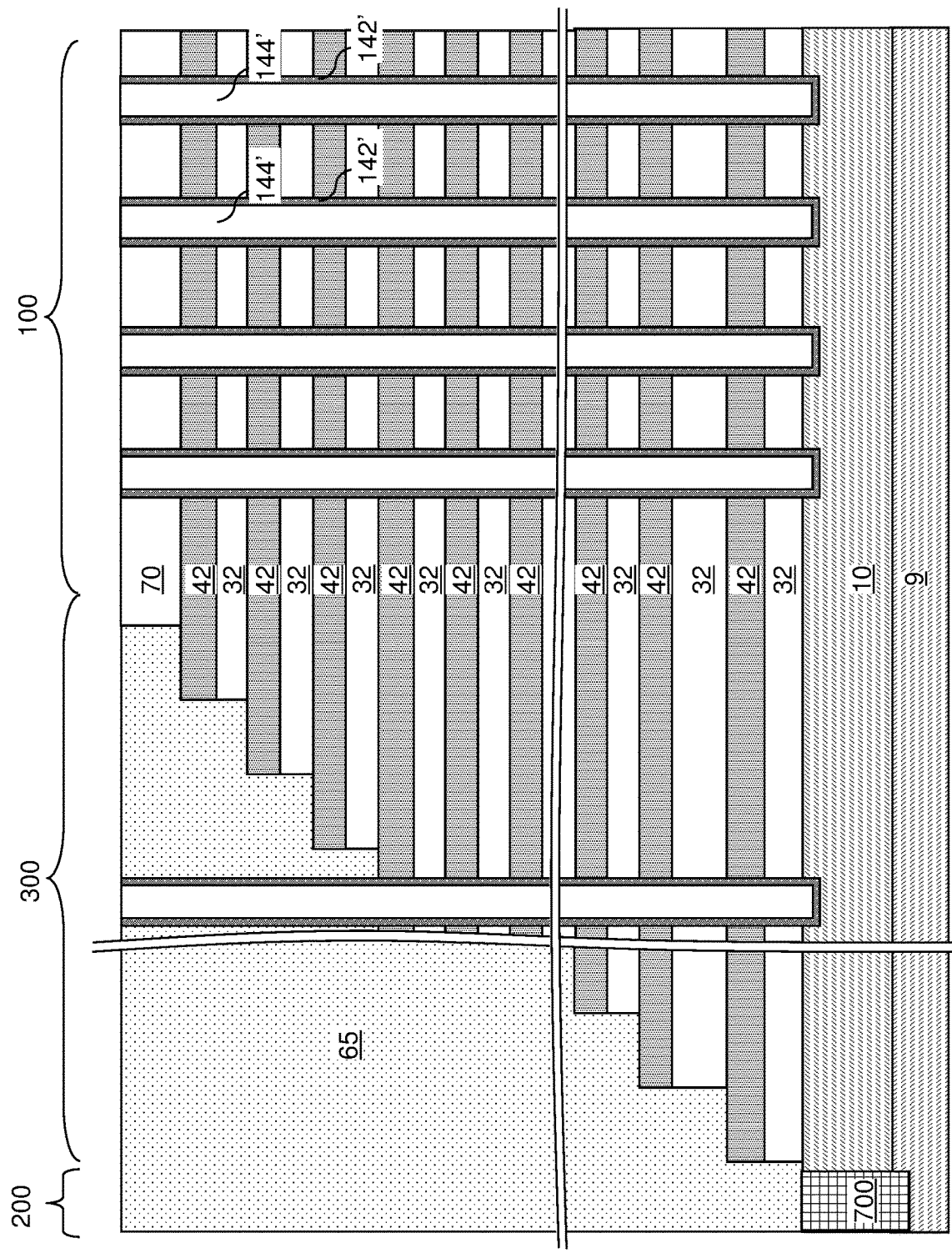

FIG. 4A is a vertical cross-sectional view of the first exemplary structure after formation of in-process sacrificial fill structures including a respective etch stop sacrificial liner and a respective sacrificial fill material rail through the alternating stack according to the first embodiment of the present disclosure.

Figure 4B:
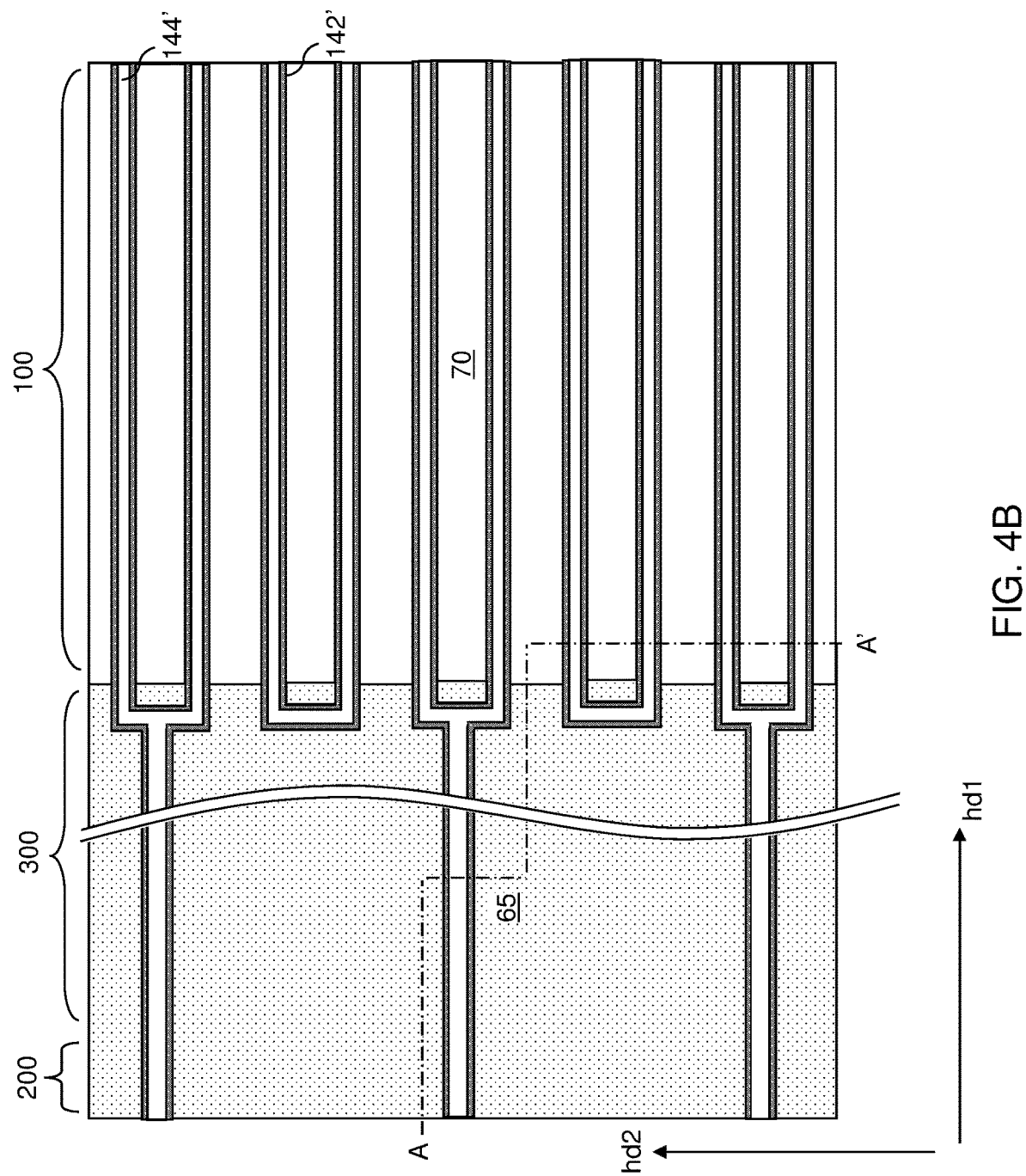

FIG. 4B is a top-down view of the first exemplary structure of FIG. 4A. The vertical plane A-A' corresponds to the plane of the vertical cross-sectional view of FIG. 4A.

Figure 5A:
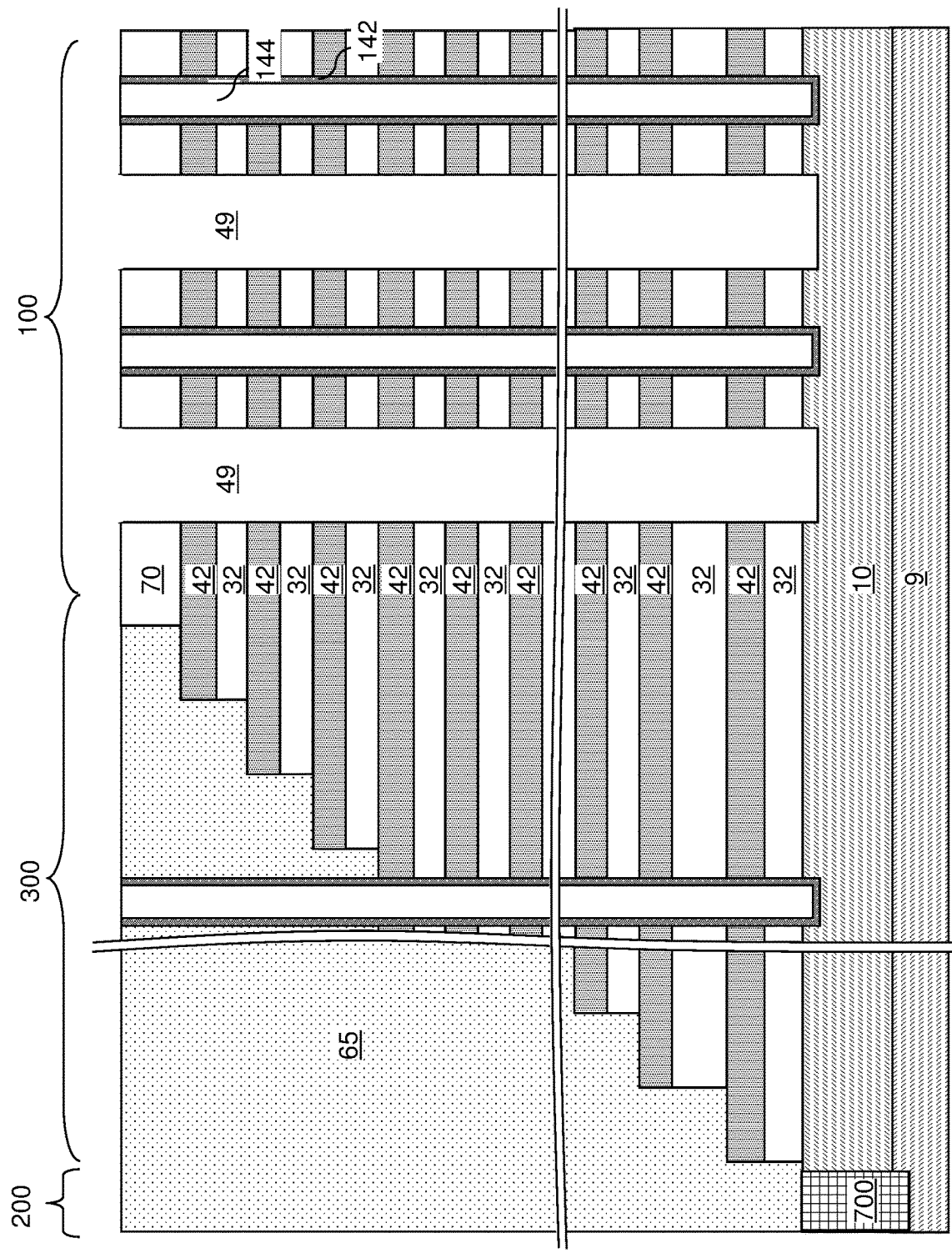

FIG. 5A is a vertical cross-sectional view of the first exemplary structure after formation of memory openings through the in-process sacrificial fill structures according to the first embodiment of the present disclosure.

Figure 5B:
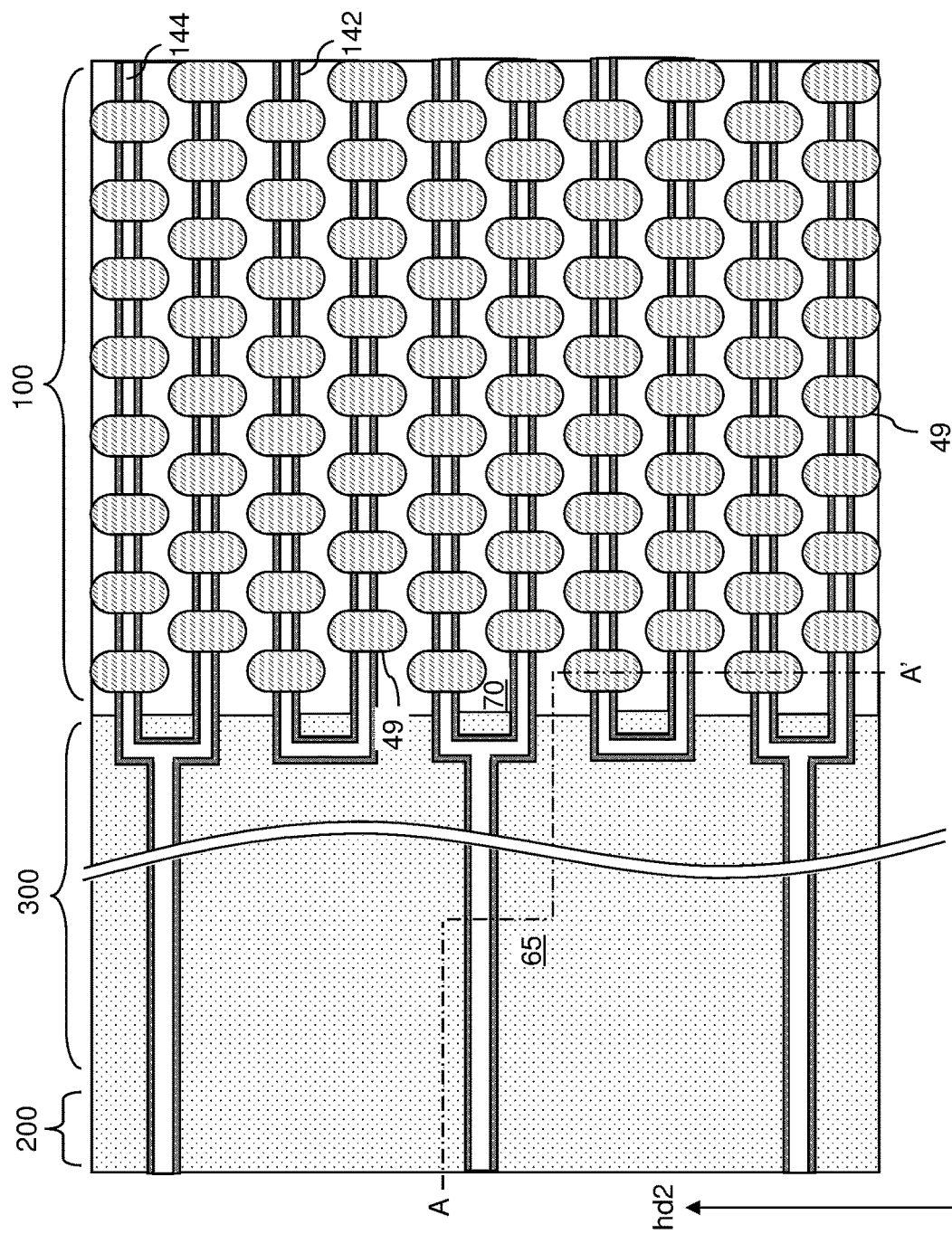

FIG. 5B is a top-down view of the first exemplary structure of FIG. 5A. The vertical plane A-A' corresponds to the plane of the vertical cross-sectional view of FIG. 5A.

FIGS. 6A-6G are sequential vertical cross-sectional view of a memory opening during formation of an in-process memory opening fill structure and sacrificial pillar structures within the first exemplary structure according to the first embodiment of the present disclosure.

Figure 7A:
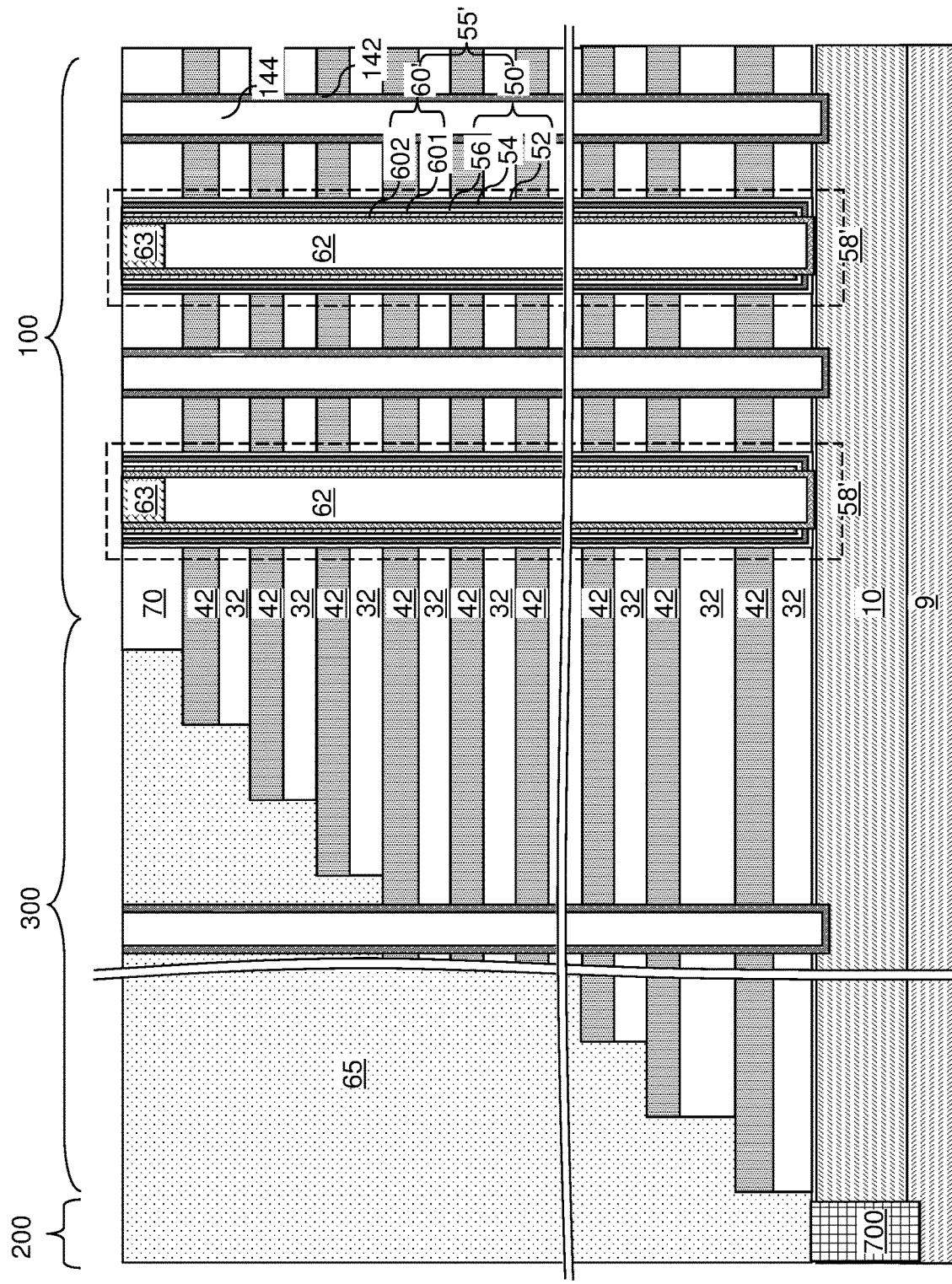

FIG. 7A is a vertical cross-sectional view of the first exemplary structure after formation of the in-process memory opening fill structures according to the first embodiment of the present disclosure.

Figure 7B:
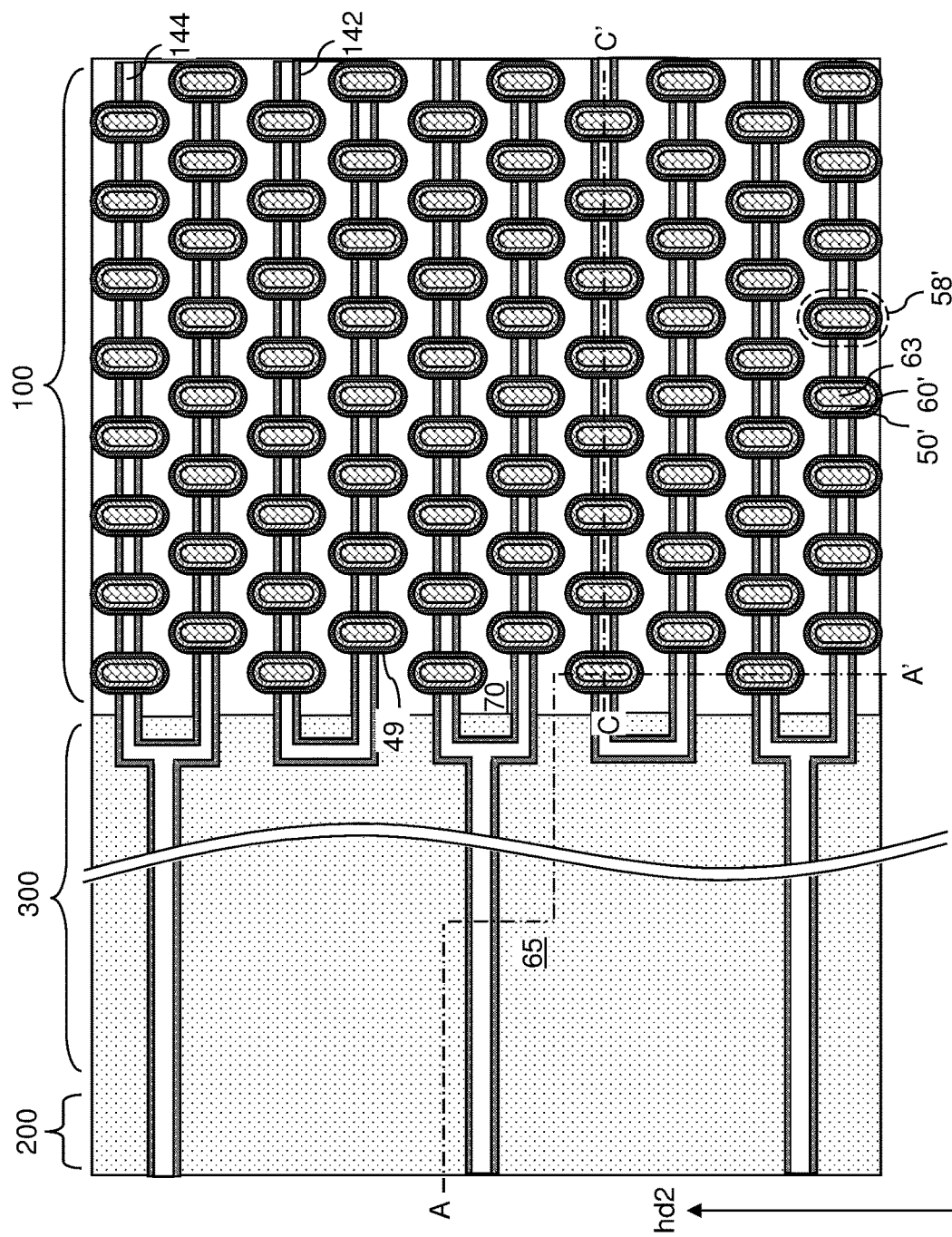

FIG. 7B is a top-down view of the first exemplary structure of FIG. 7A. The vertical plane A-A' corresponds to the plane of the vertical cross-sectional view of FIG. 7A.

Figure 7C:
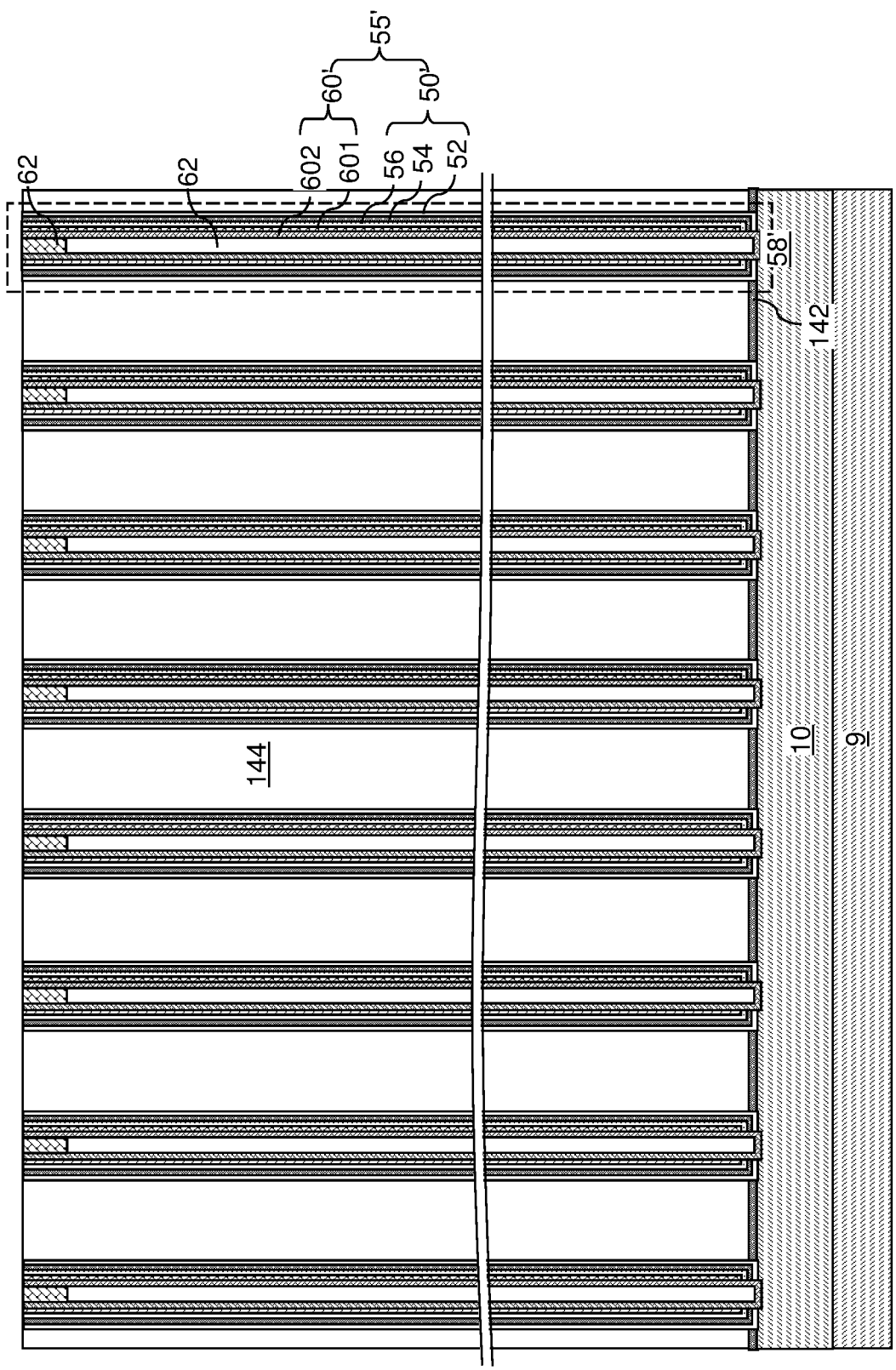

FIG. 7C is a vertical cross-sectional view along the vertical plane C-C' of FIG. 7B.

Figure 8A:
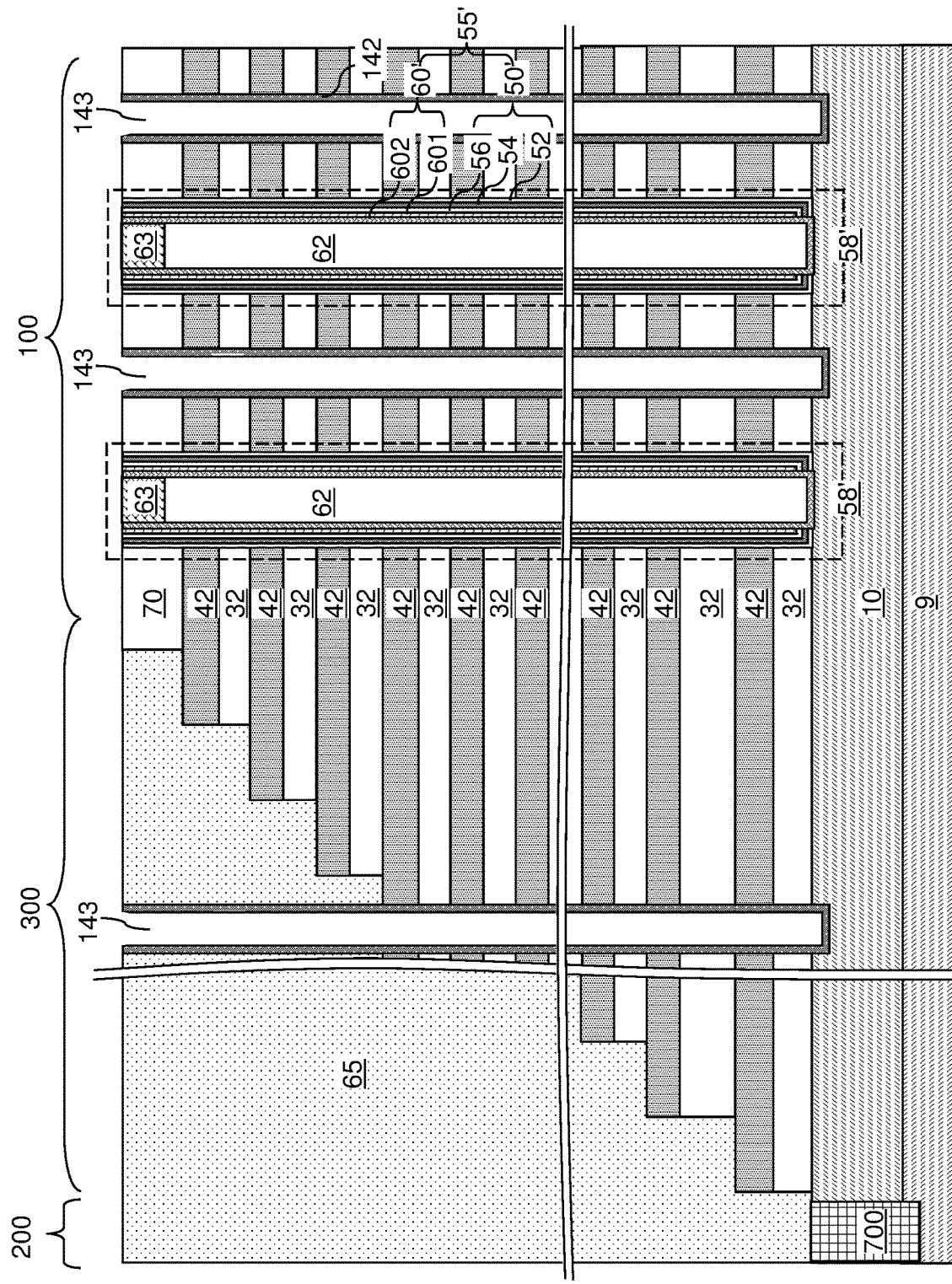

FIG. 8A is a vertical cross-sectional view of the first exemplary structure after removal of the sacrificial fill material portions selective to etch stop sacrificial liners according to the first embodiment of the present disclosure.

Figure 8B:
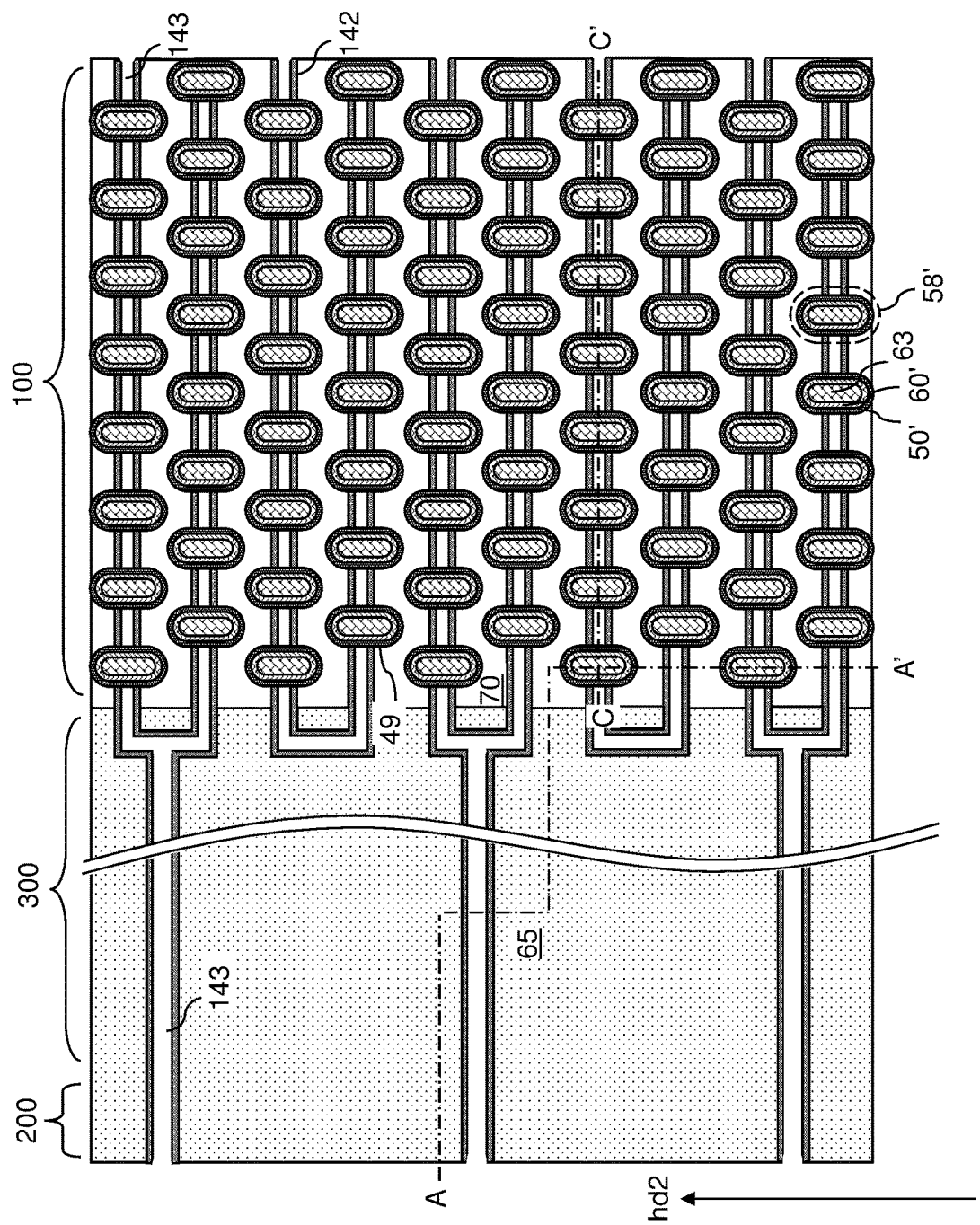

FIG. 8B is a top-down view of the first exemplary structure of FIG. 8A. The vertical plane A-A' corresponds to the plane of the vertical cross-sectional view of FIG. 8A.

Figure 8C:
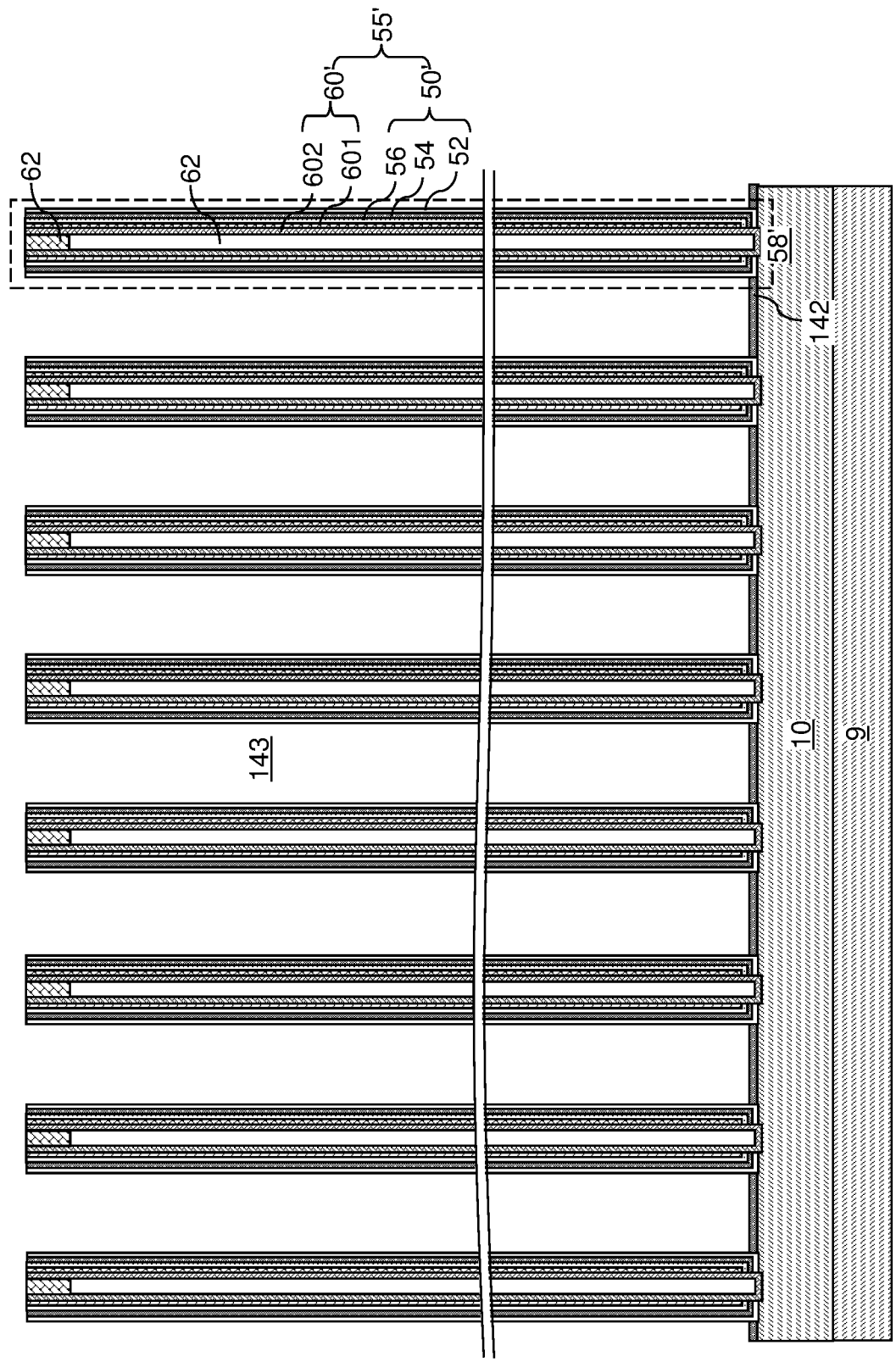

FIG. 8C is a vertical cross-sectional view along the vertical plane C-C' of FIG. 8B.

Figure 9A:
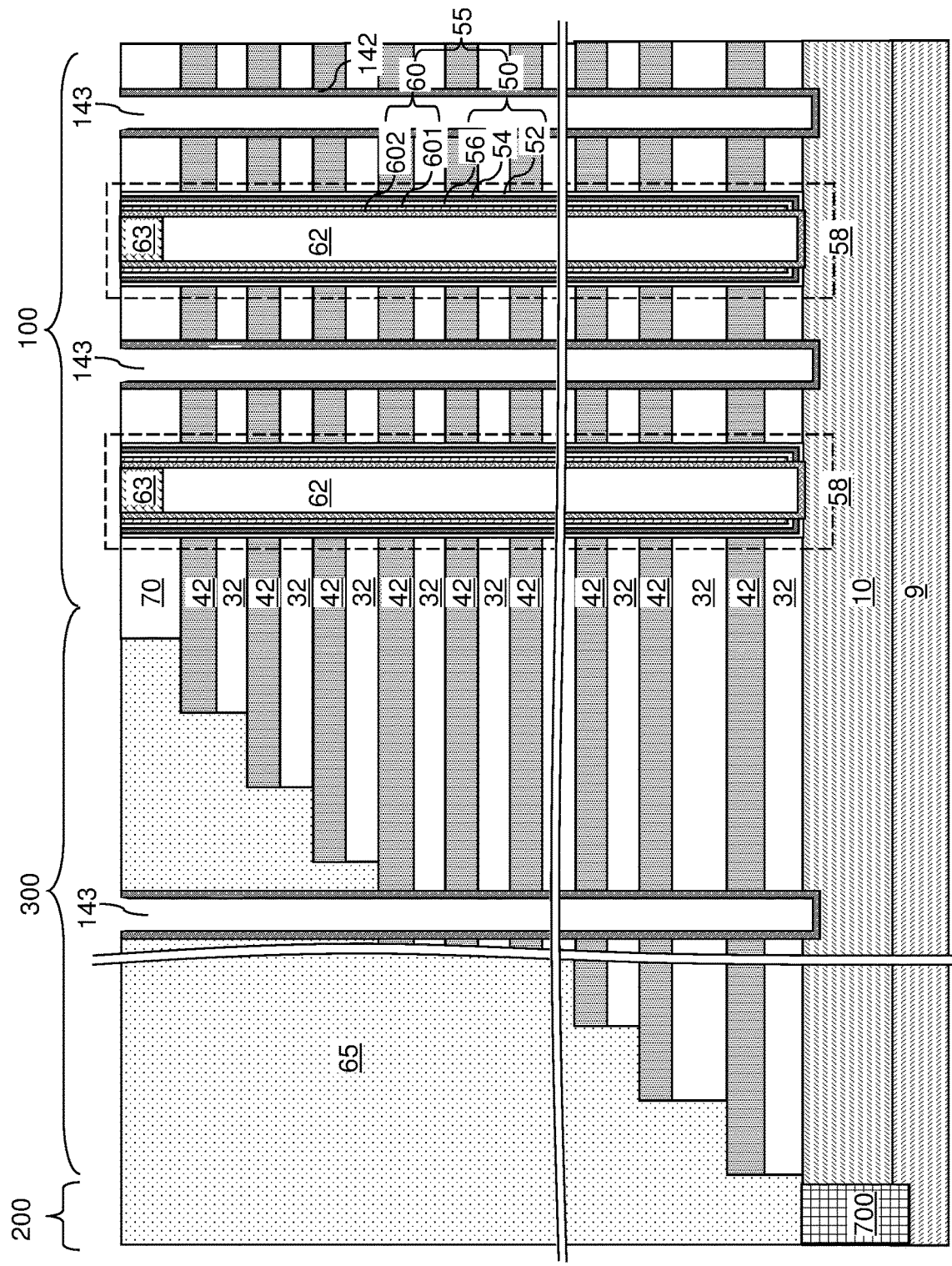

FIG. 9A is a vertical cross-sectional view of the first exemplary structure after a first isotropic etch process that etches physically exposed portions of the in-process memory films and a second isotropic etch process that etches physically exposed portions of the in-process vertical semiconductor channels according to the first embodiment of the present disclosure.

Figure 9B:
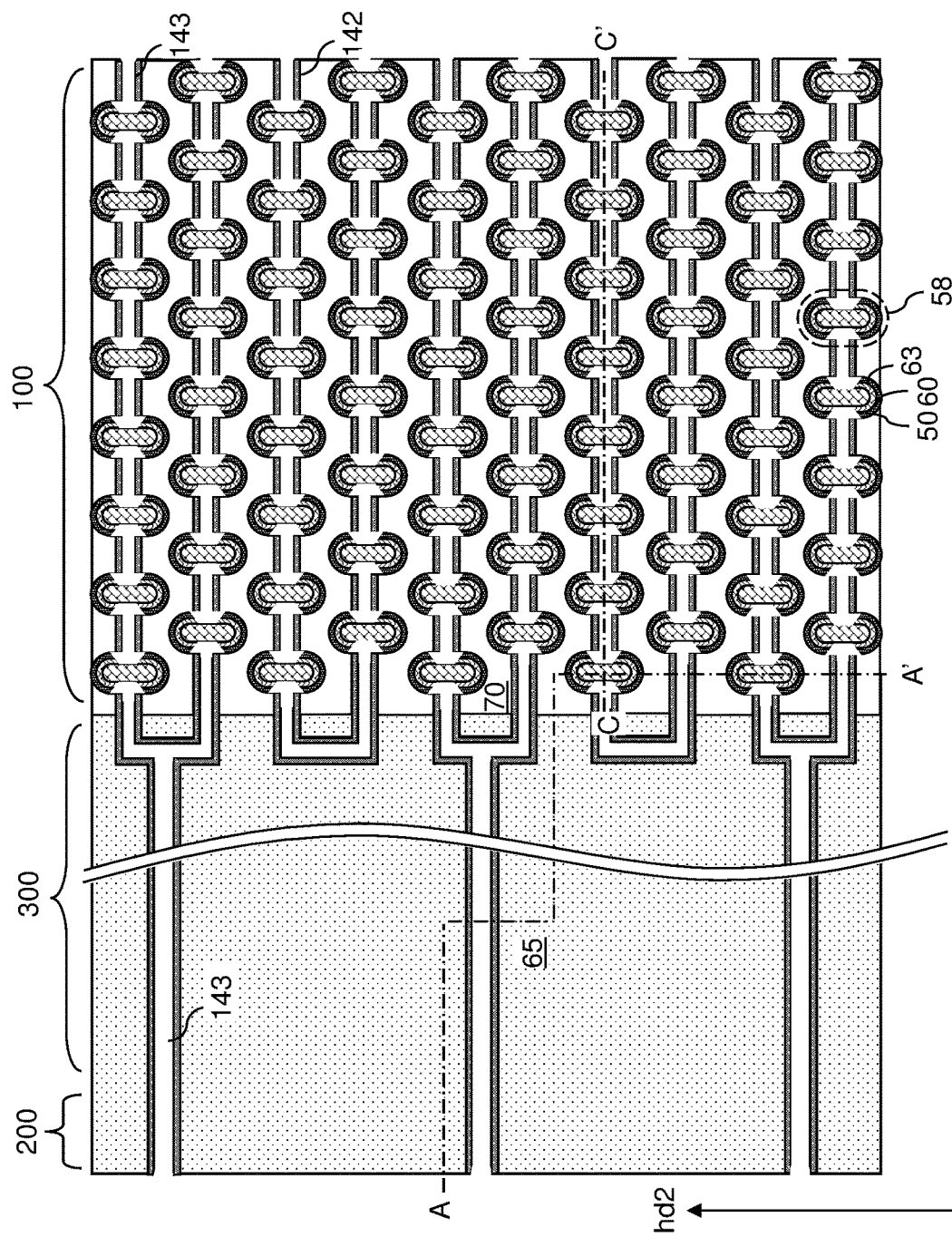

FIG. 9B is a top-down view of the first exemplary structure of FIG. 9A. The vertical plane A-A' corresponds to the plane of the vertical cross-sectional view of FIG. 9A.

Figure 9C:
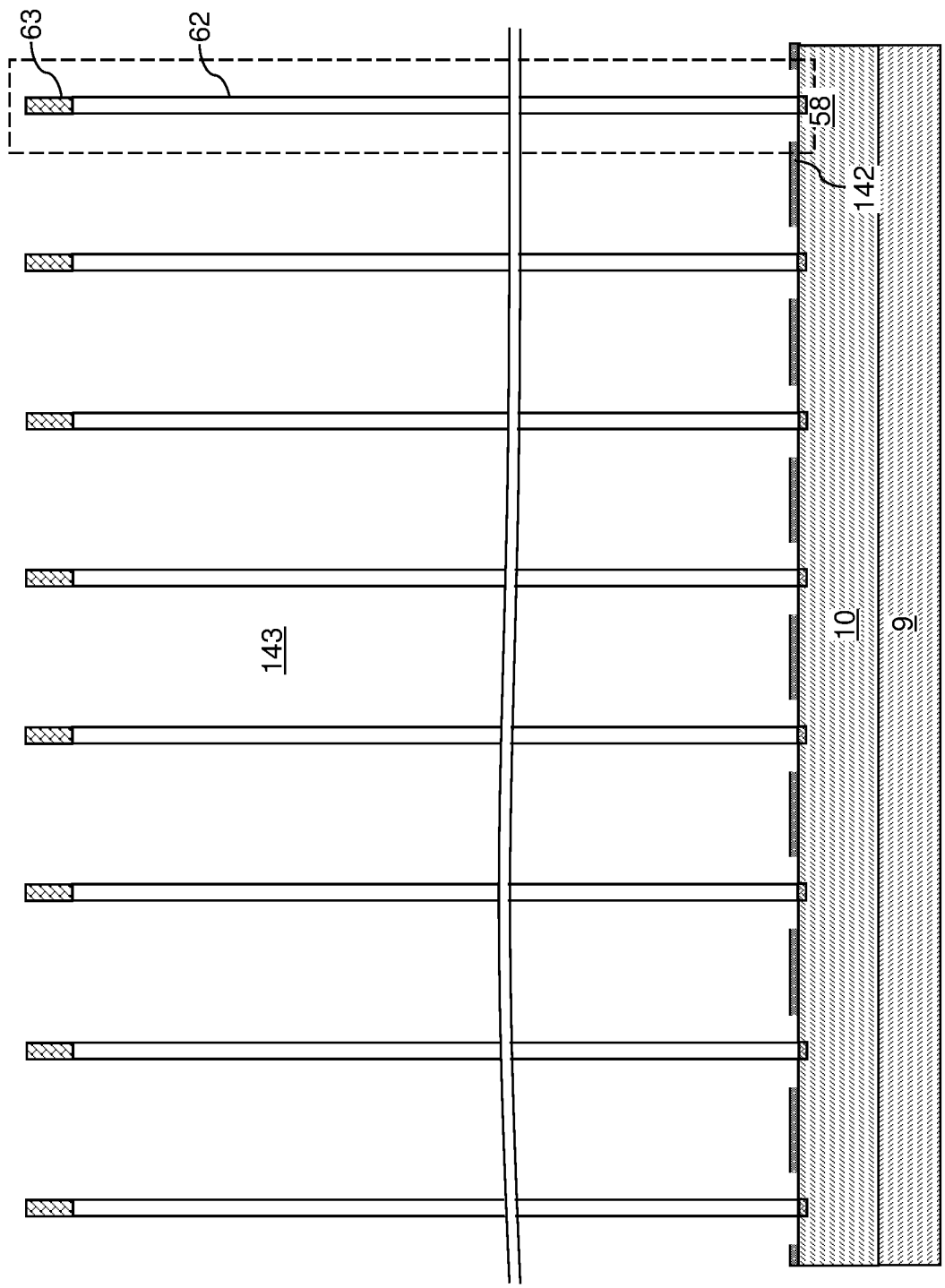

FIG. 9C is a vertical cross-sectional view along the vertical plane C-C' of FIG. 9B.

Figure 9D:
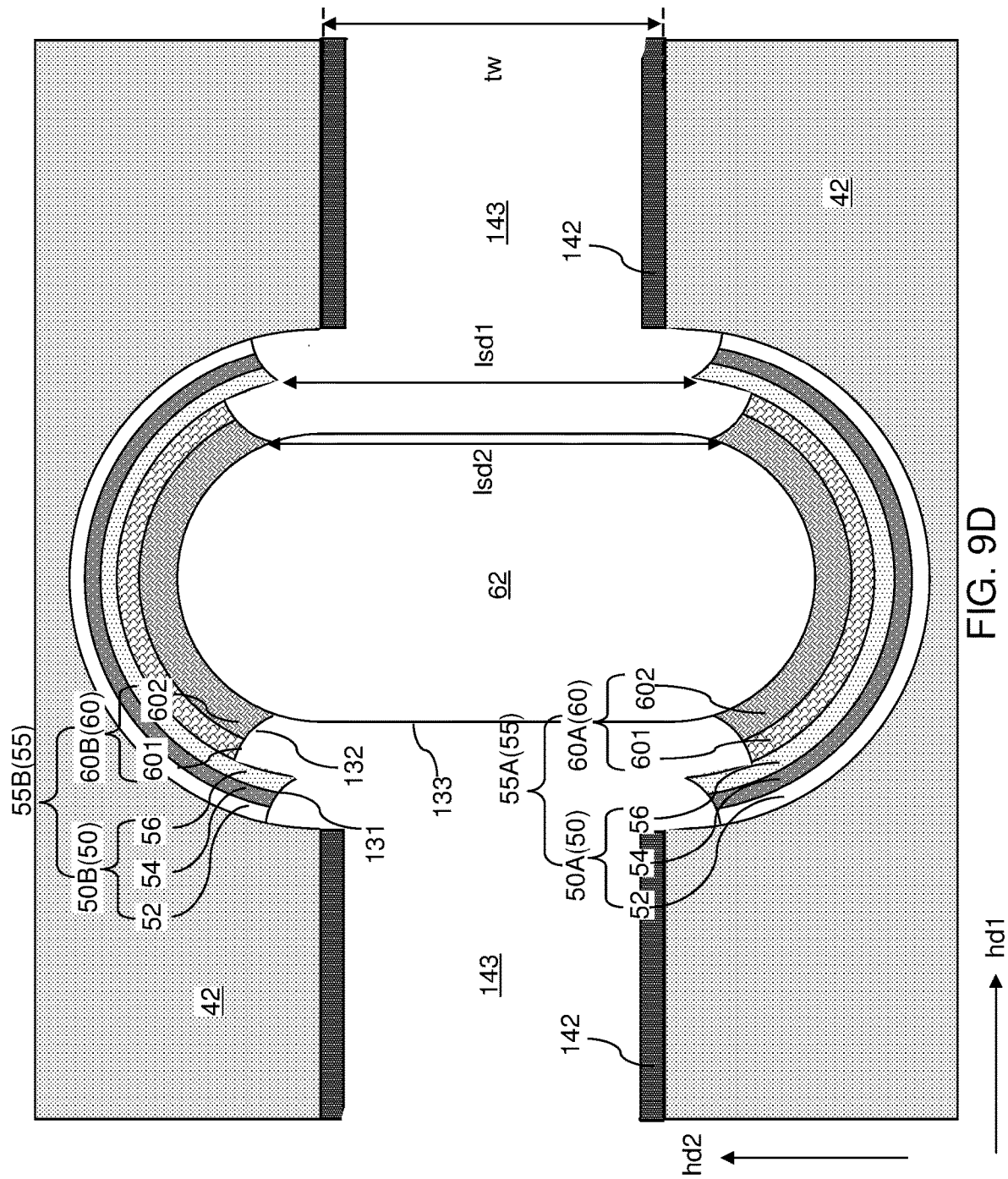

FIG. 9D is a horizontal cross-sectional view of a memory opening fill structure in a memory opening after the processing steps of FIGS. 9A-9C according to the first embodiment of the present disclosure.

Figure 10A:
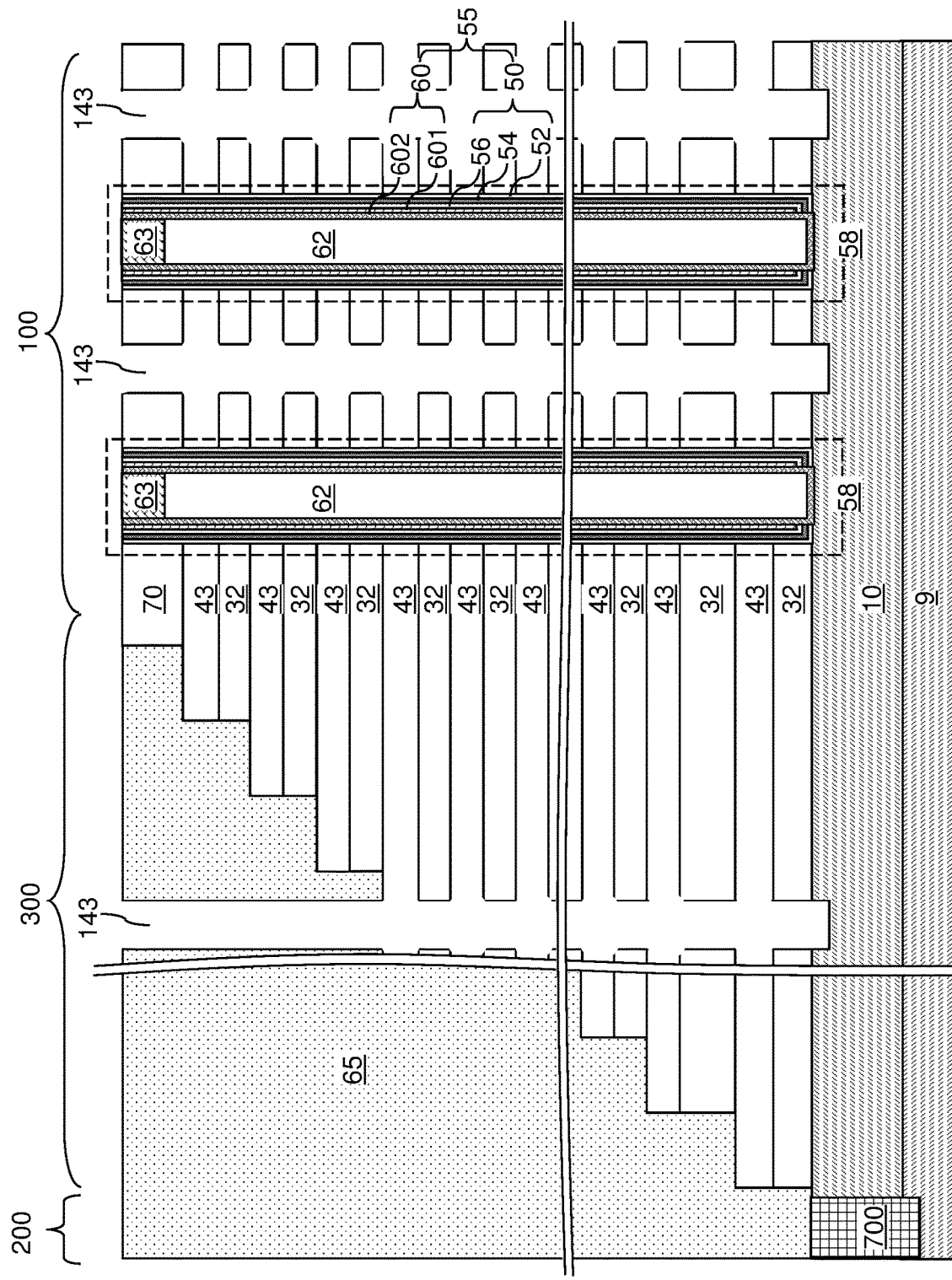

FIG. 10A is a vertical cross-sectional view of the first exemplary structure after removal of the etch stop sacrificial liners and formation of backside recesses according to the first embodiment of the present disclosure.

Figure 10B:
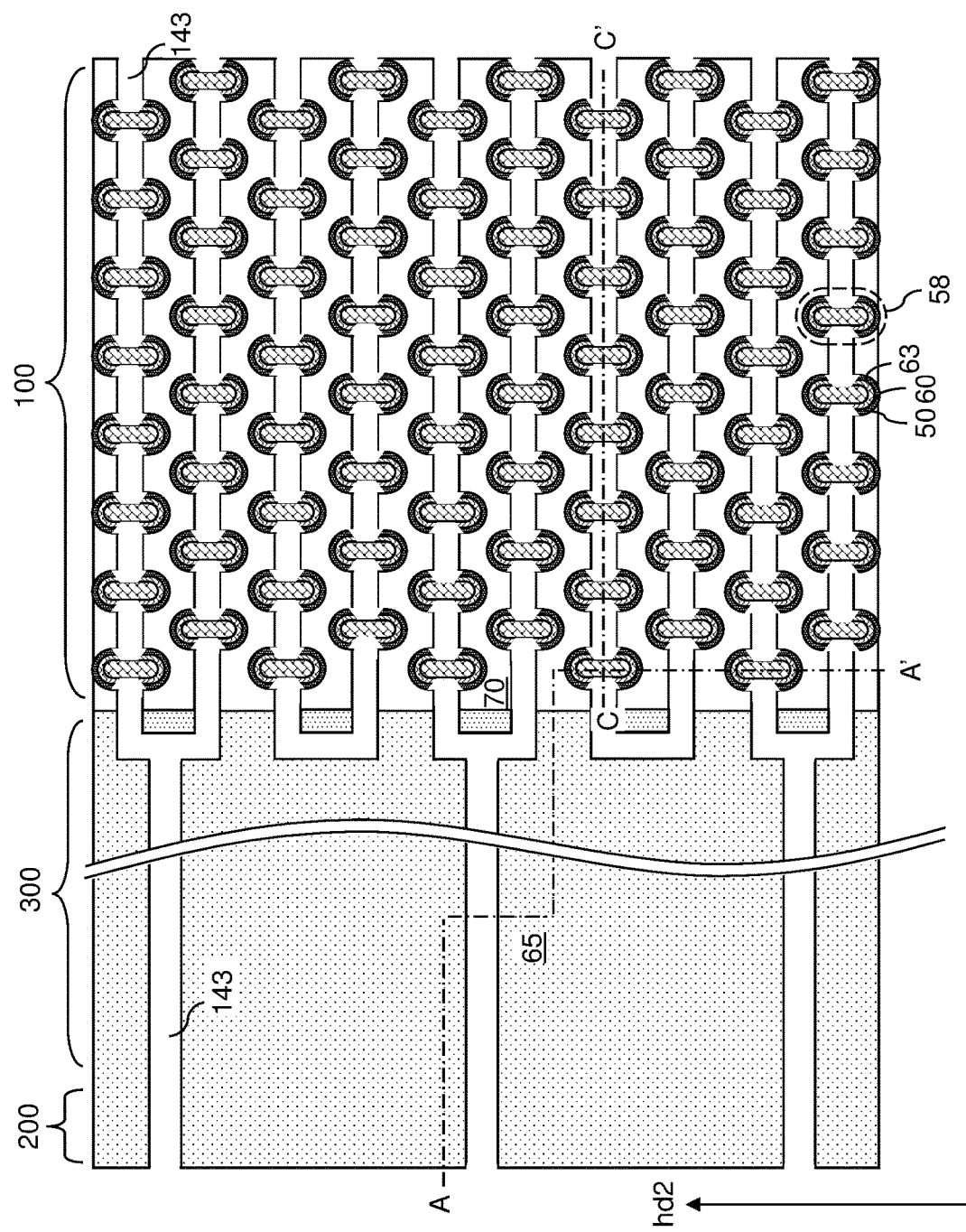

FIG. 10B is a top-down view of the first exemplary structure of FIG. 10A. The vertical plane A-A' corresponds to the plane of the vertical cross-sectional view of FIG. 10A.

Figure 10C:
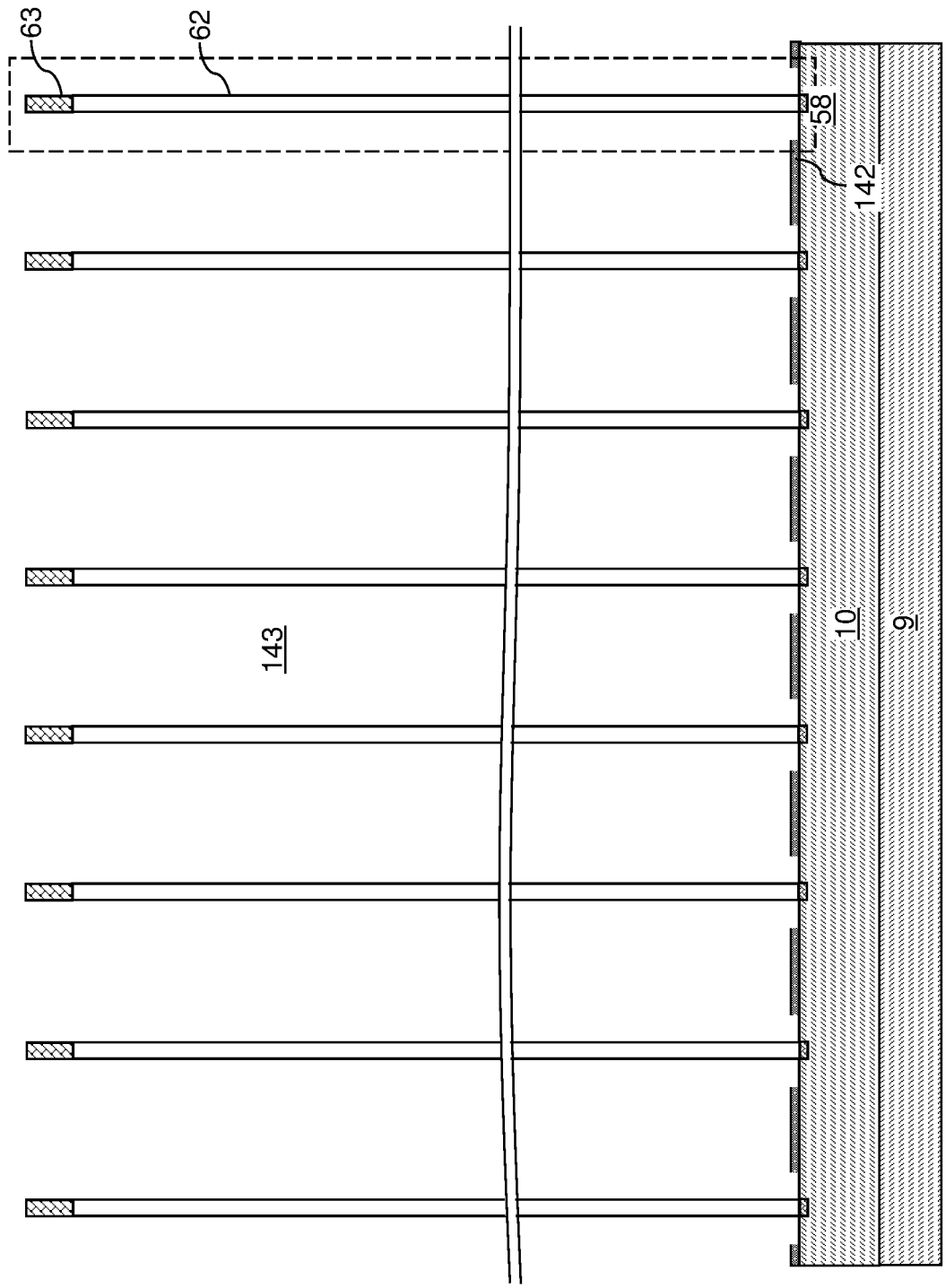

FIG. 10C is a vertical cross-sectional view along the vertical plane C-C' of FIG. 10B.

Figure 11A:
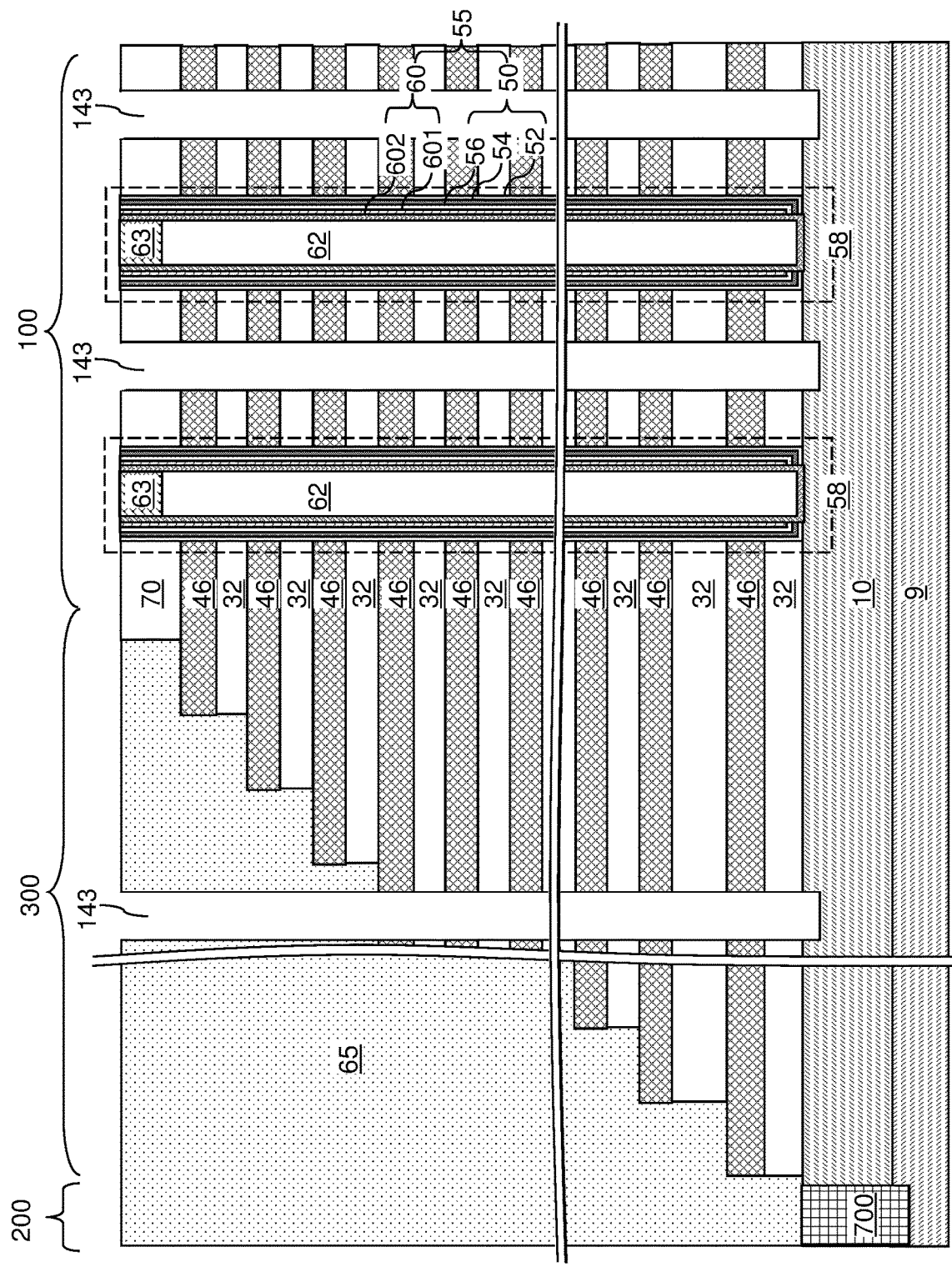

FIG. 11A is a vertical cross-sectional view of the first exemplary structure after formation of electrically conductive layers according to the first embodiment of the present disclosure.

Figure 11B:
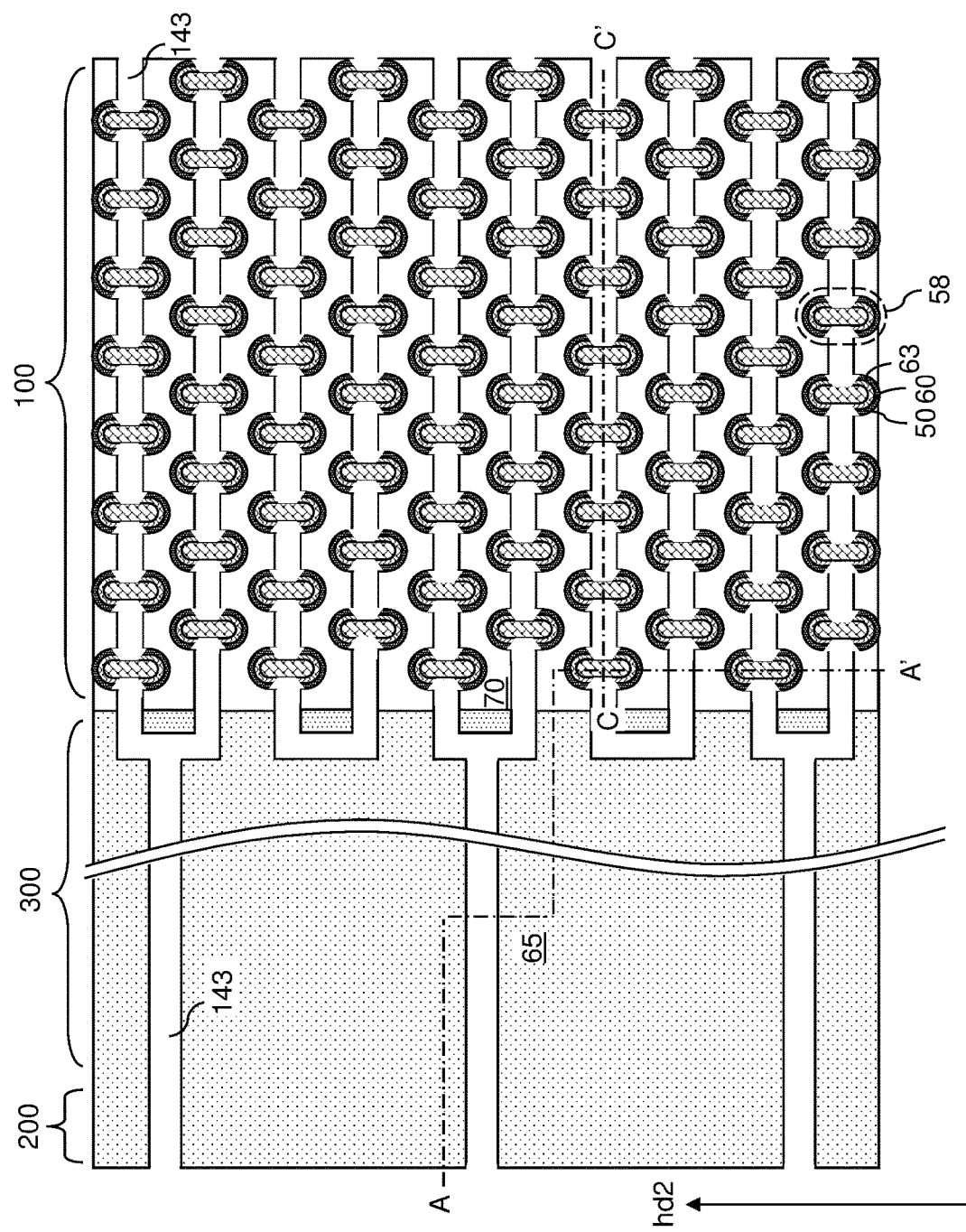

FIG. 11B is a top-down view of the first exemplary structure of FIG. 11A. The vertical plane A-A' corresponds to the plane of the vertical cross-sectional view of FIG. 11A.

FIG. 11C is a vertical cross-sectional view along the vertical plane C-C' of FIG. 11B.

Figure 12A:
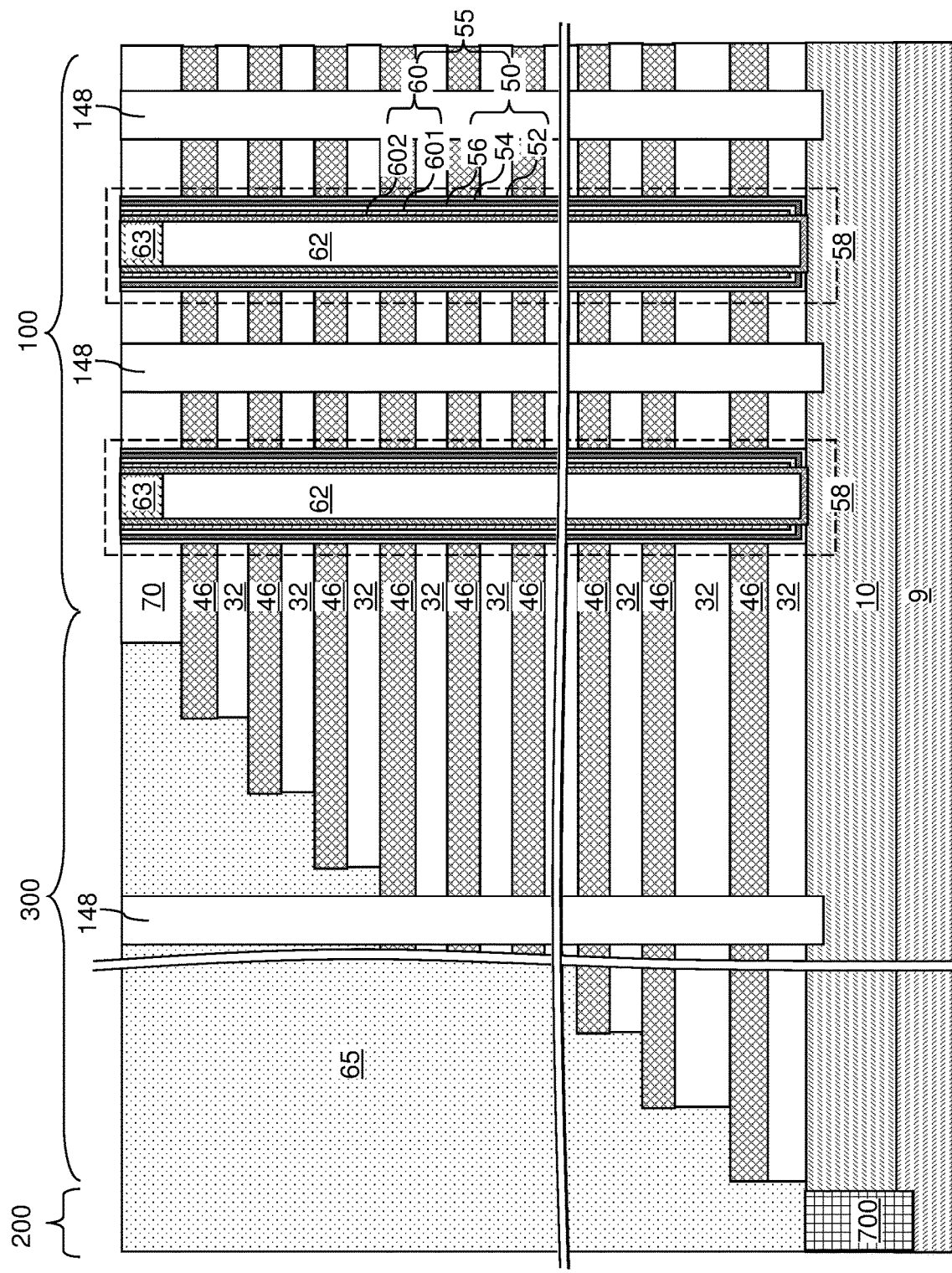

FIG. 12A is a vertical cross-sectional view of the first exemplary structure after formation of dielectric pillar structures according to the first embodiment of the present disclosure.

Figure 12B:
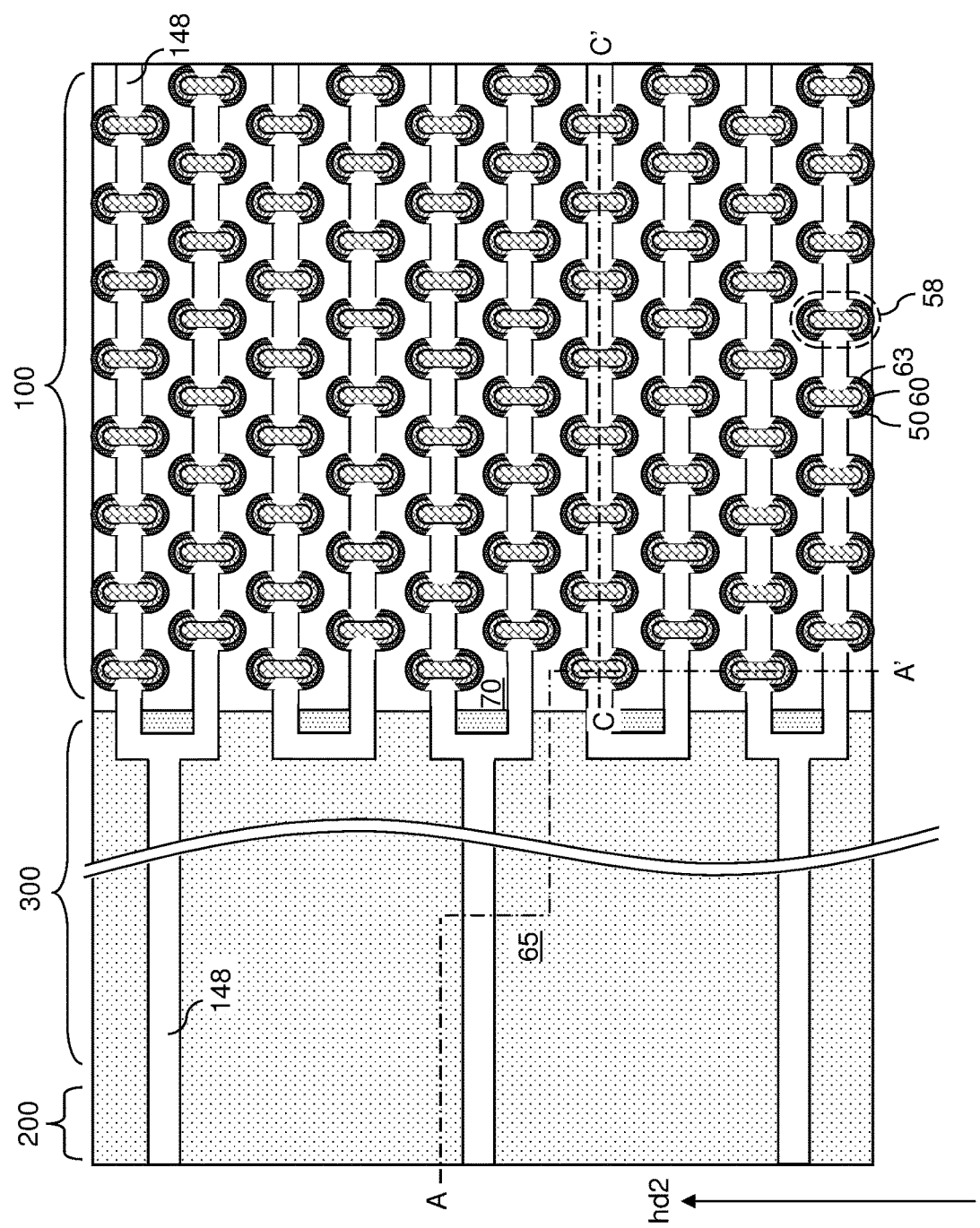

FIG. 12B is a top-down view of the first exemplary structure of FIG. 12A. The vertical plane A-A' corresponds to the plane of the vertical cross-sectional view of FIG. 12A.

Figure 12C:
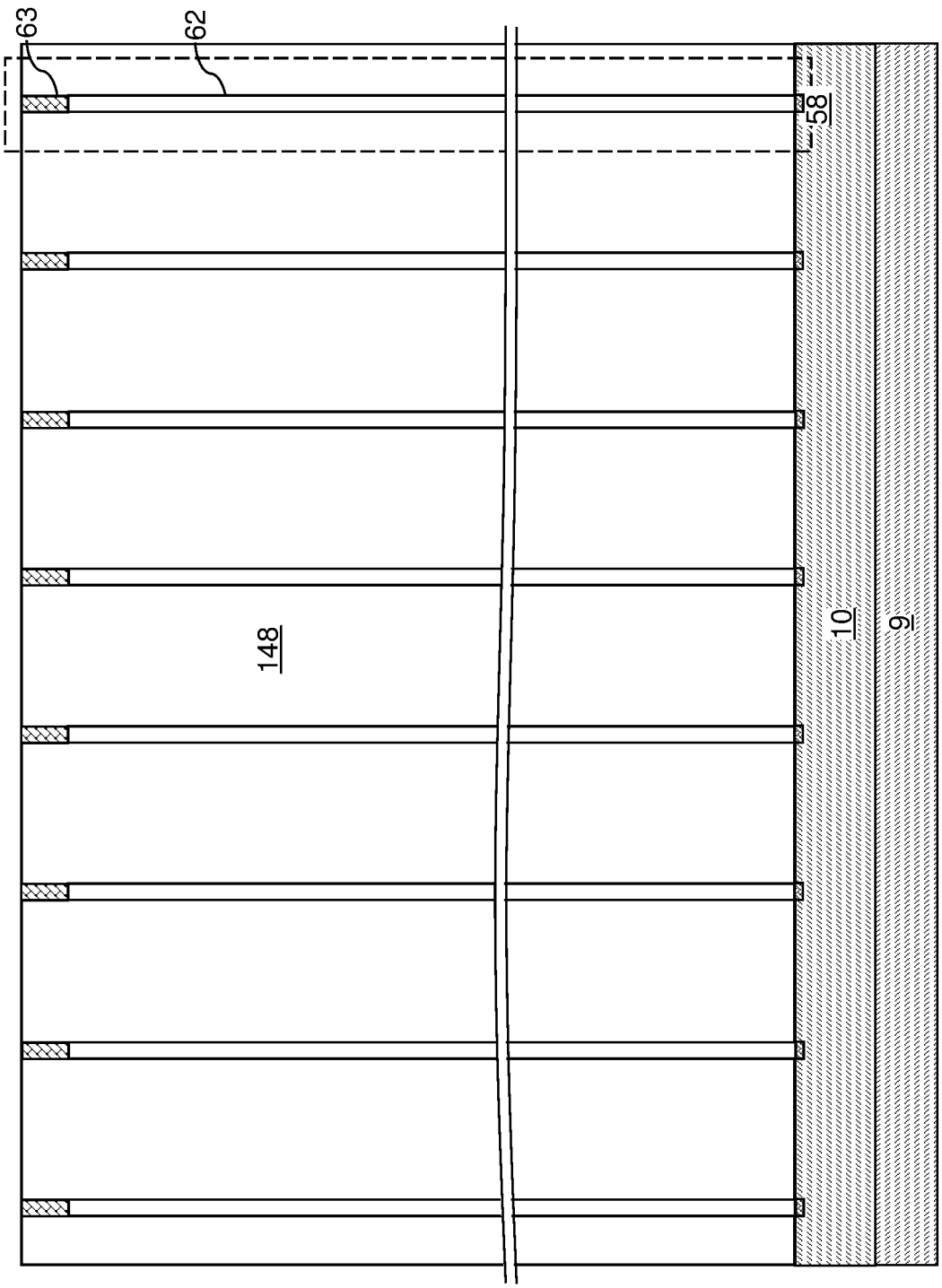

FIG. 12C is a vertical cross-sectional view along the vertical plane C-C' of FIG. 12B.

Figure 12D:
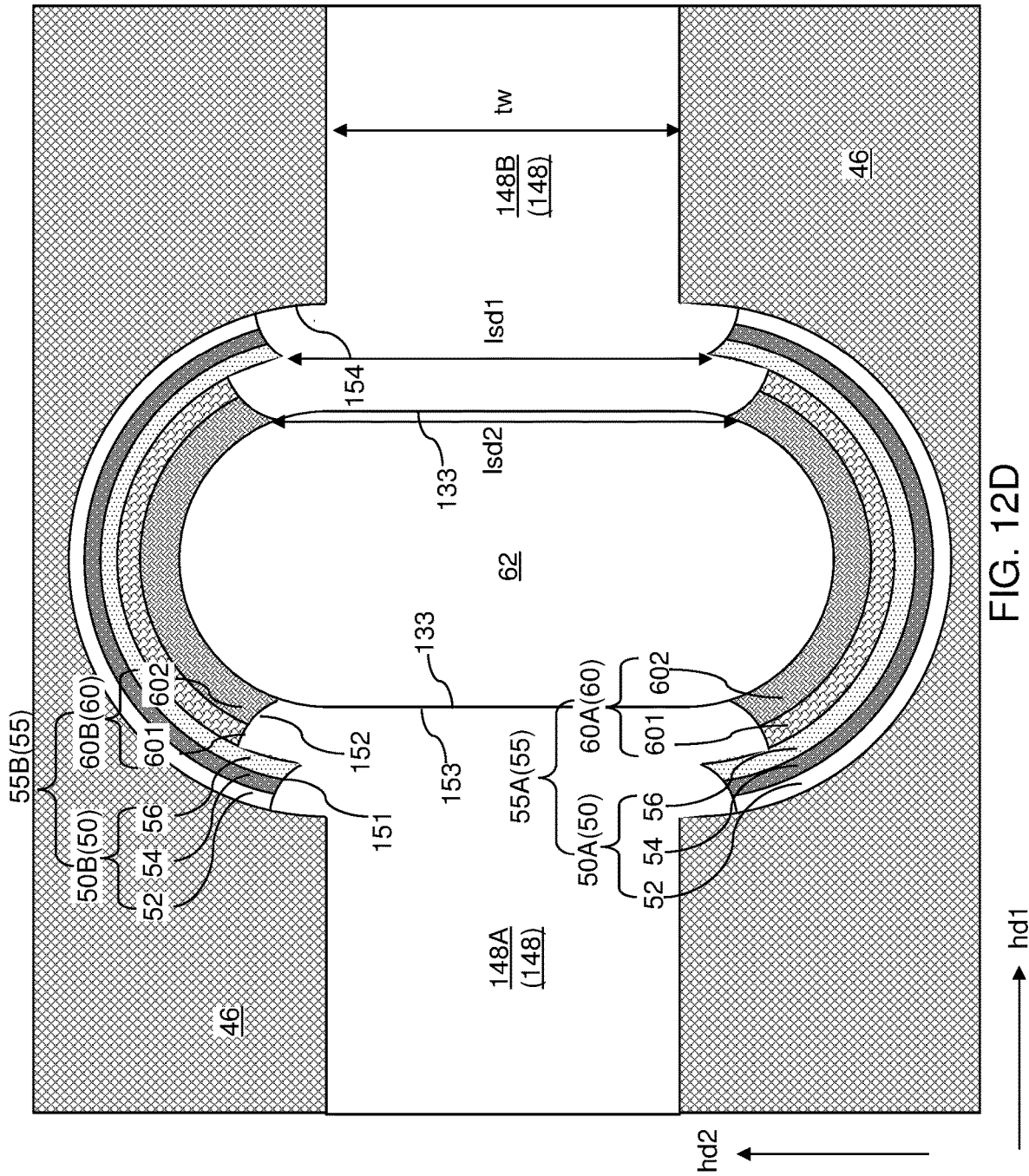

FIG. 12D is a horizontal cross-sectional view of a memory opening fill structure in a memory opening after the processing steps of FIGS. 12A-12C according to the first embodiment of the present disclosure.

Figure 12E:
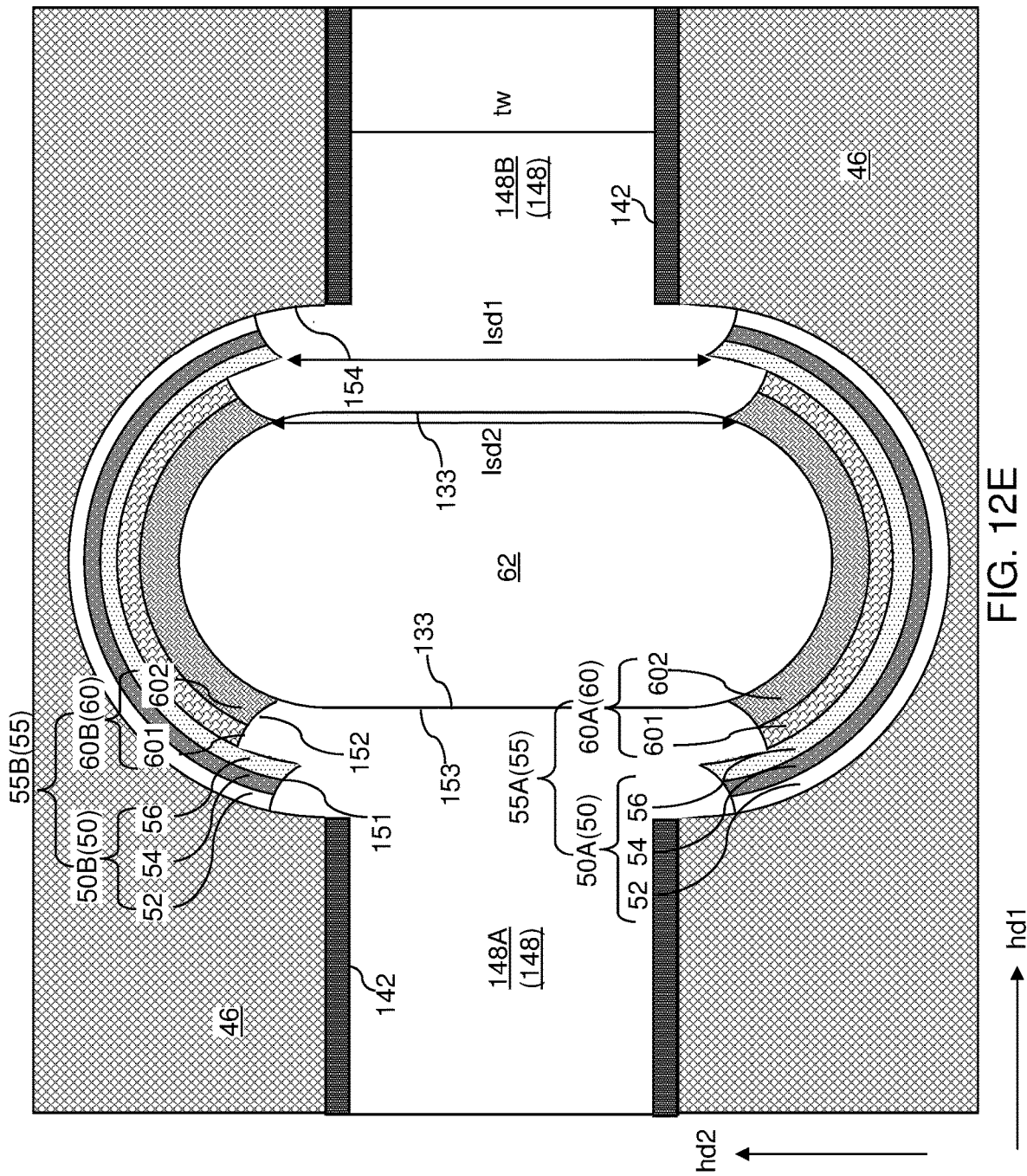
Figure 12F:
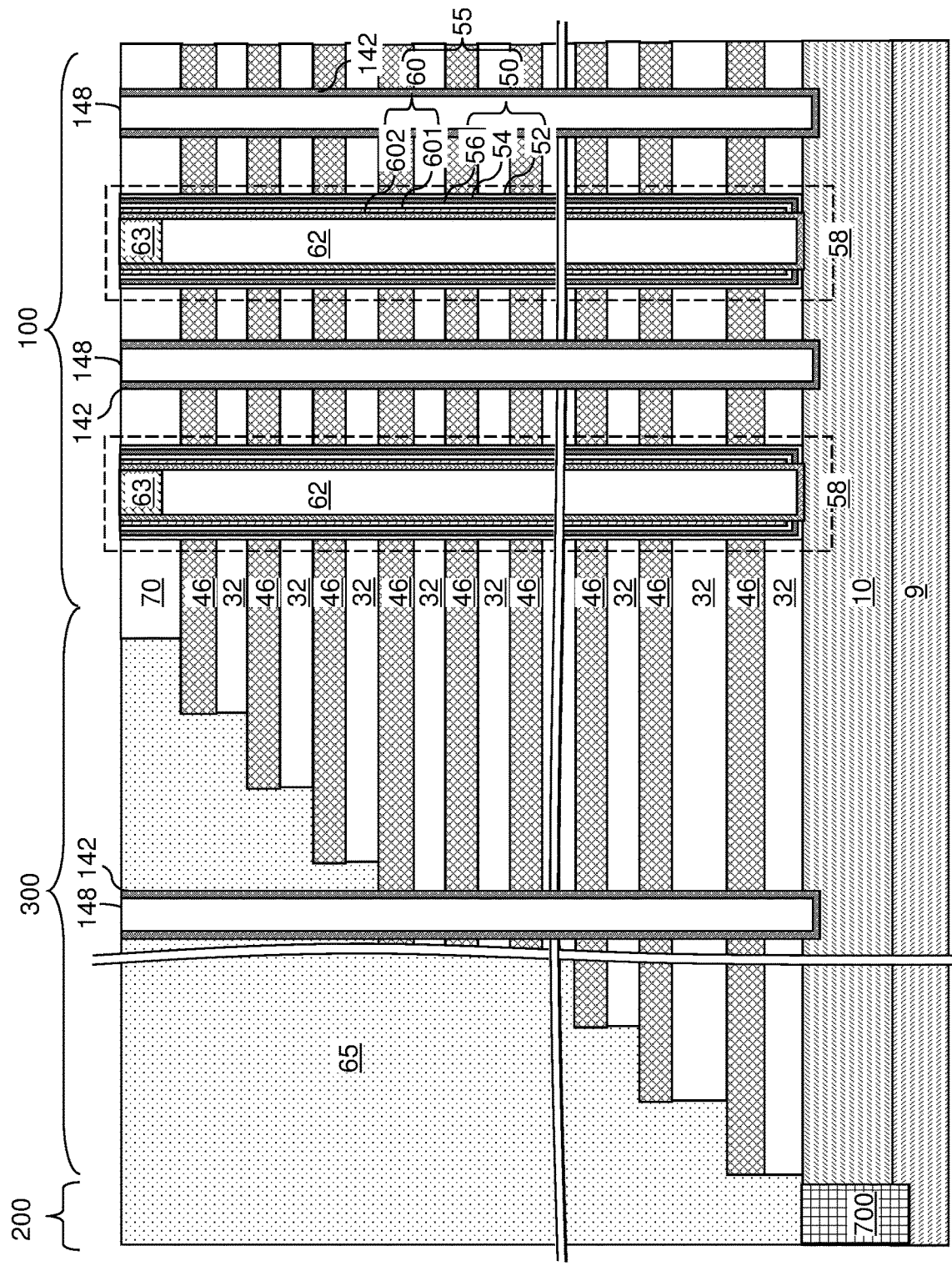

FIGS. 12E and 12F are respective horizontal and vertical cross-sectional views of an alternative memory opening fill structure in a memory opening after the processing steps of FIGS. 12A-12C according to an alternative aspect of the first embodiment of the present disclosure.

Figure 13A:
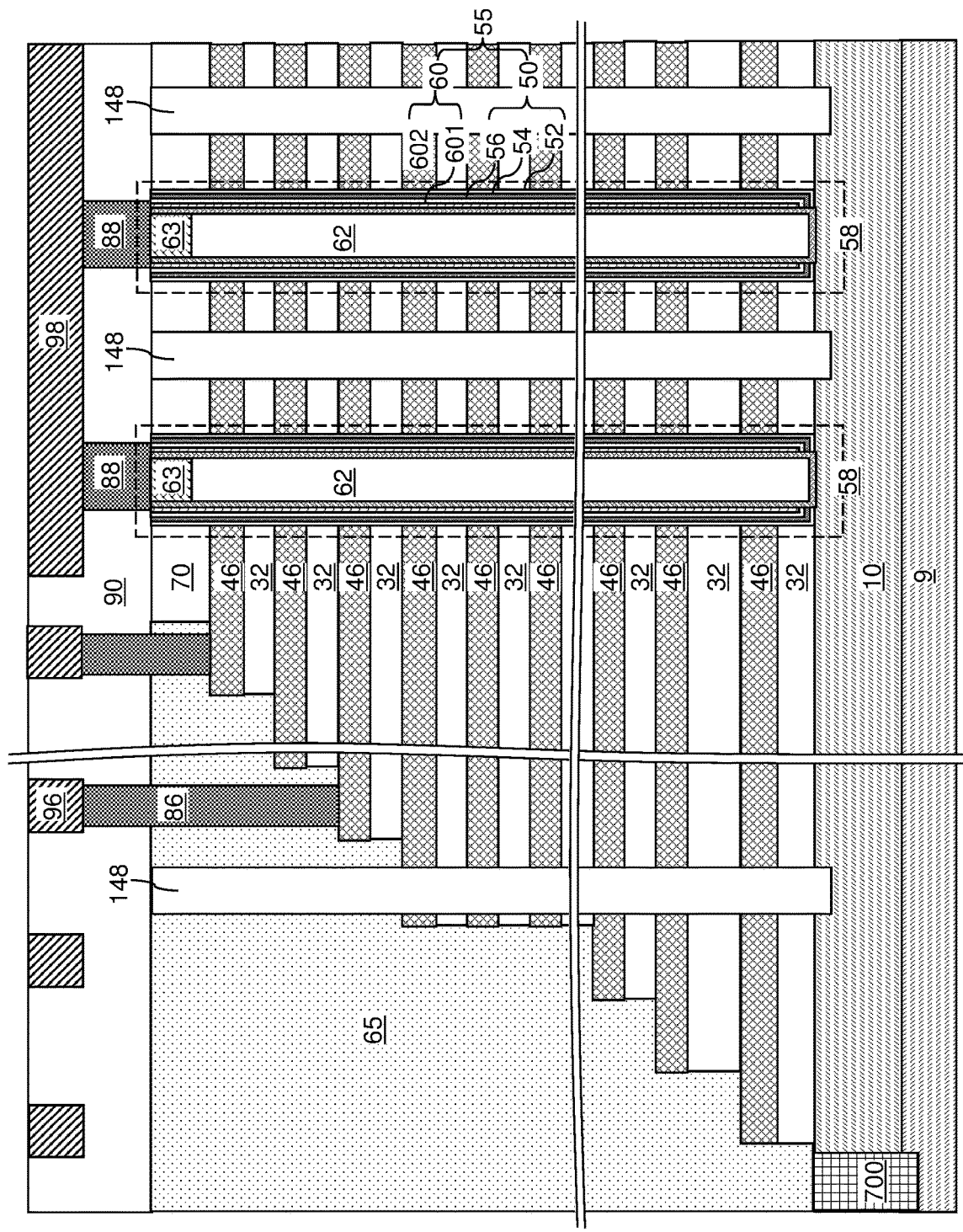

FIG. 13A is a vertical cross-sectional view of the first exemplary structure after formation of contact via structures and metal lines according to the first embodiment of the present disclosure.

Figure 13B:
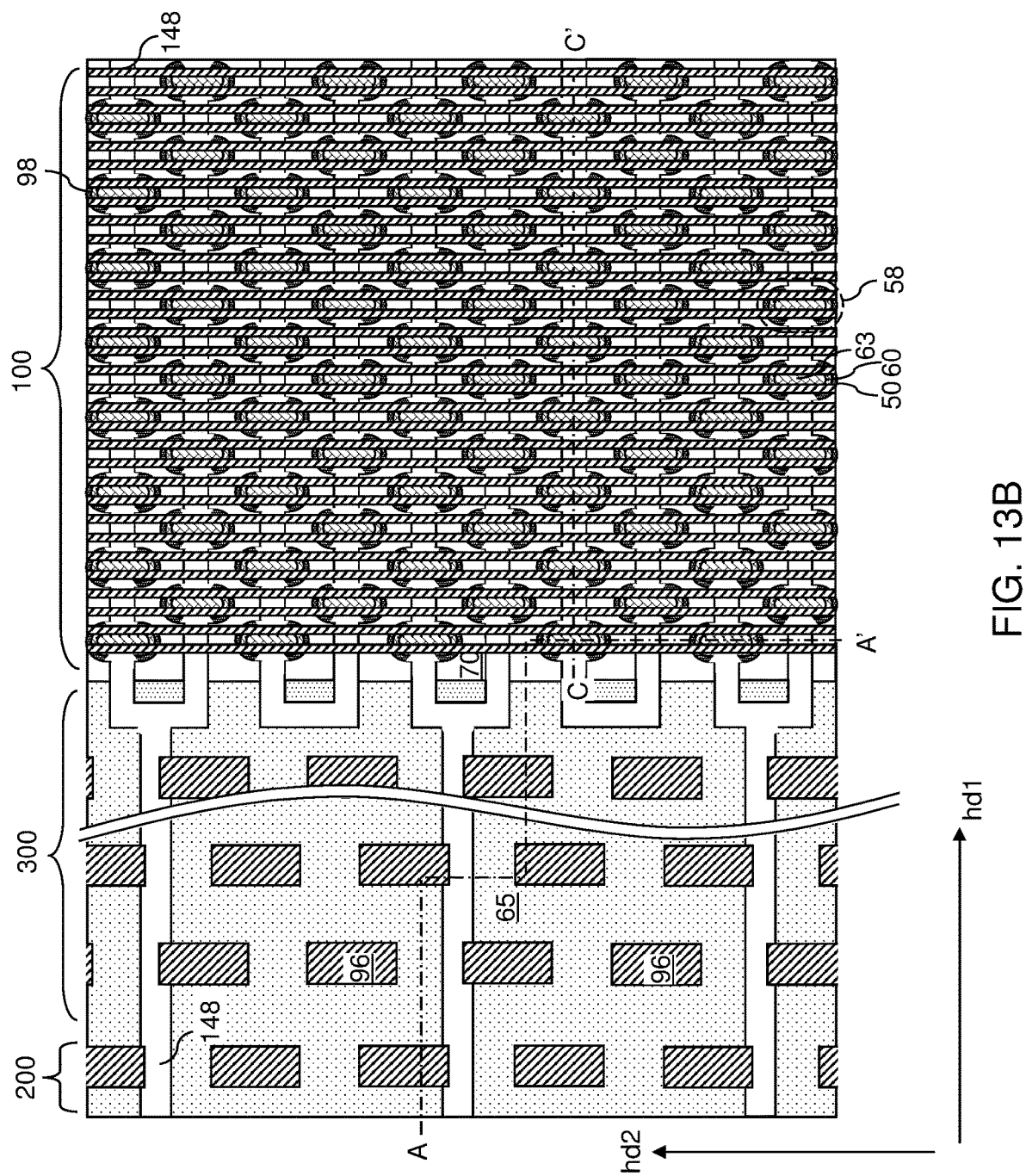

FIG. 13B is a top-down view of the first exemplary structure of FIG. 13A. The vertical plane A-A' corresponds to the plane of the vertical cross-sectional view of FIG. 13A.

Figure 13C:
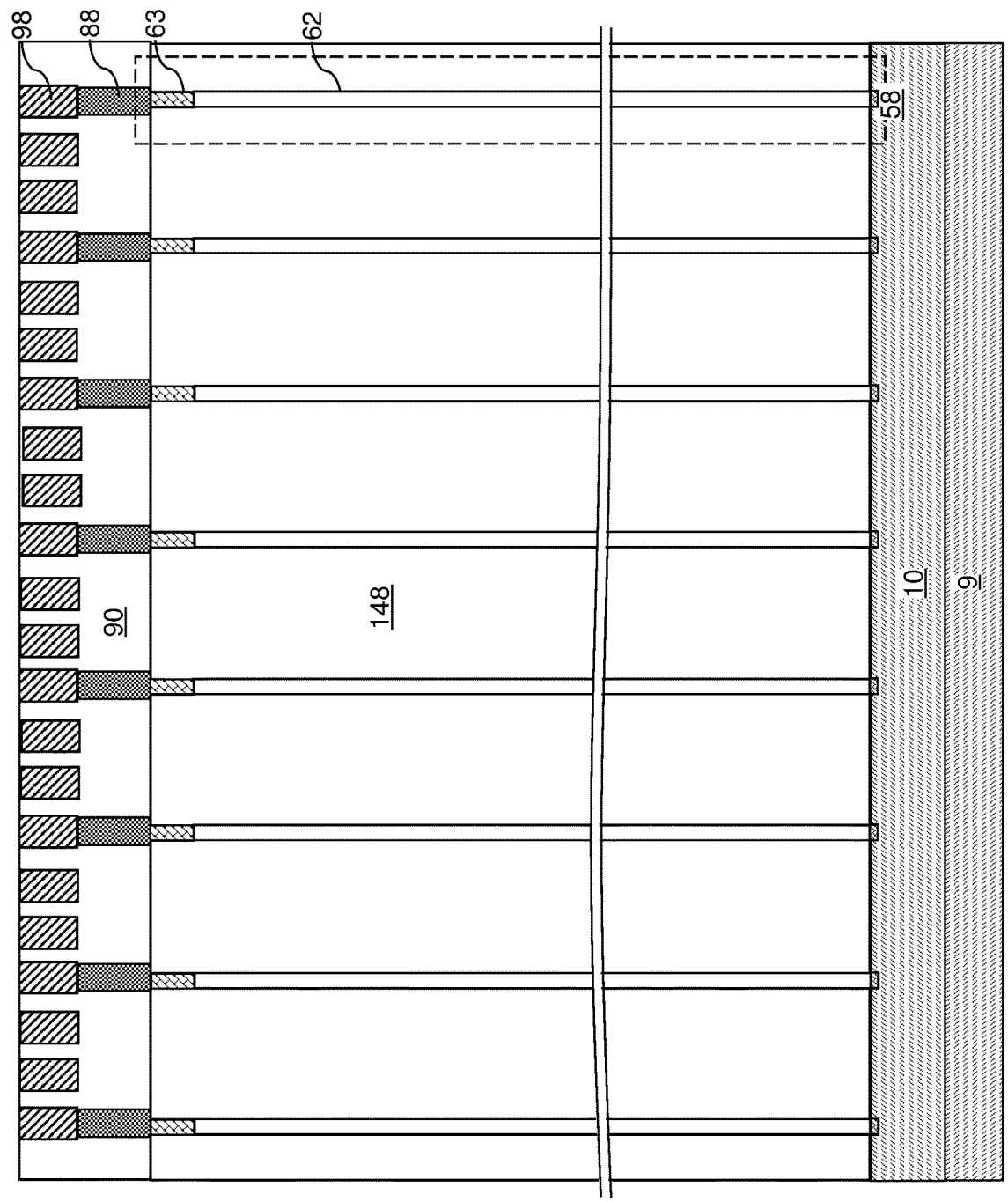

FIG. 13C is a vertical cross-sectional view along the vertical plane C-C' of FIG. 13B.

Figure 14A:
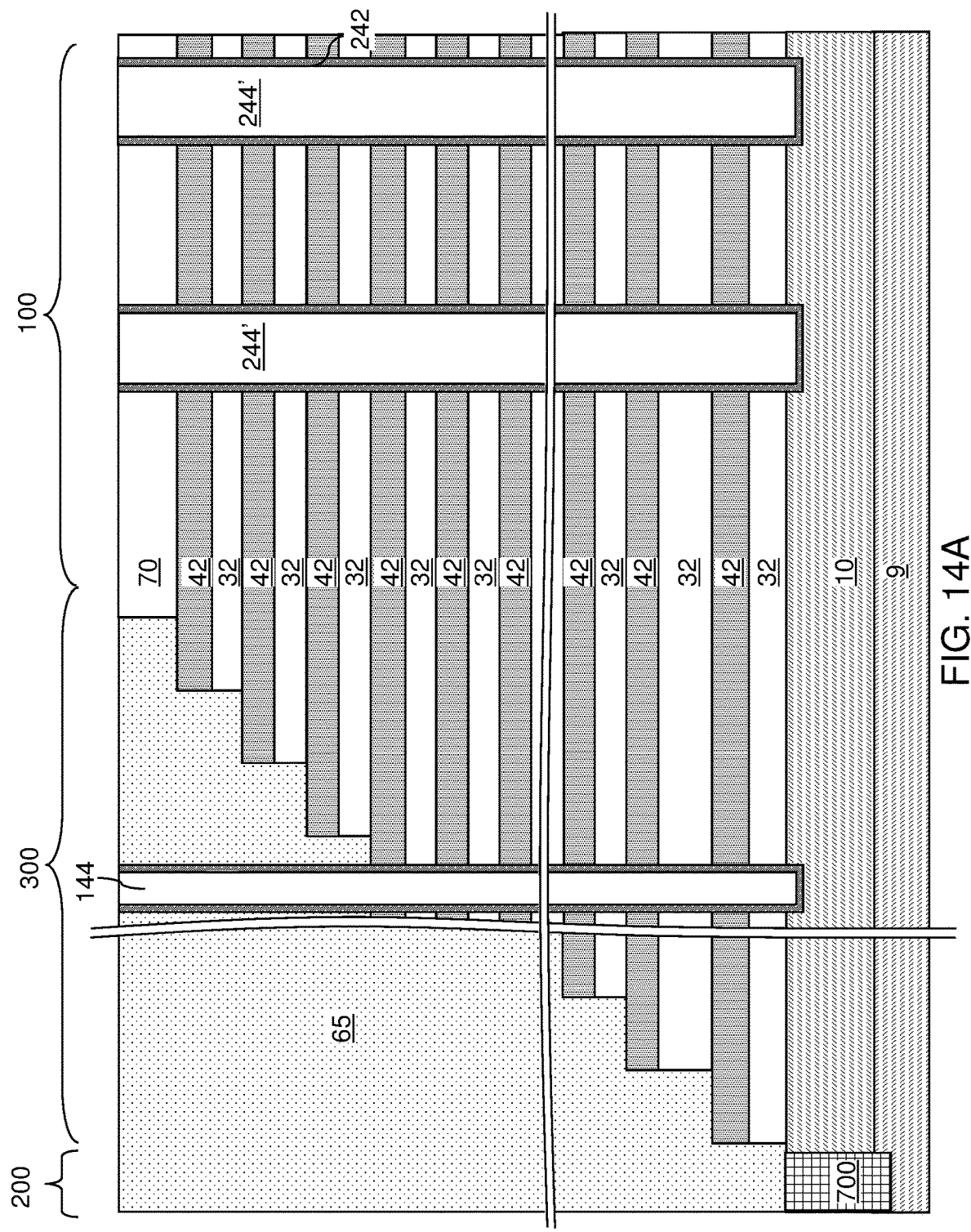

FIG. 14A is a vertical cross-sectional view of a second exemplary structure after formation of in-process sacrificial fill structures including a respective etch stop sacrificial liner and a respective sacrificial fill material portion through the alternating stack according to the second embodiment of the present disclosure.

Figure 14B:
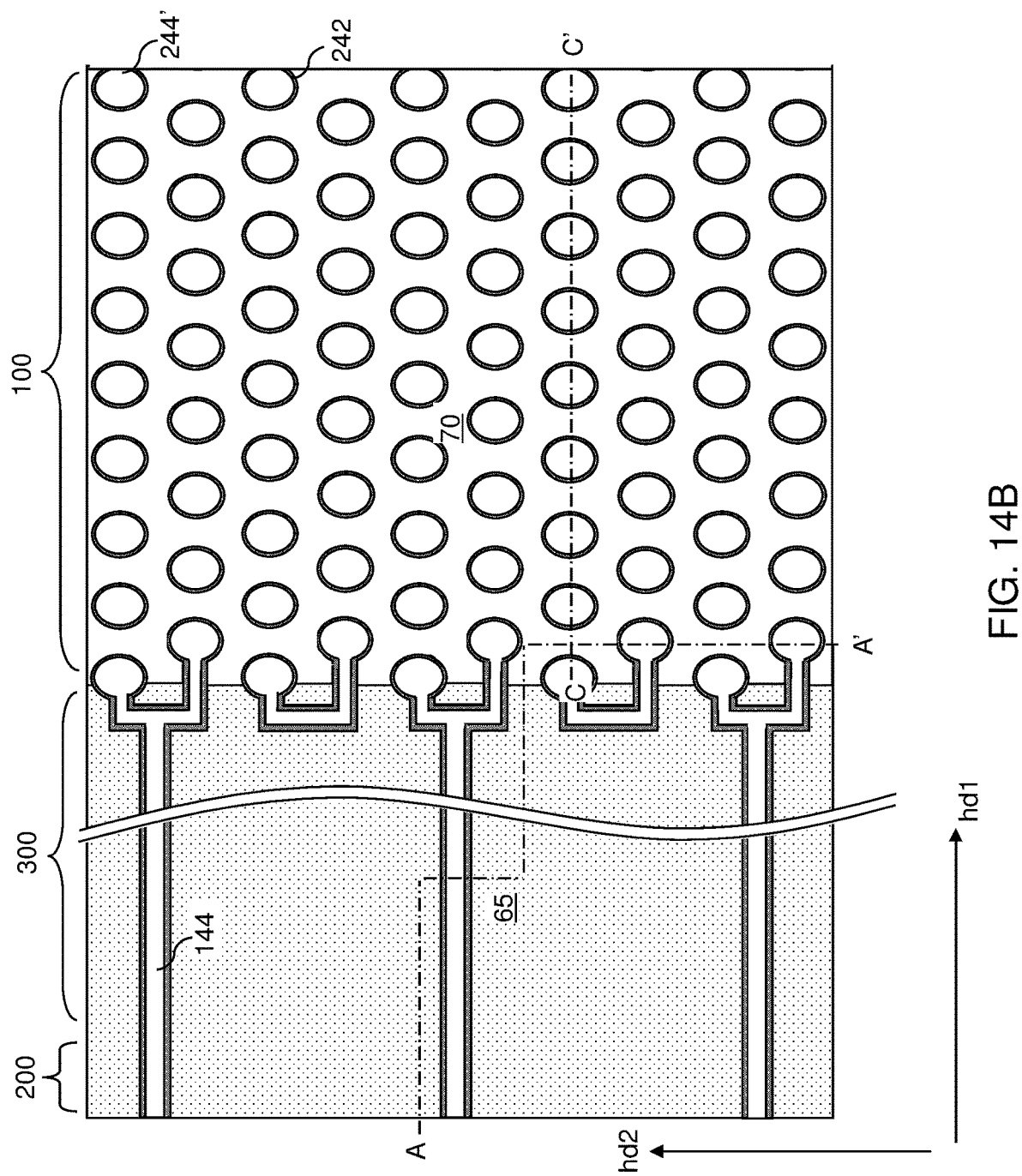

FIG. 14B is a top-down view of the second exemplary structure of FIG. 13A. The vertical plane A-A' corresponds to the plane of the vertical cross-sectional view of FIG. 13A.

Figure 14C:
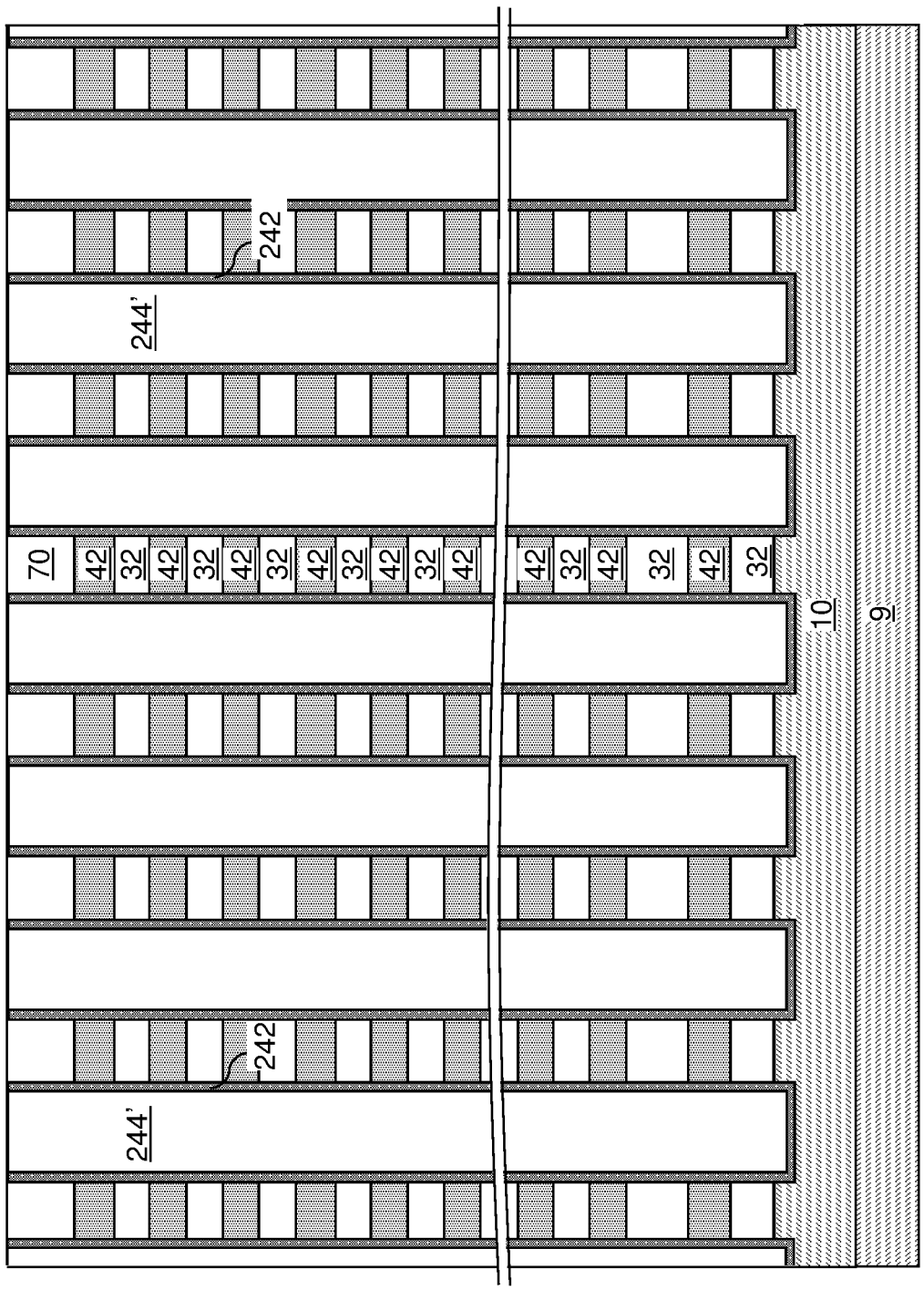

FIG. 14C is a vertical cross-sectional view along the vertical plane C-C' of FIG. 14B.

Figure 15A:
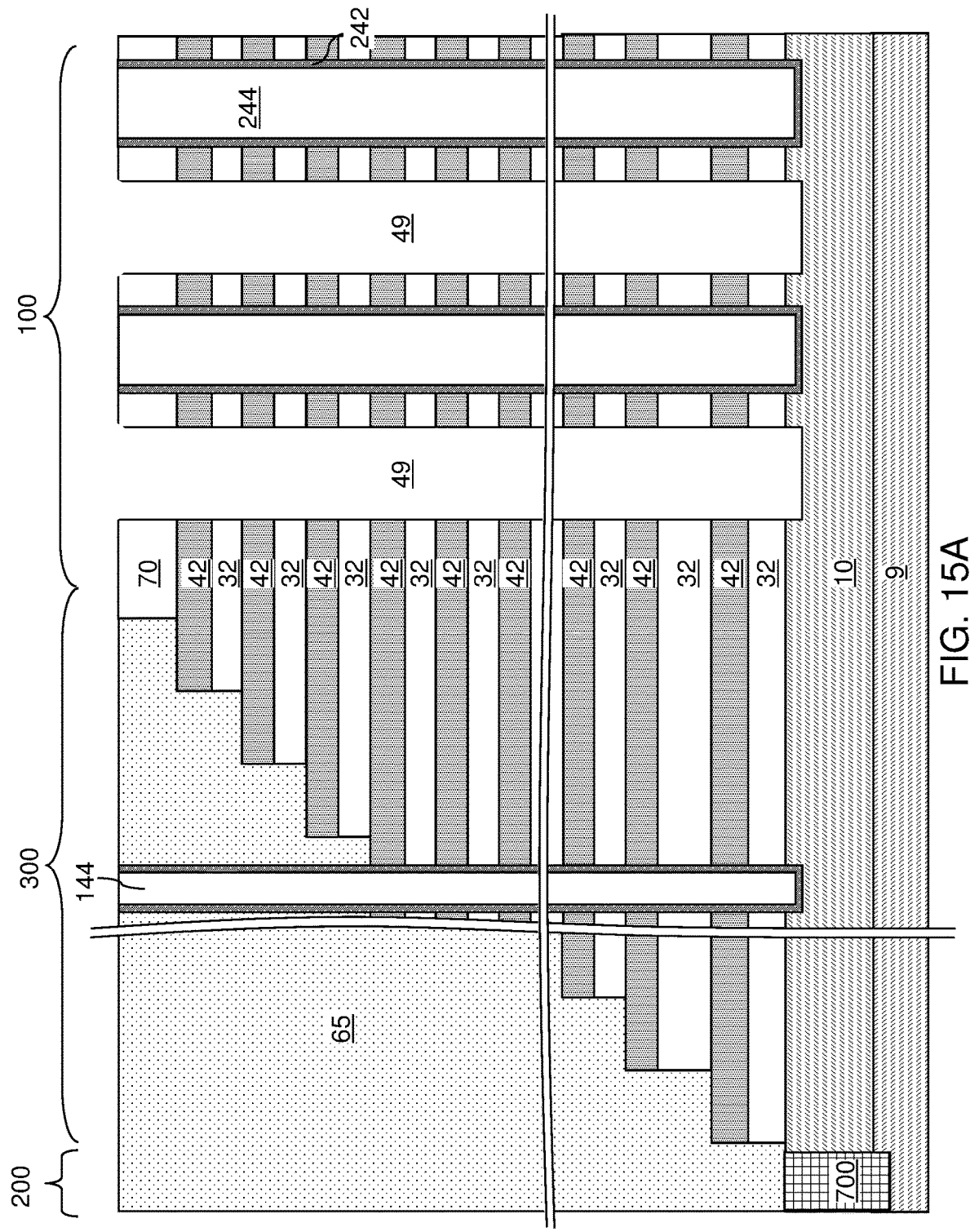

FIG. 15A is a vertical cross-sectional view of the second exemplary structure after formation of memory openings through the in-process sacrificial fill structures according to the second embodiment of the present disclosure.

Figure 15B:
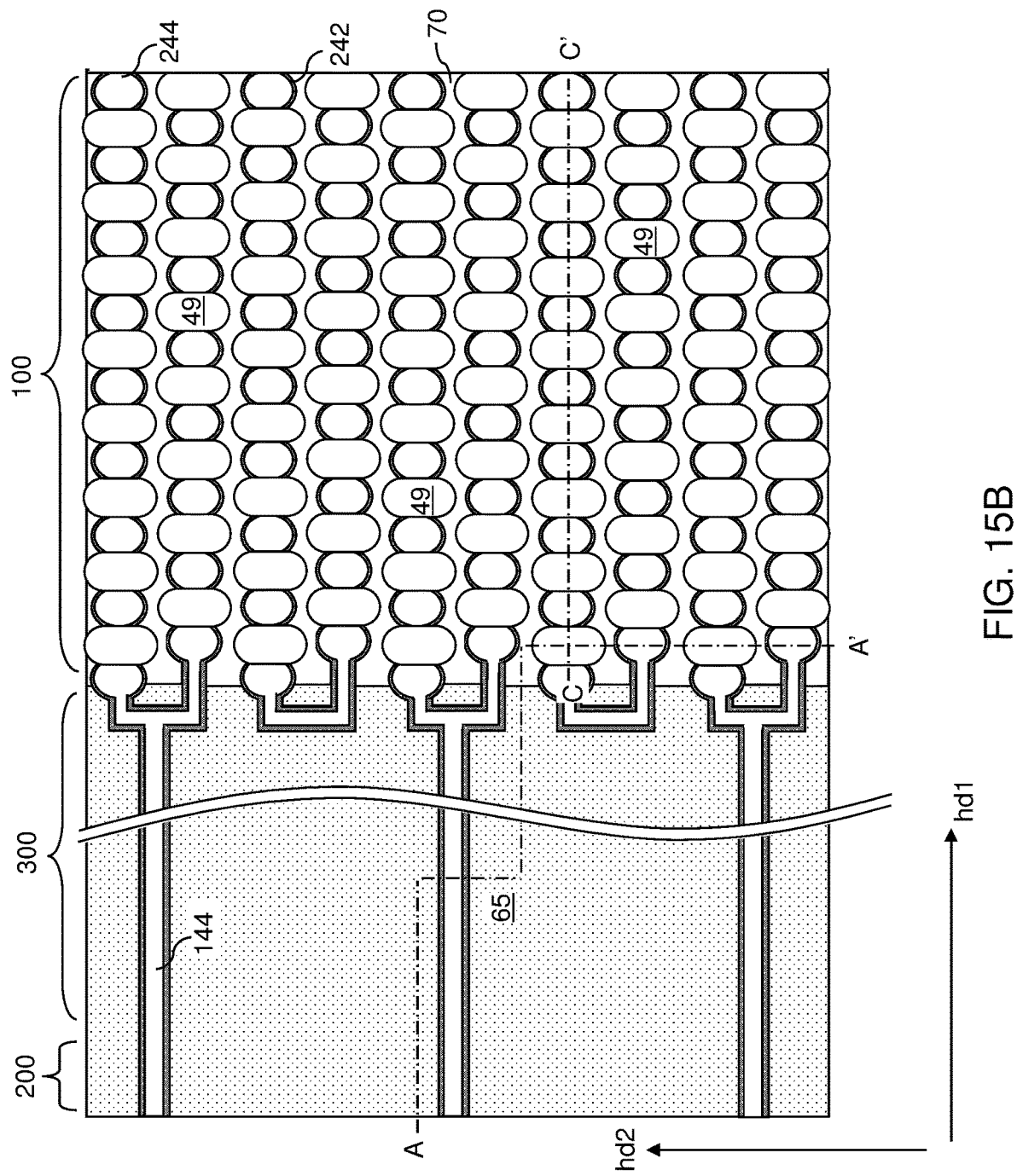

FIG. 15B is a top-down view of the second exemplary structure of FIG. 15A. The vertical plane A-A' corresponds to the plane of the vertical cross-sectional view of FIG. 15A.

Figure 15C:
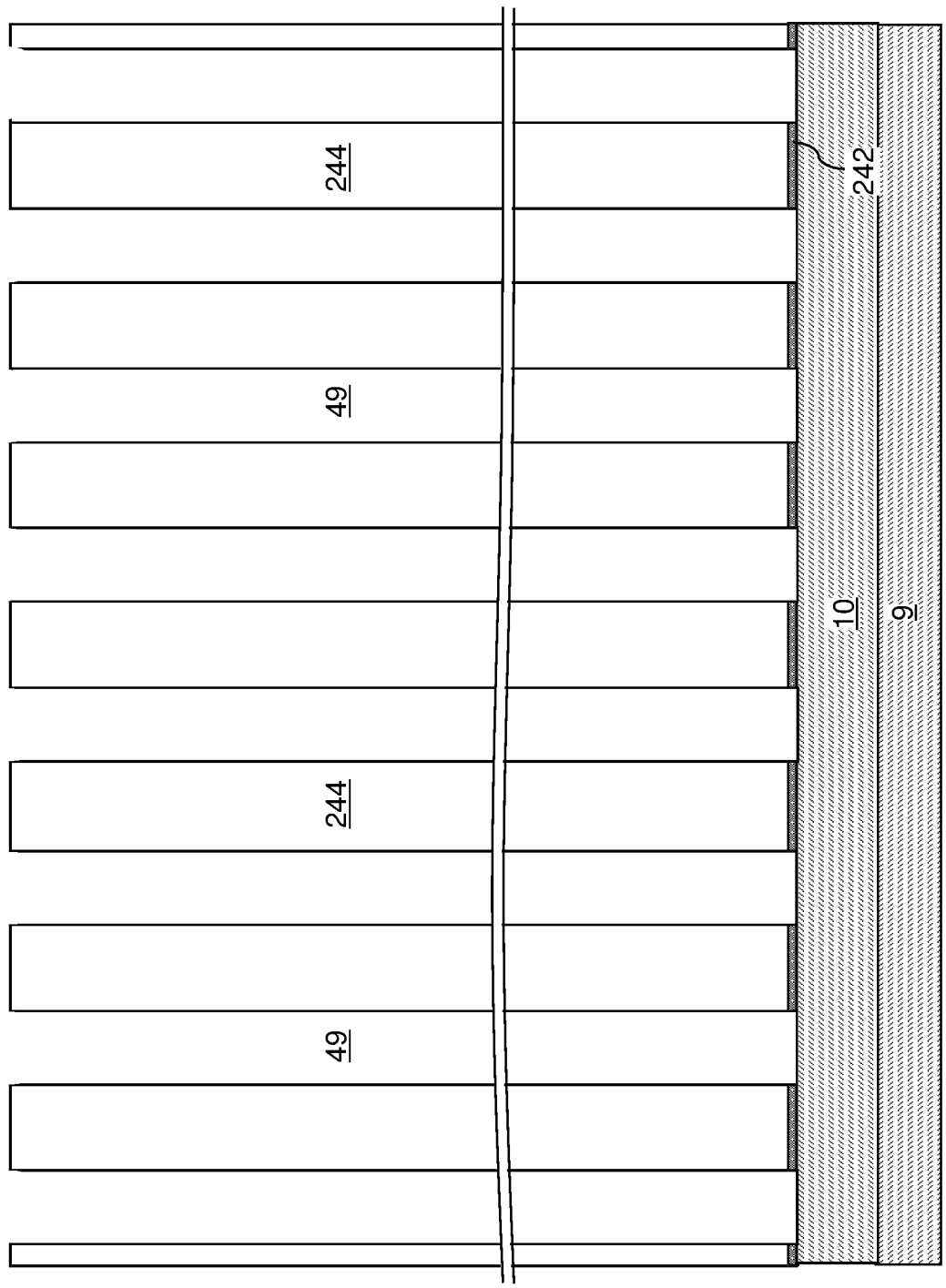

FIG. 15C is a vertical cross-sectional view along the vertical plane C-C' of FIG. 15B.

Figure 16A:
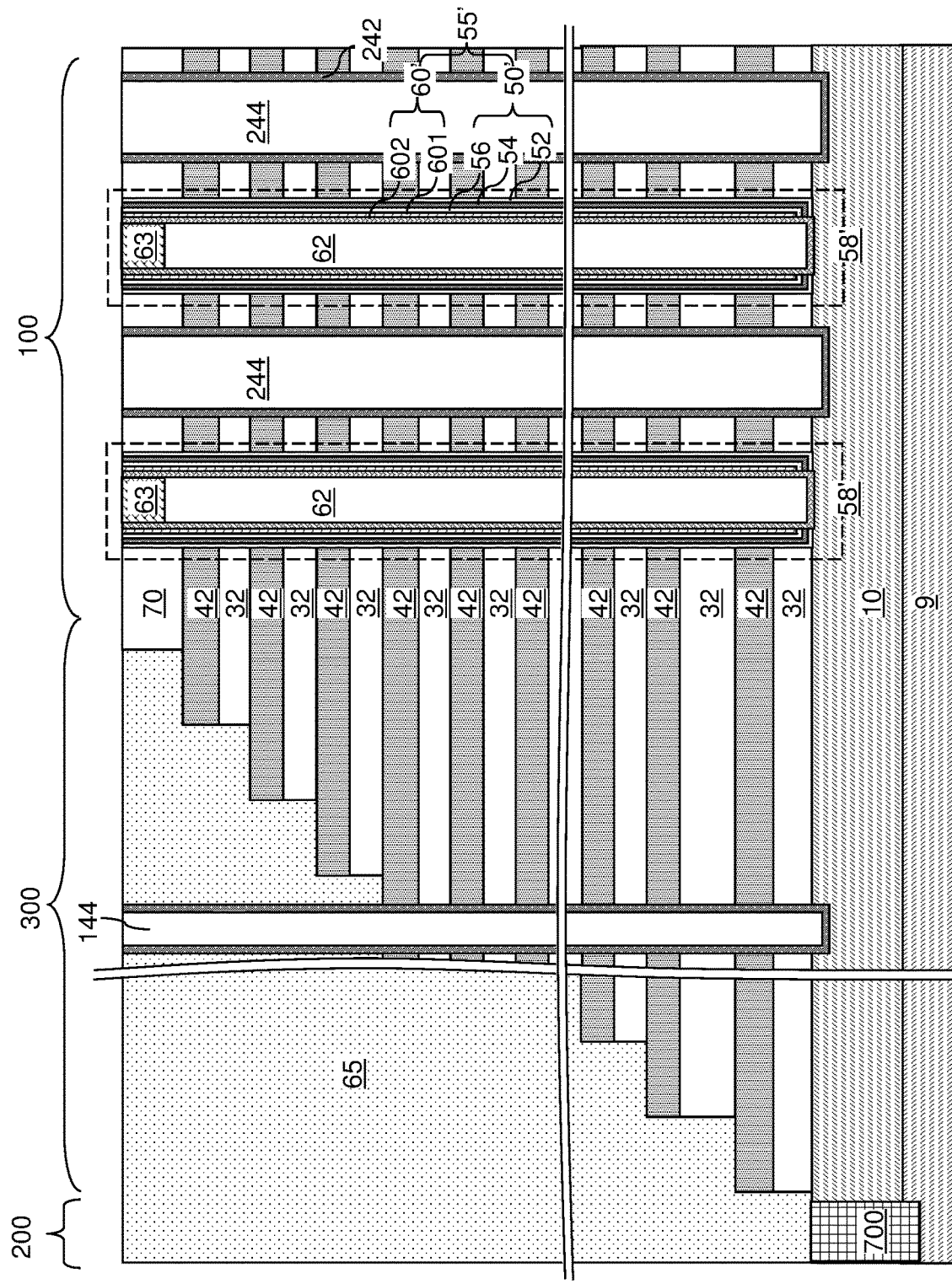

FIG. 16A is a vertical cross-sectional view of the second exemplary structure after formation of the in-process memory opening fill structures according to the second embodiment of the present disclosure.

Figure 16B:
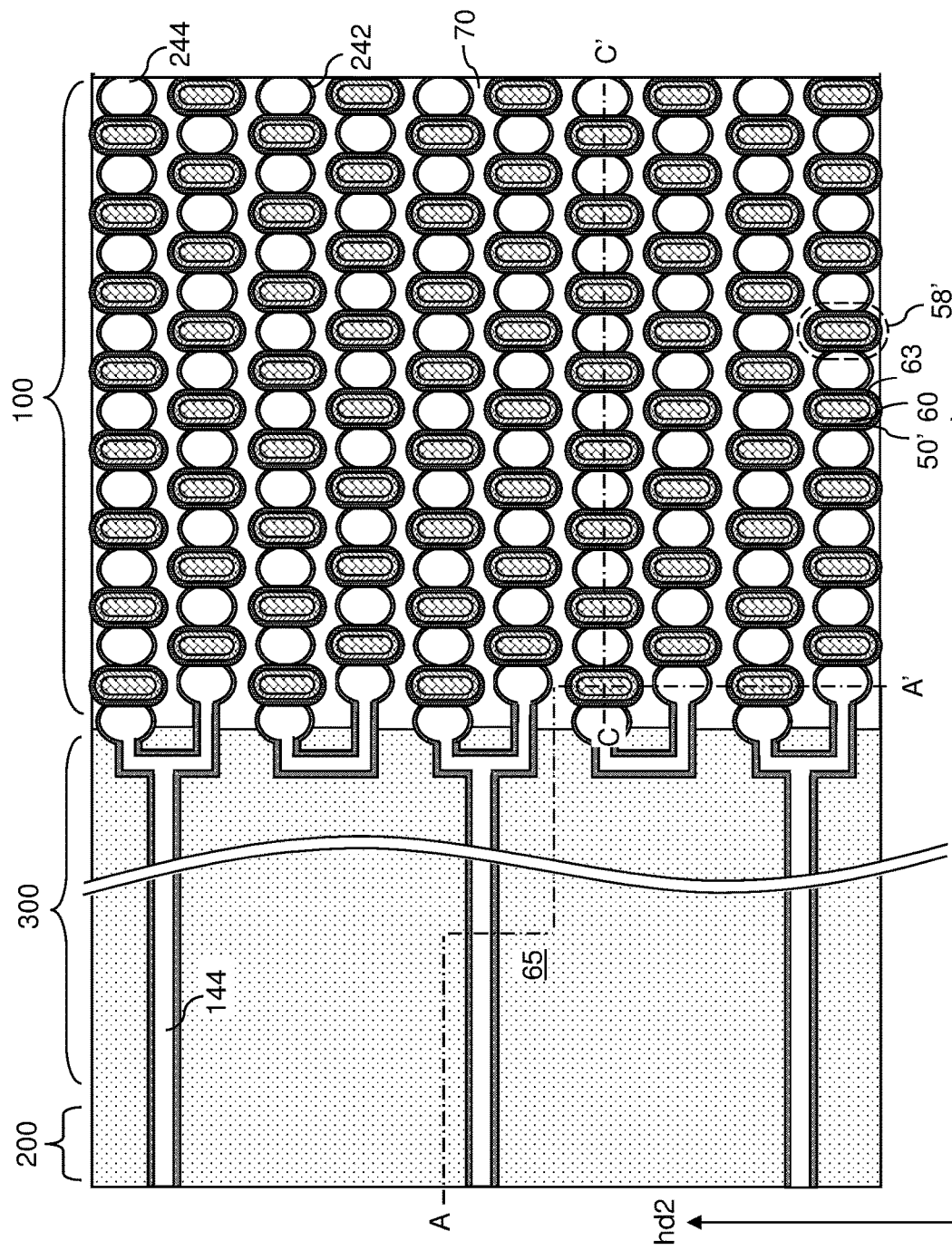

FIG. 16B is a top-down view of the second exemplary structure of FIG. 16A. The vertical plane A-A' corresponds to the plane of the vertical cross-sectional view of FIG. 16A.

Figure 16C:
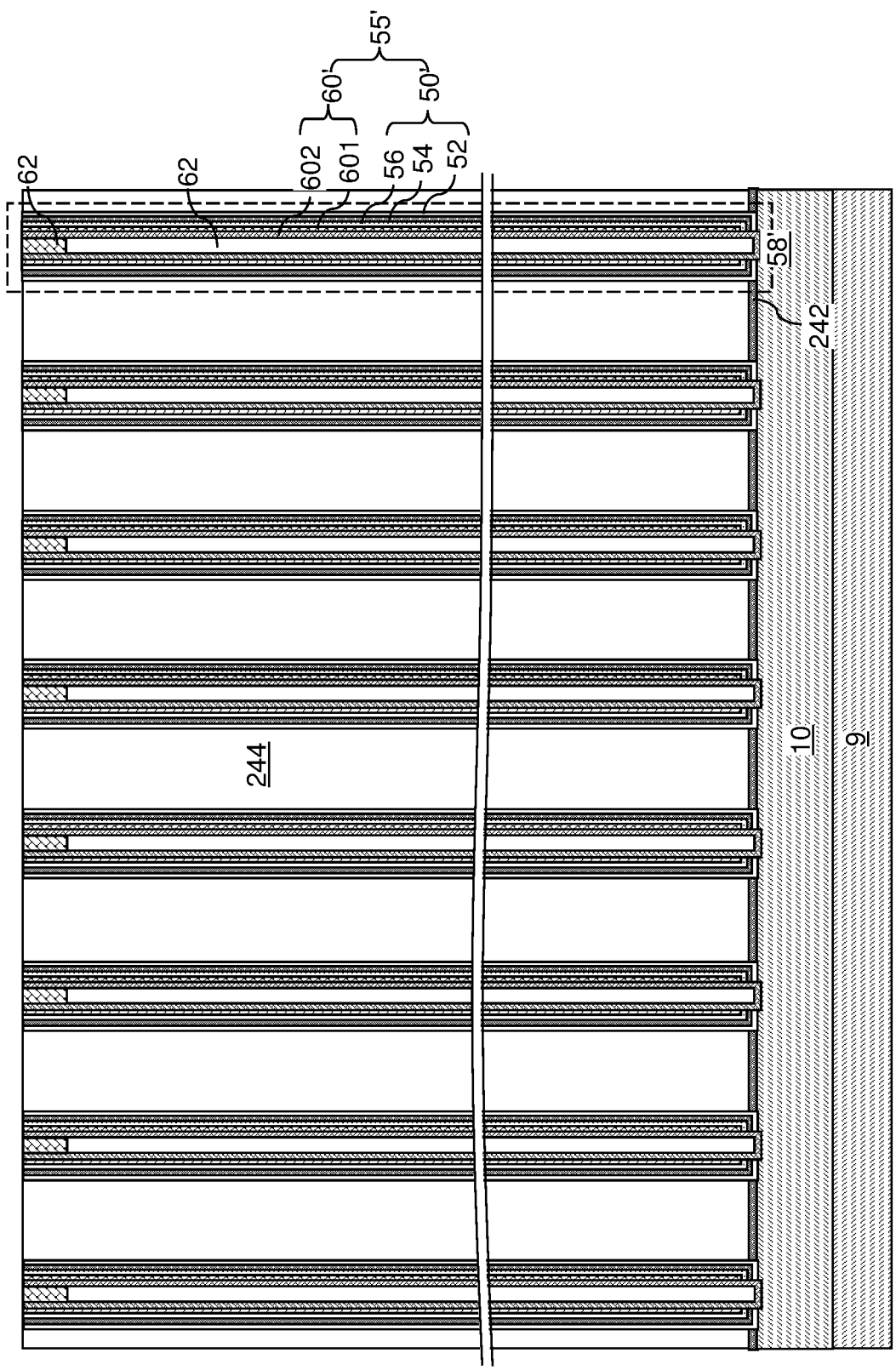

FIG. 16C is a vertical cross-sectional view along the vertical plane C-C' of FIG. 16B.

Figure 17A:
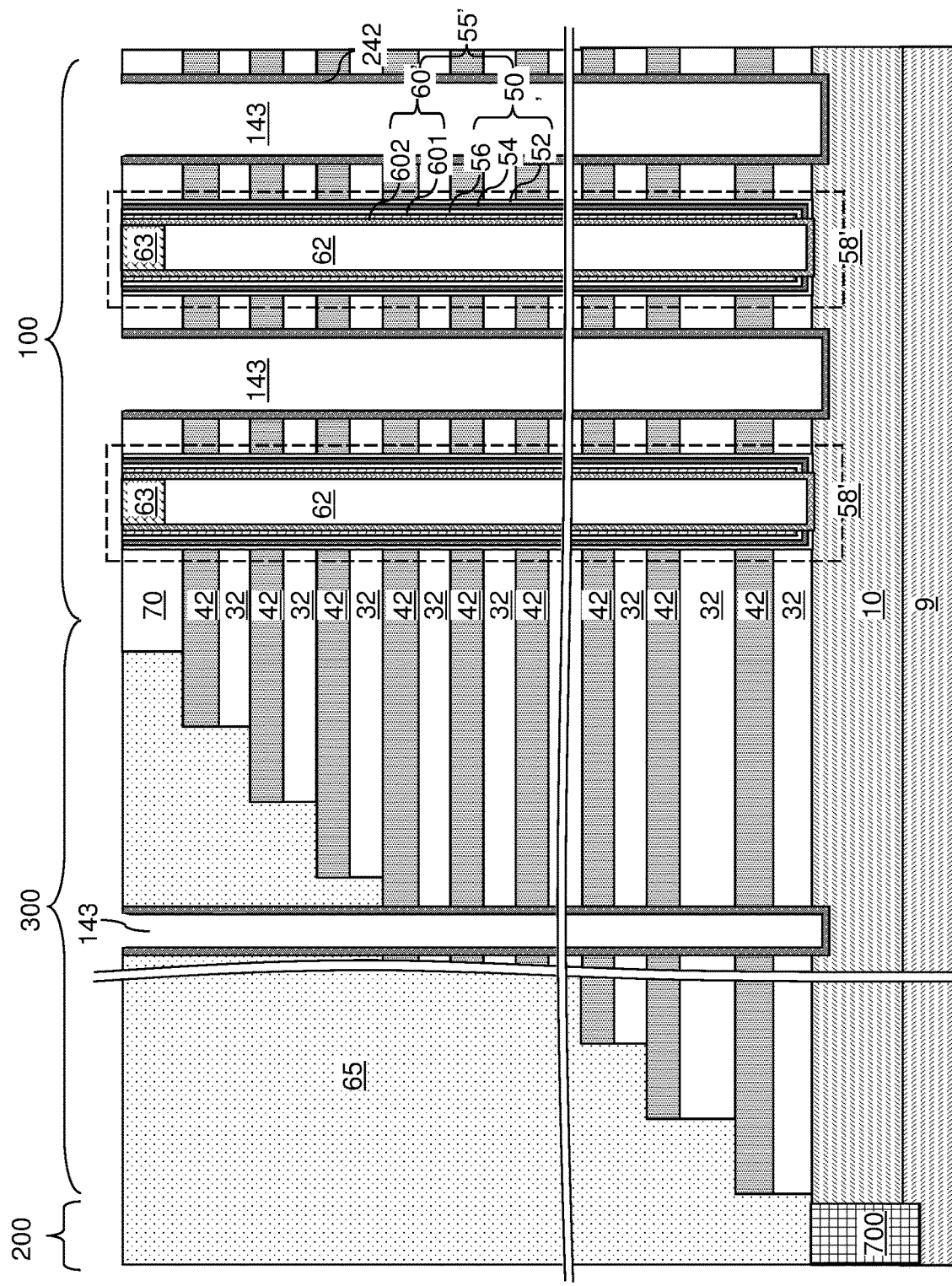

FIG. 17A is a vertical cross-sectional view of the second exemplary structure after removal of the sacrificial fill material portions selective to etch stop sacrificial liners according to the second embodiment of the present disclosure.

Figure 17B:
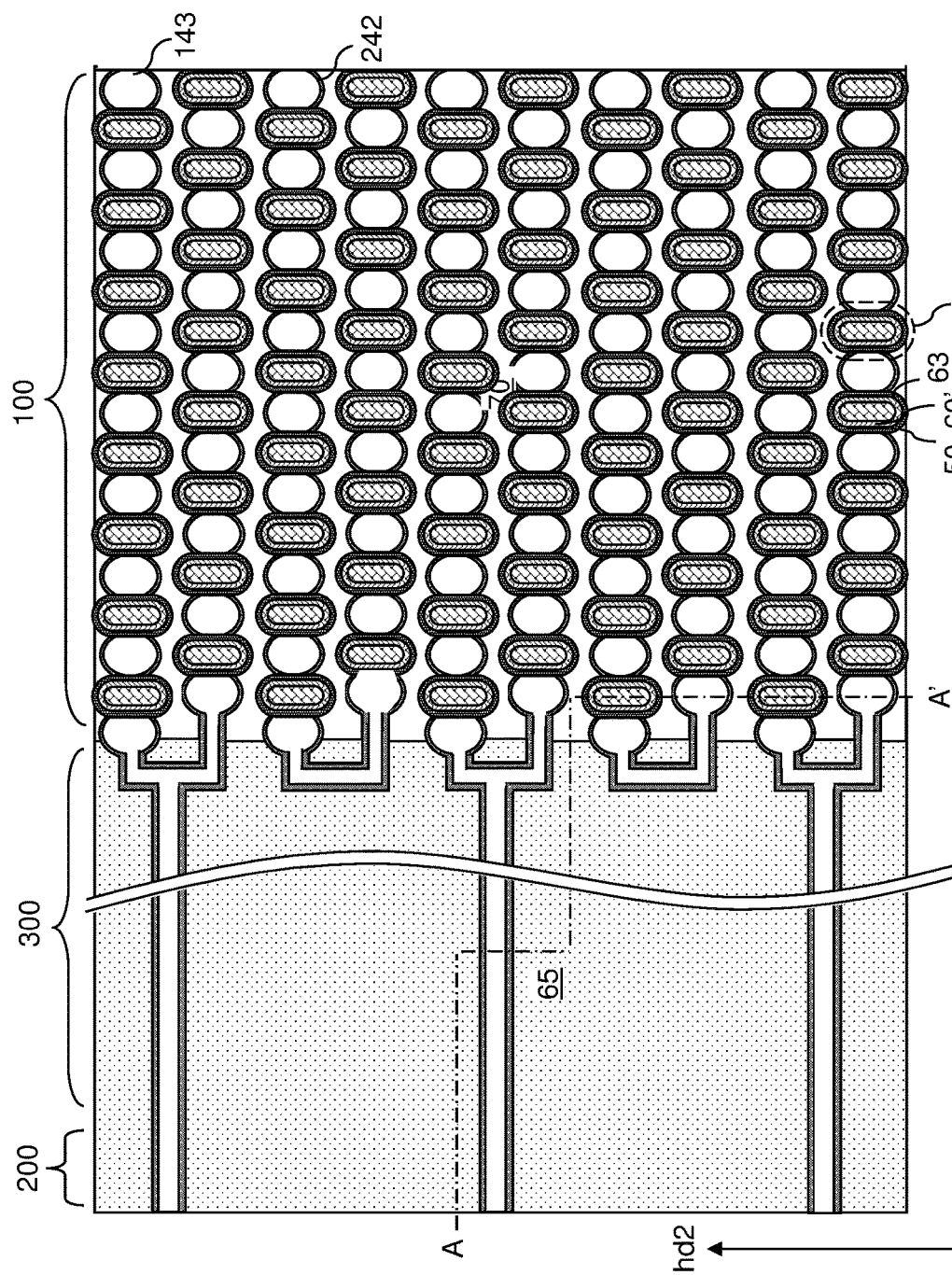

FIG. 17B is a top-down view of the second exemplary structure of FIG. 17A. The vertical plane A-A' corresponds to the plane of the vertical cross-sectional view of FIG. 17A.

FIG. 17C is a vertical cross-sectional view along the vertical plane C-C' of FIG. 17B.

Figure 18A:
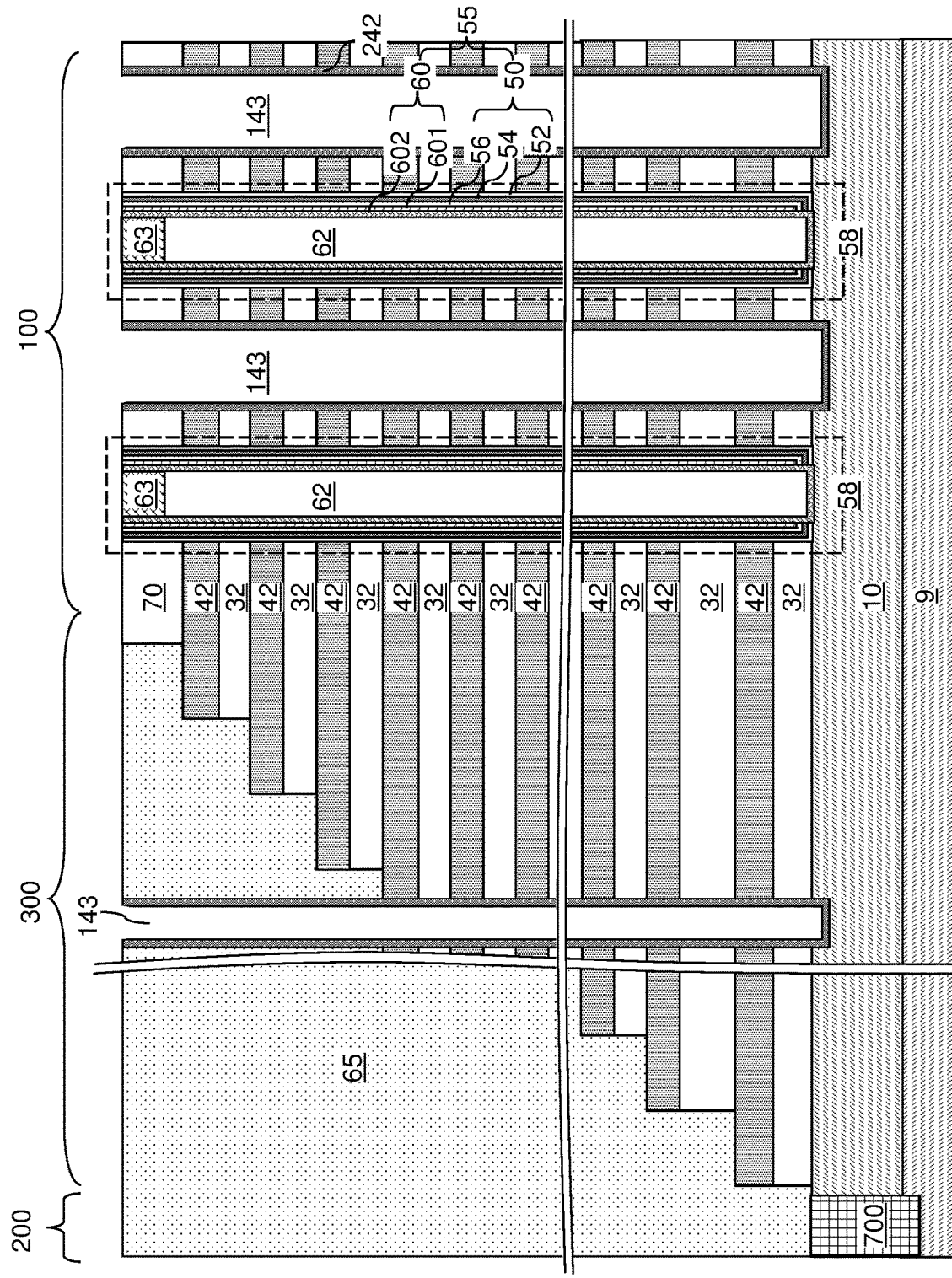

FIG. 18A is a vertical cross-sectional view of the second exemplary structure after a first isotropic etch process that etches physically exposed portions of the memory films and a second isotropic etch process that etches physically exposed portions of the in-process vertical semiconductor channels according to the second embodiment of the present disclosure.

Figure 18B:
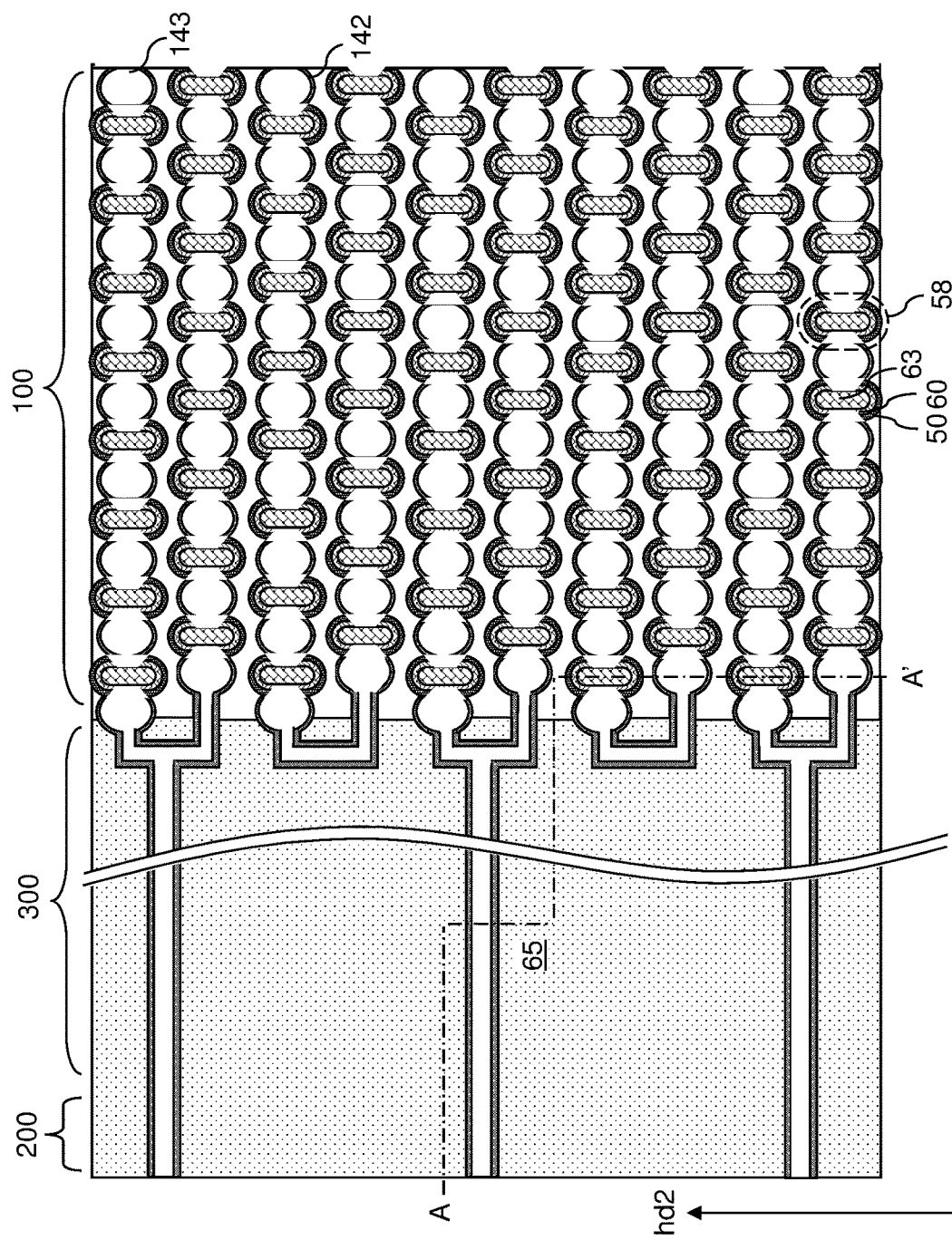

FIG. 18B is a top-down view of the second exemplary structure of FIG. 18A. The vertical plane A-A' corresponds to the plane of the vertical cross-sectional view of FIG. 18A.

Figure 18C:
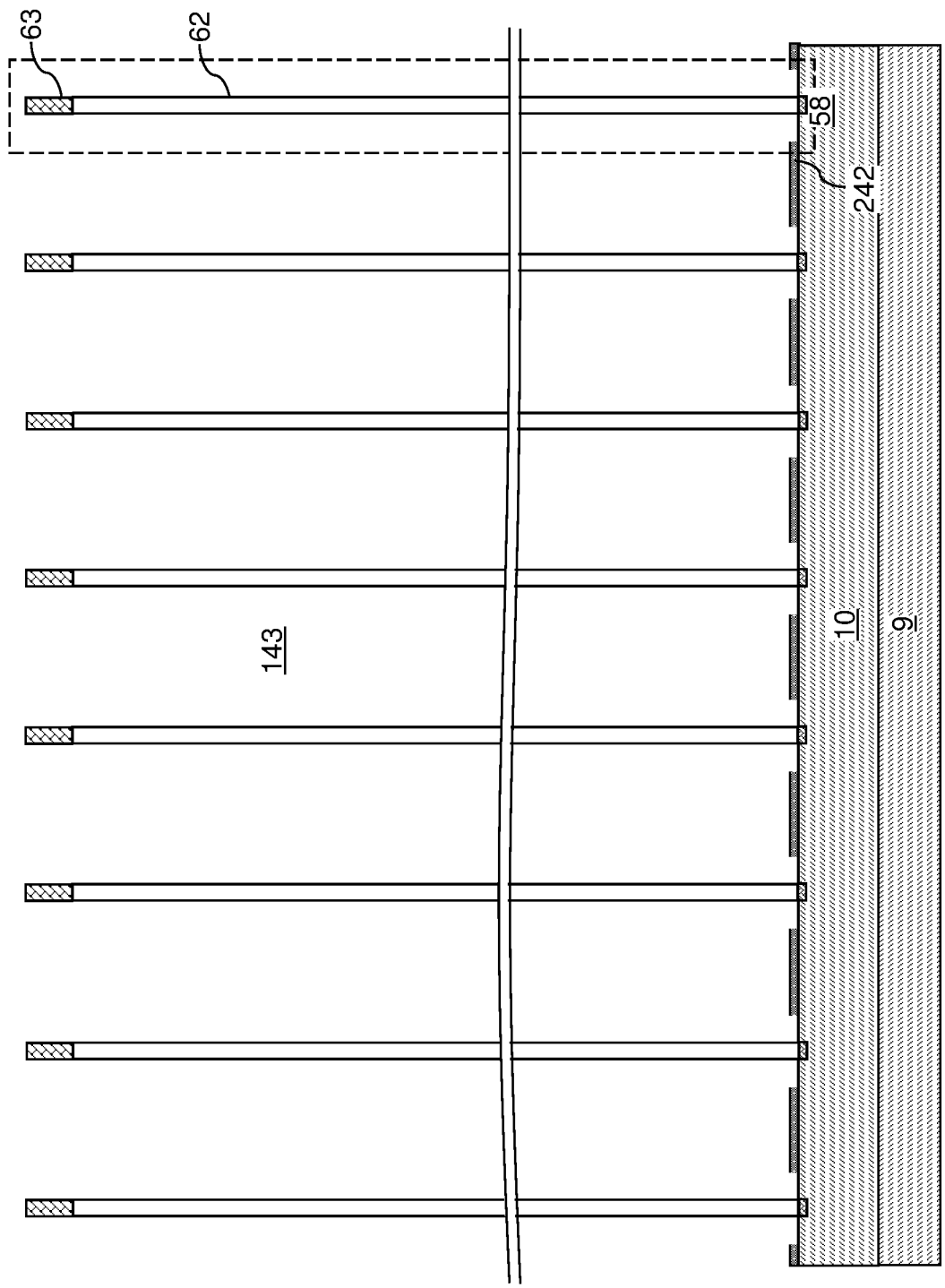

FIG. 18C is a vertical cross-sectional view along the vertical plane C-C' of FIG. 18B.

Figure 18D:
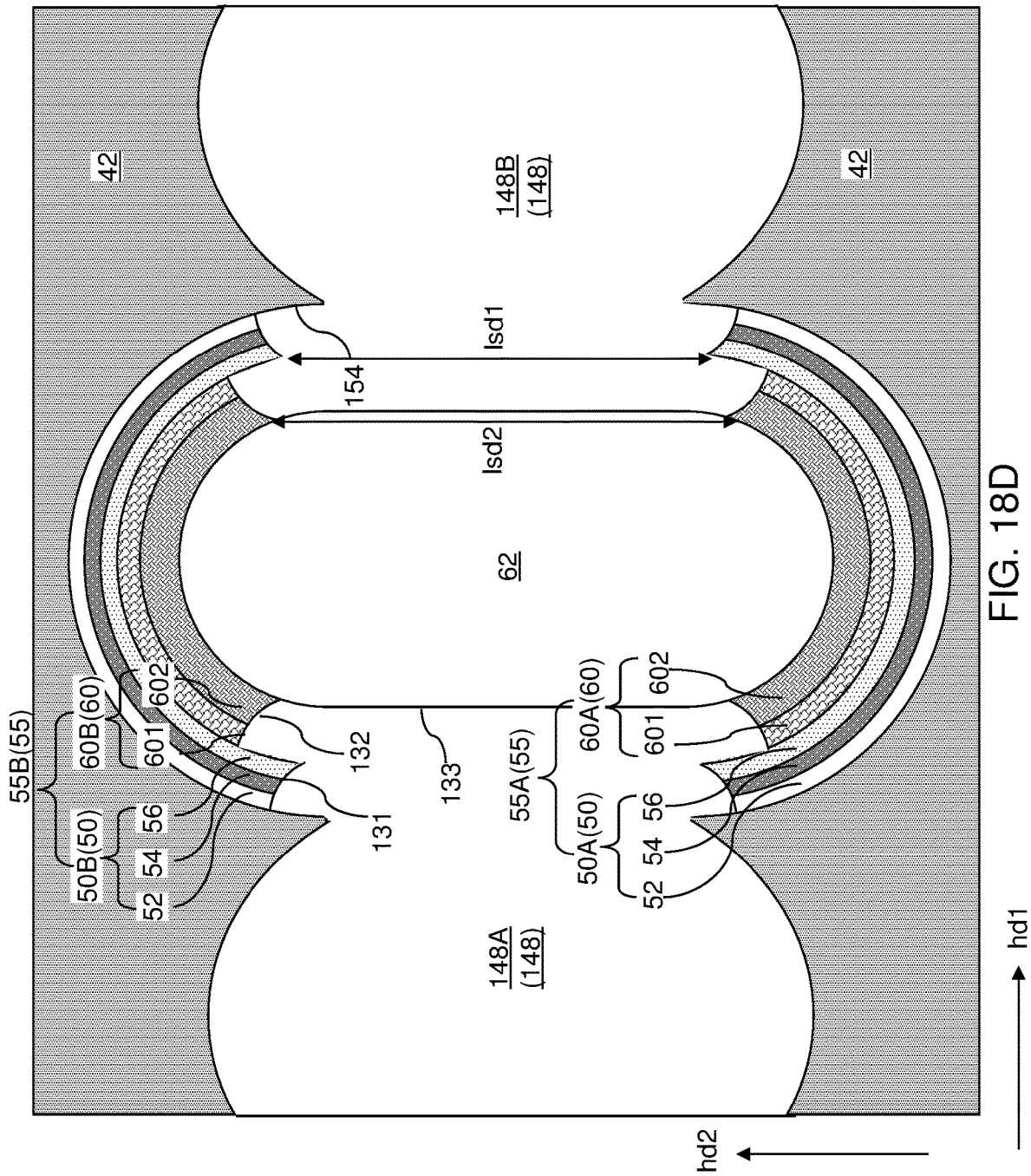

FIG. 18D is a horizontal cross-sectional view of a memory opening fill structure in a memory opening after the processing steps of FIGS. 18A-18C according to the second embodiment of the present disclosure.

Figure 19A:
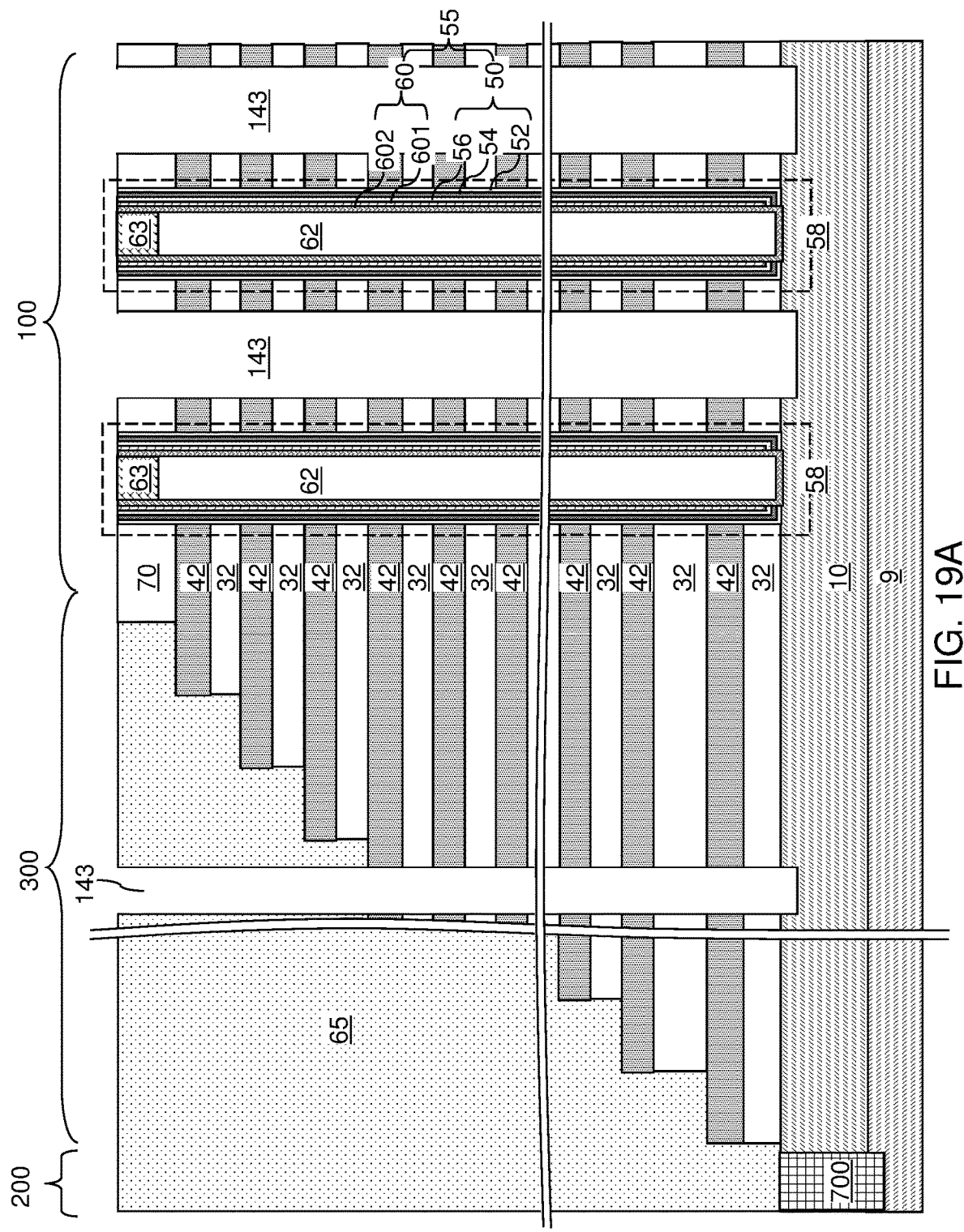

FIG. 19A is a vertical cross-sectional view of the second exemplary structure after removal of the etch stop sacrificial liners according to the second embodiment of the present disclosure.

Figure 19B:
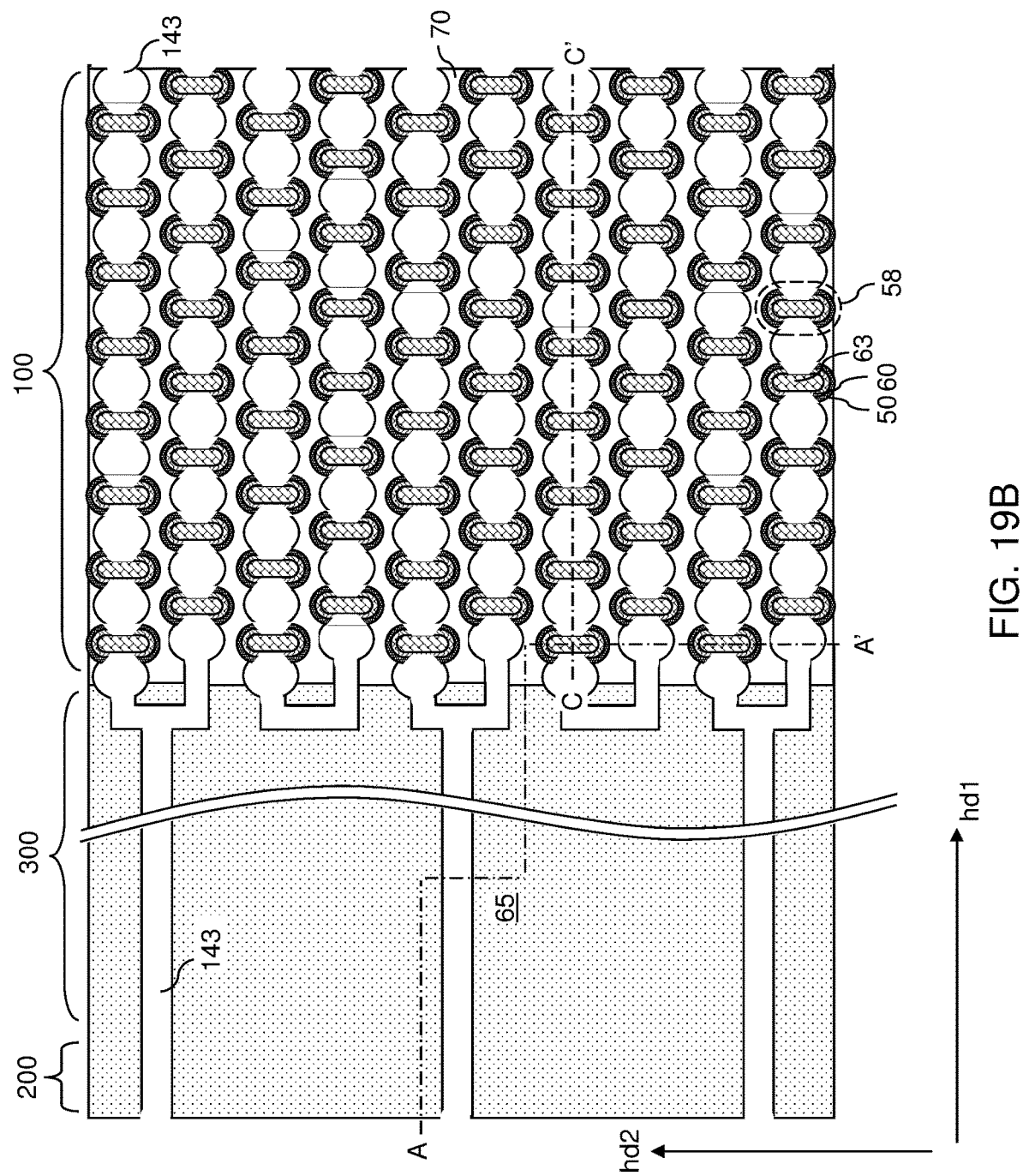

FIG. 19B is a top-down view of the second exemplary structure of FIG. 19A. The vertical plane A-A' corresponds to the plane of the vertical cross-sectional view of FIG. 19A.

Figure 19C:
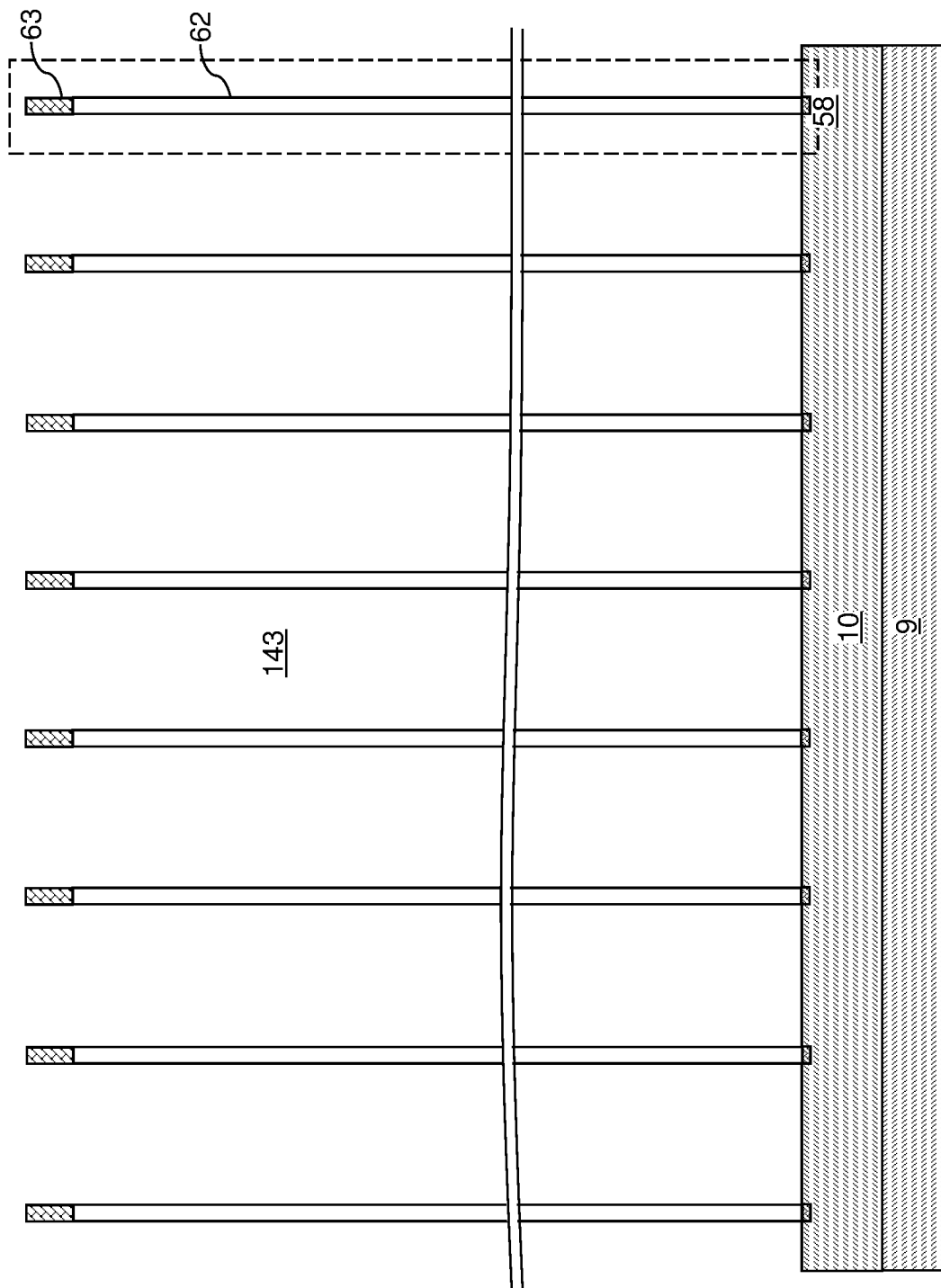

FIG. 19C is a vertical cross-sectional view along the vertical plane C-C' of FIG. 19B.

Figure 20:
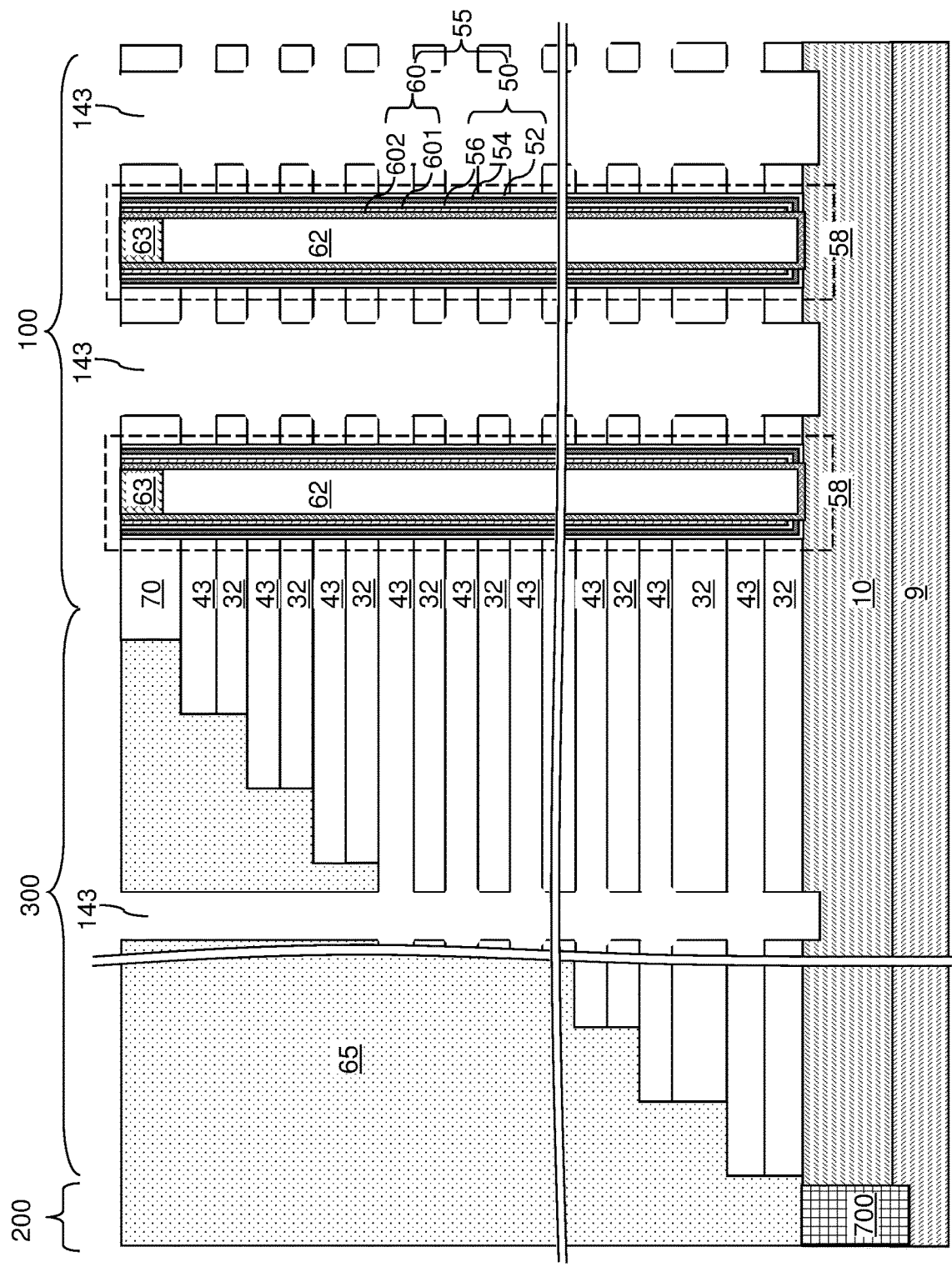

FIG. 20 is a vertical cross-sectional view of the second exemplary structure after removal of the etch stop sacrificial liners and formation of backside recesses according to the second embodiment of the present disclosure.

Figure 21:
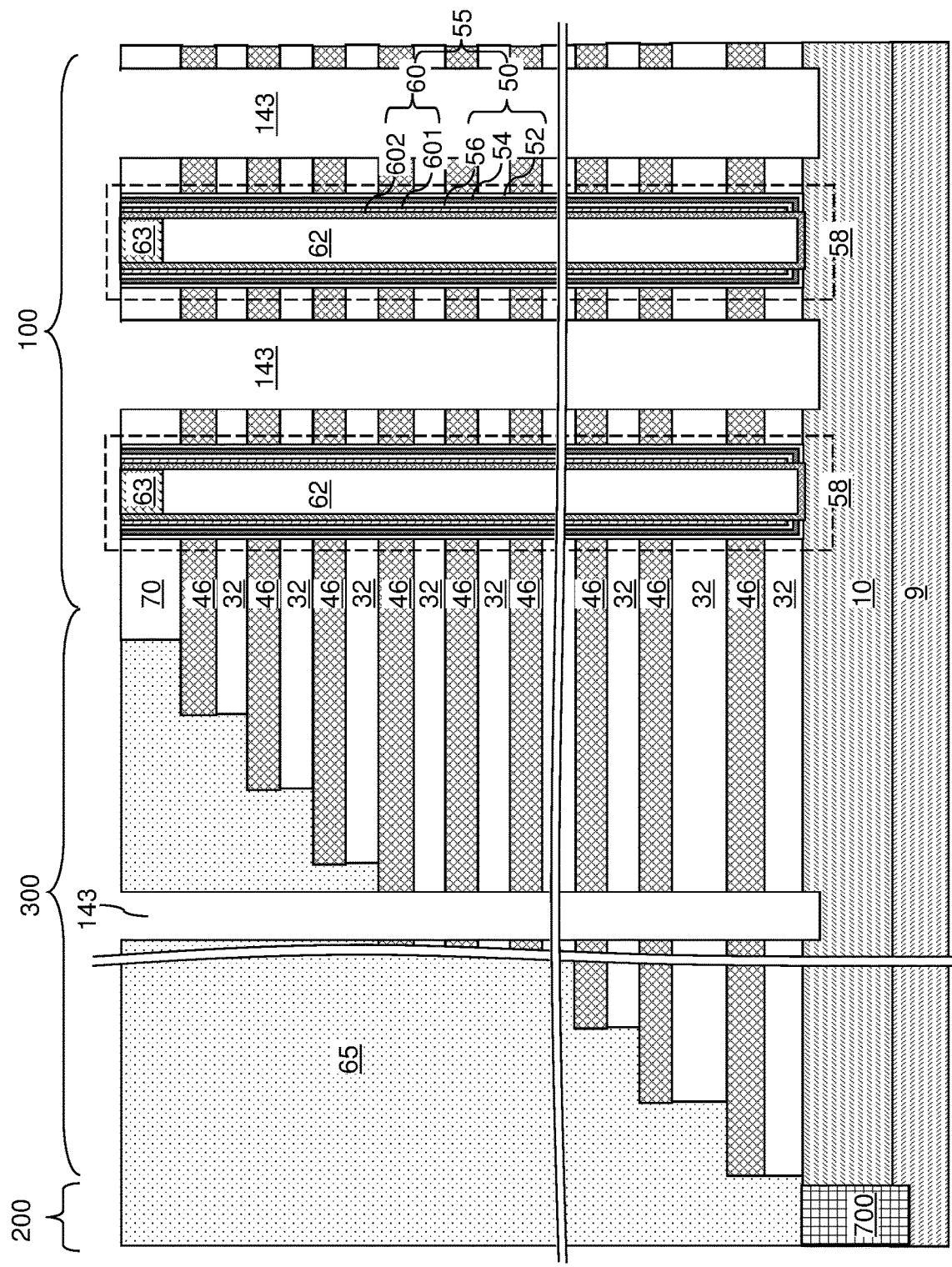

FIG. 21 is a vertical cross-sectional view of the second exemplary structure after formation of electrically conductive layers according to the second embodiment of the present disclosure.

Figure 22A:
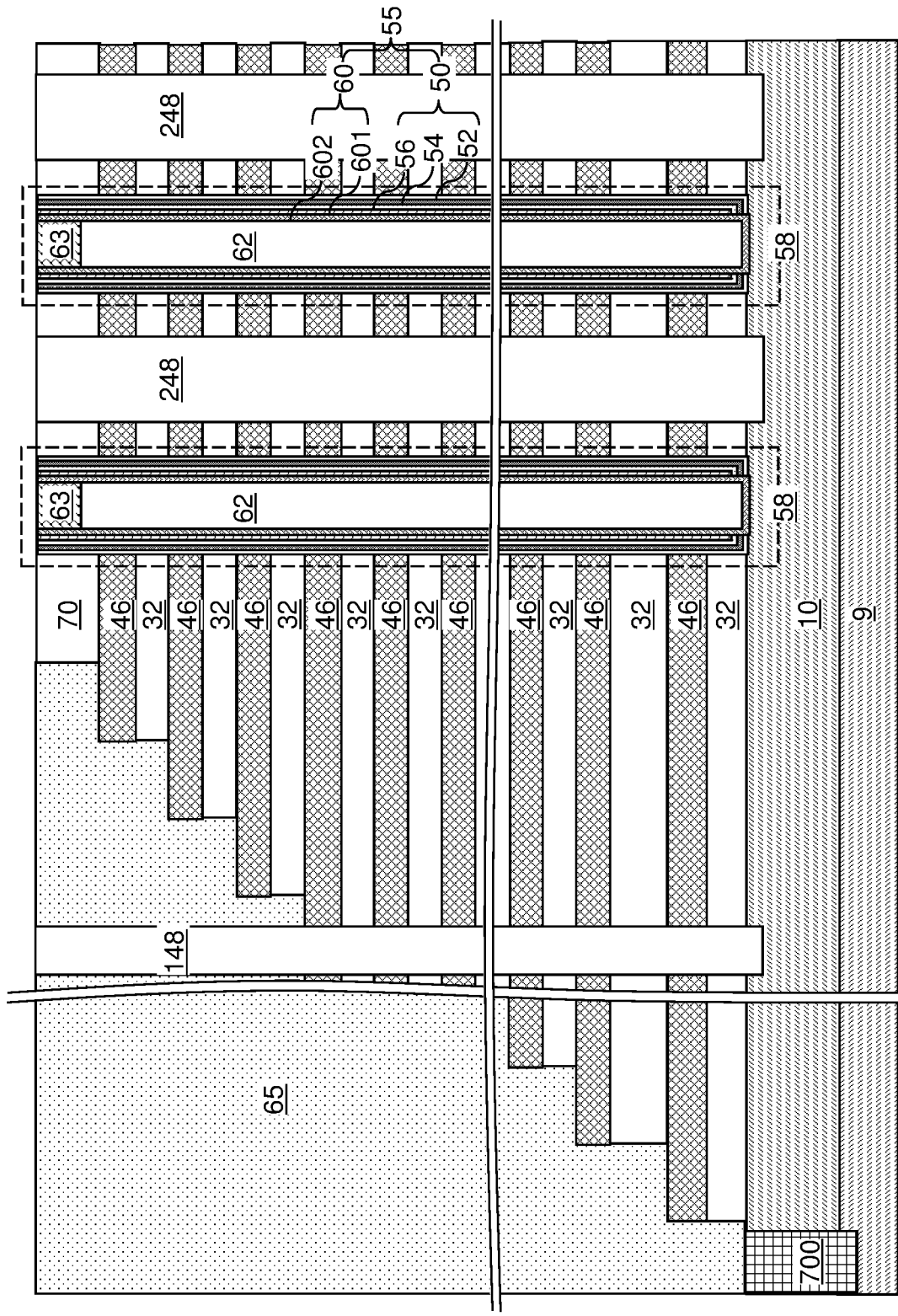

FIG. 22A is a vertical cross-sectional view of the second exemplary structure after formation of dielectric pillar structures according to the second embodiment of the present disclosure.

Figure 22B:
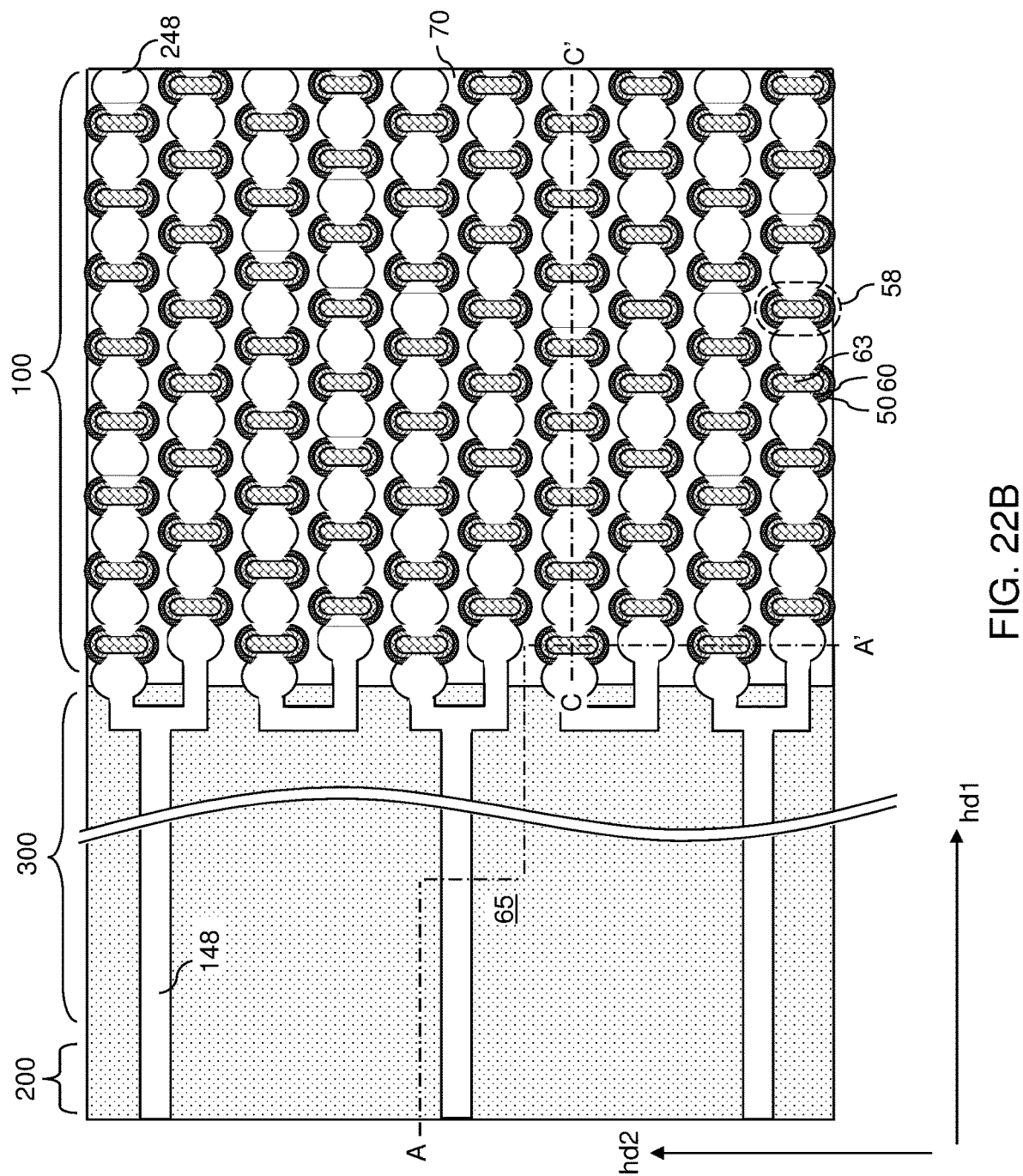

FIG. 22B is a top-down view of the second exemplary structure of FIG. 22A. The vertical plane A-A' corresponds to the plane of the vertical cross-sectional view of FIG. 22A.

Figure 22C:
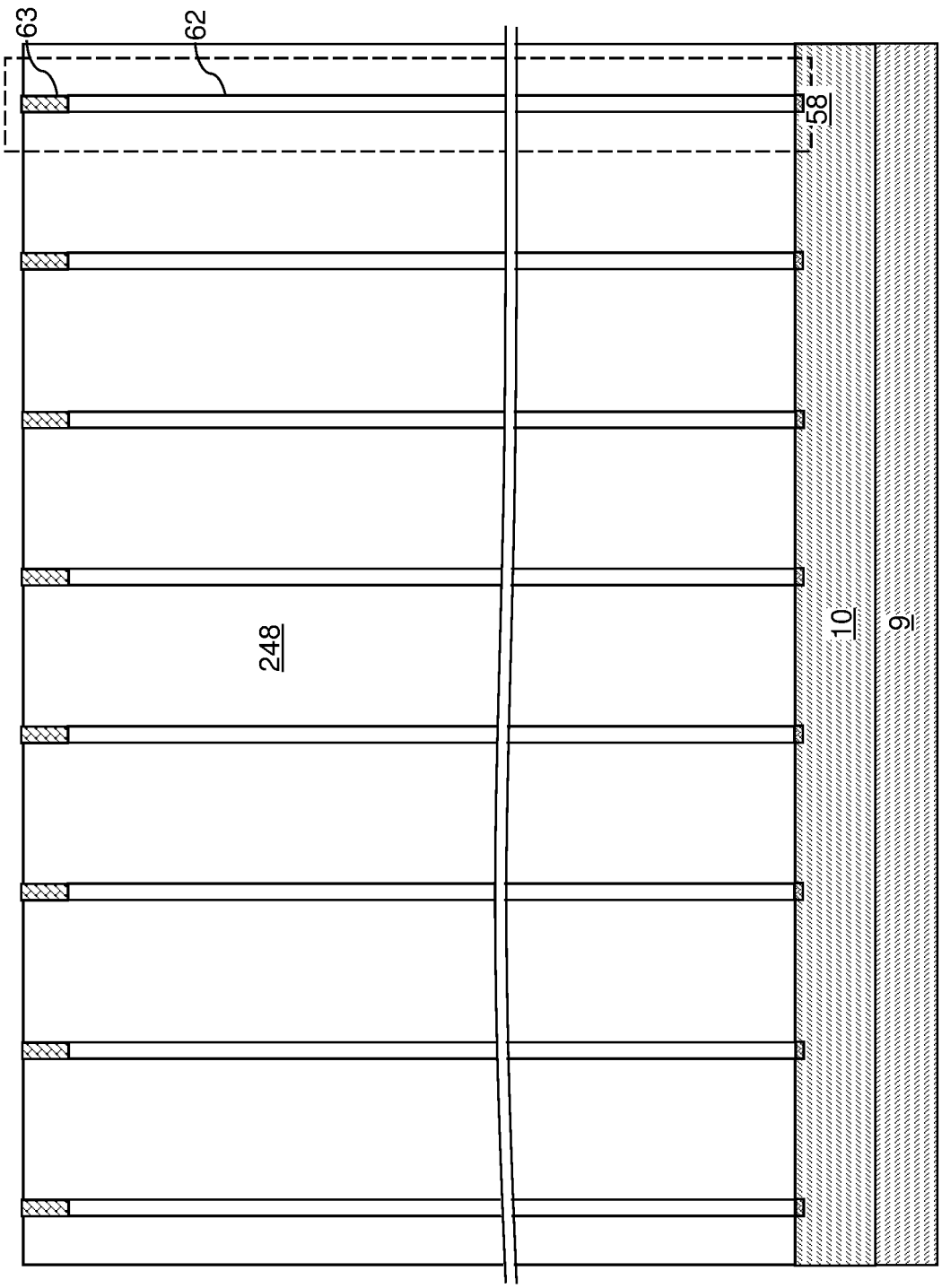

FIG. 22C is a vertical cross-sectional view along the vertical plane C-C' of FIG. 22B.

Figure 22D:
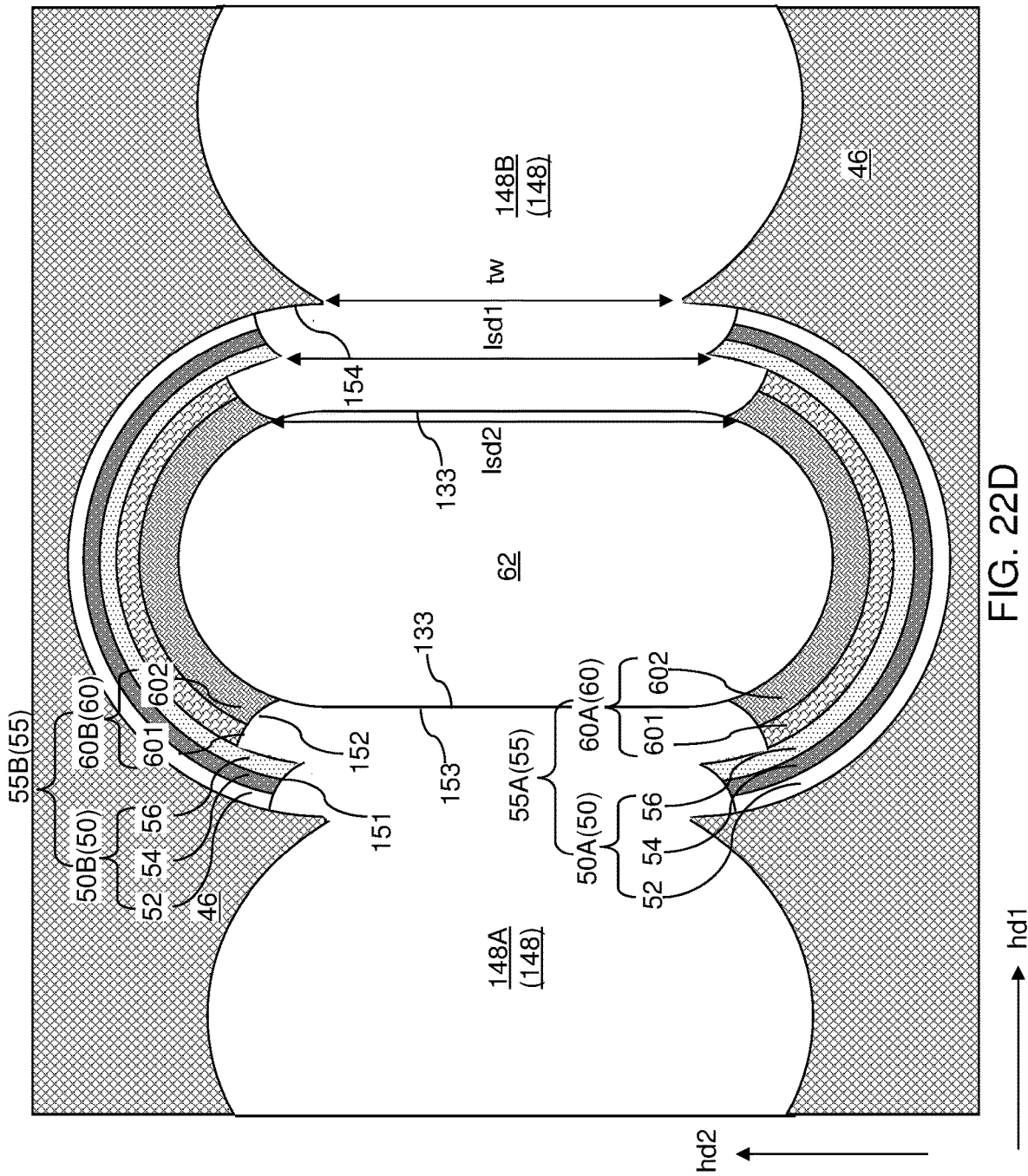

FIG. 22D is a horizontal cross-sectional view of a memory opening fill structure in a memory opening after the processing steps of FIGS. 22A-22C according to the second embodiment of the present disclosure.

Figure 23A:
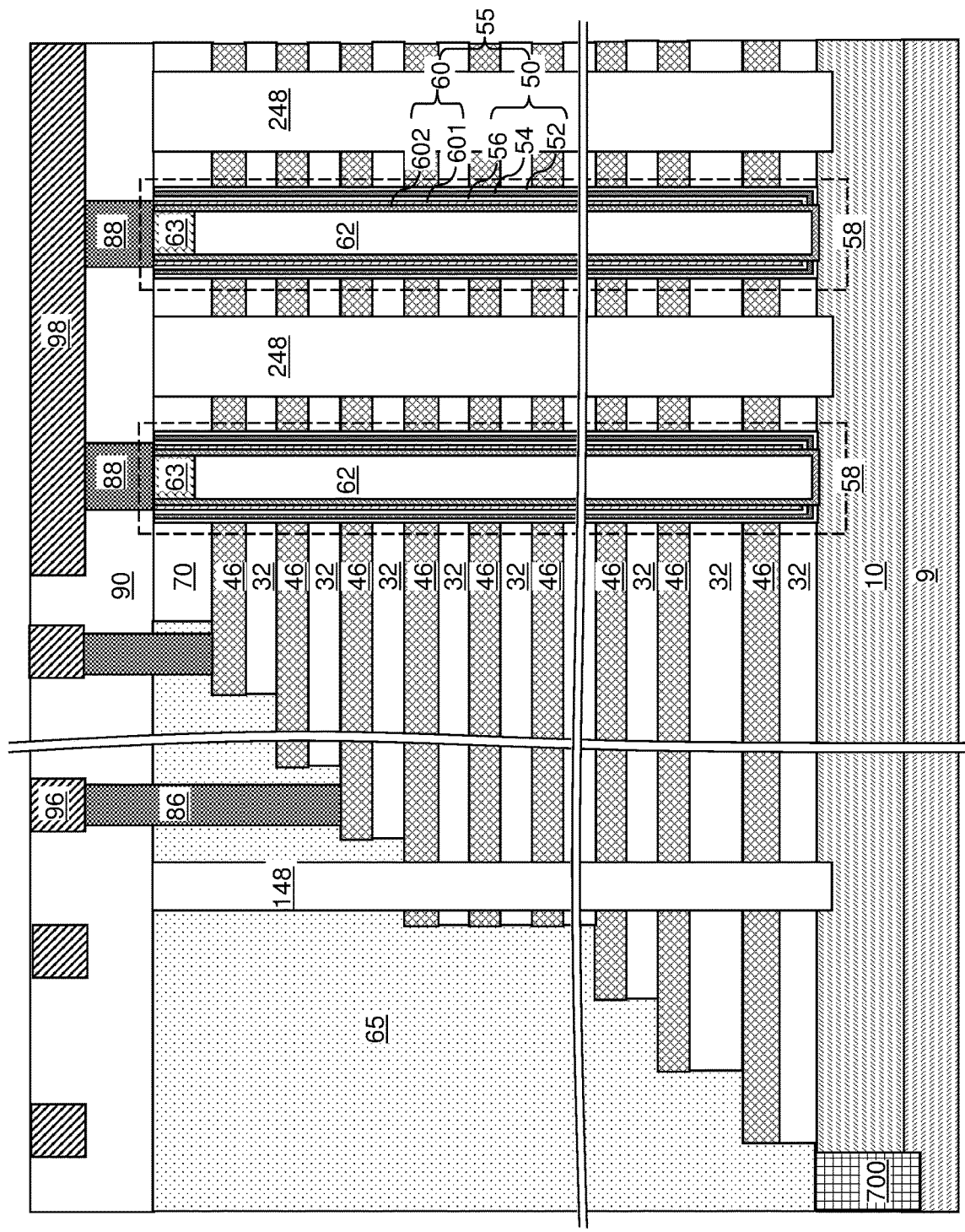

FIG. 23A is a vertical cross-sectional view of the second exemplary structure after formation of contact via structures and metal lines according to the second embodiment of the present disclosure.

Figure 23B:
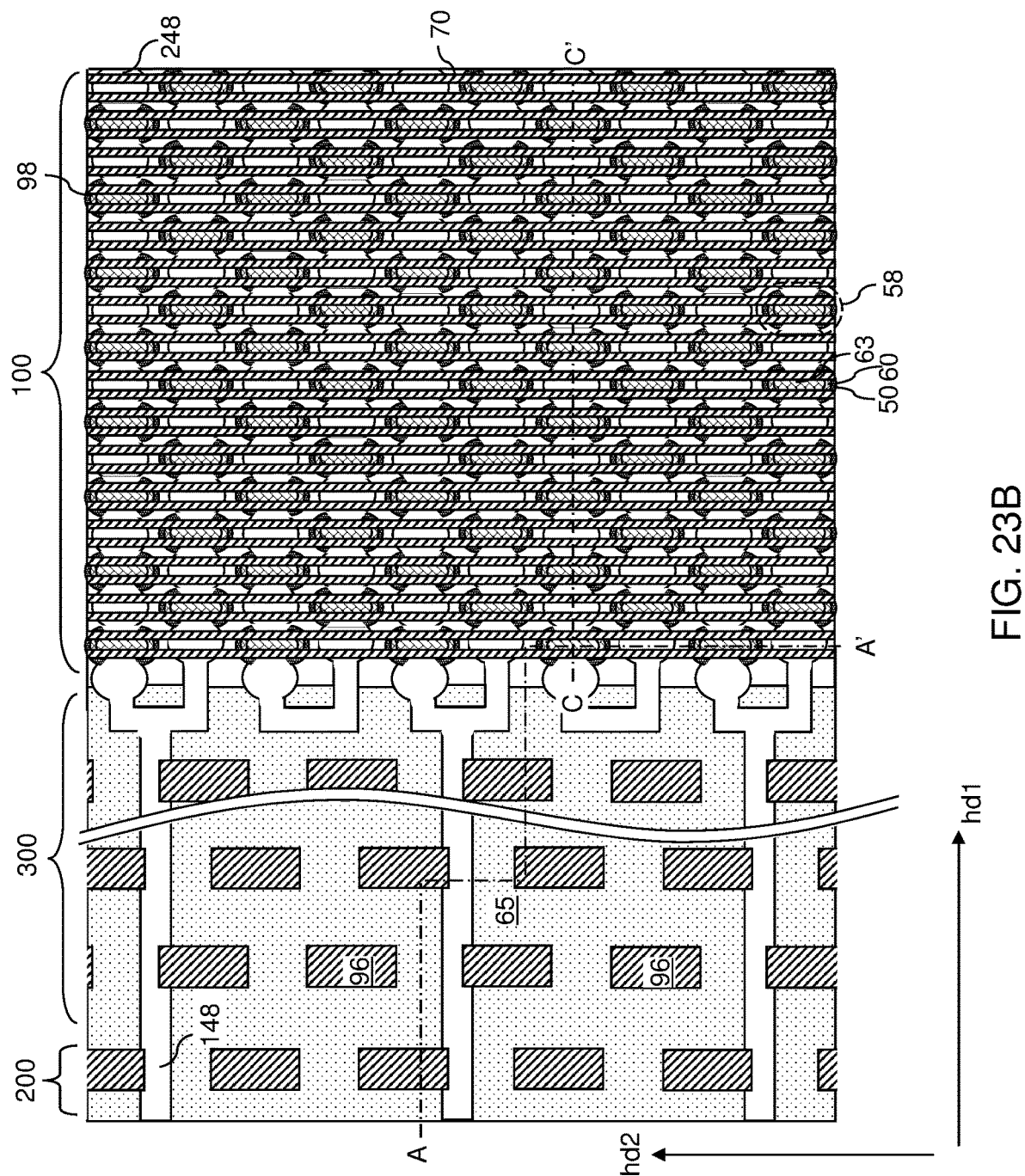

FIG. 23B is a top-down view of the second exemplary structure of FIG. 23A. The vertical plane A-A' corresponds to the plane of the vertical cross-sectional view of FIG. 23A.

Figure 23C:
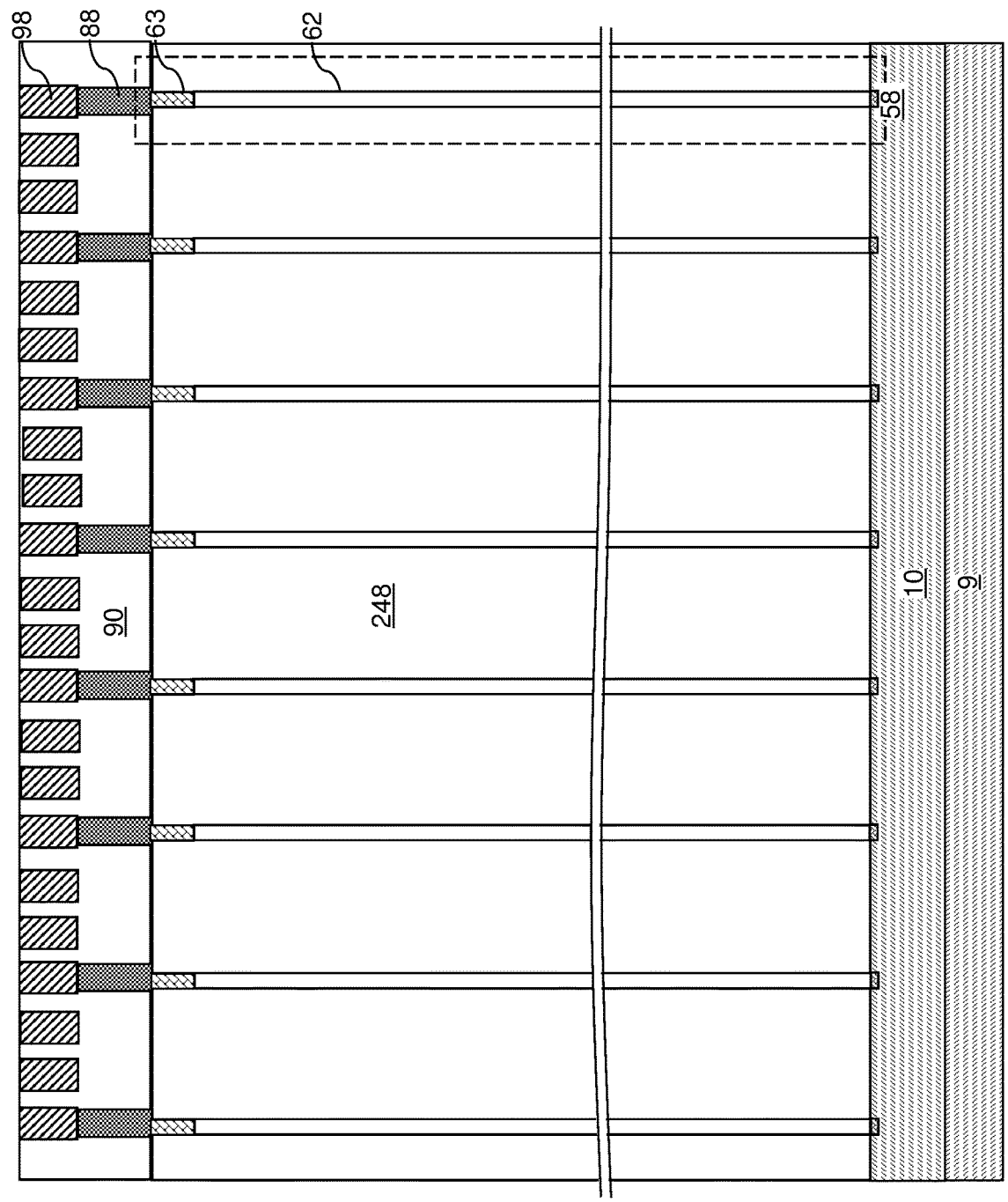

FIG. 23C is a vertical cross-sectional view along the vertical plane C-C' of FIG. 23B.

DETAILED DESCRIPTION

As discussed above, the embodiments of the present disclosure is directed to a three-dimensional memory device including split memory cells and methods of forming the same, the various aspects of which are described below. The embodiments of the present disclosure provide trenches or openings filled with an etch stop liner and a sacrificial fill material between memory opening fill structures which include a memory film and a semiconductor channel. The sacrificial fill material may be selectively etched to form recesses, and the memory opening fill structures may be laterally separated into split memory cells by providing a selective etchant into the recesses. The etch stop liners prevent etching of the alternating stack through which the memory opening fill structures extend during the memory cell etching step. This process decreases the processing cost and simplifies processing steps because the memory cells are separated by simple, selective wet etching. The embodiments of the present disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Generally, a semiconductor package (or a "package") refers to a unit semiconductor device that can be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many number of external commands as the total number of planes therein. Each die includes one or more planes. Identical concurrent operations can be executed in each plane within a same die, although there may be some restrictions. In case a die is a memory die, i.e., a die including memory elements, concurrent read operations, concurrent write operations, or concurrent erase operations can be performed in each plane within a same memory die. In a memory die, each plane contains a number of memory blocks (or "blocks"), which are the smallest unit that can be erased by in a single erase operation. Each memory block contains a number of pages, which are the smallest units that can be selected for programming. A page is also the smallest unit that can be selected to a read operation.

Figure 1:
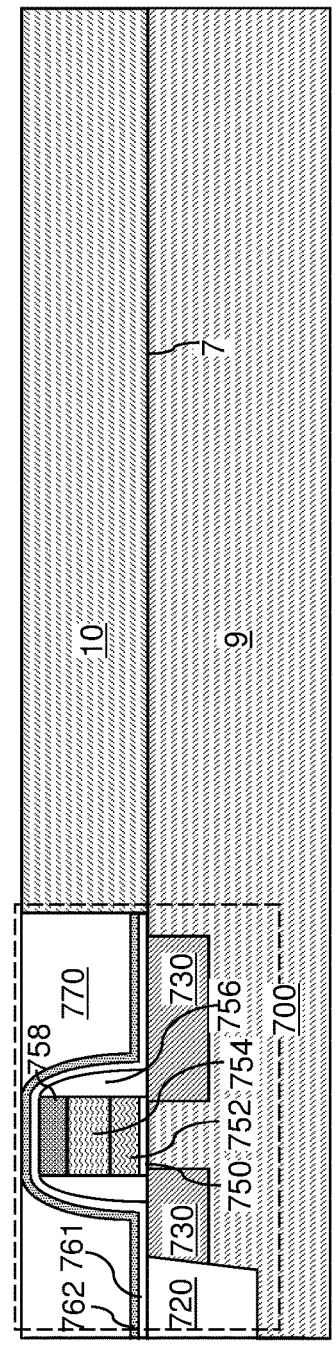
FIG. 1 is a vertical cross-section of a first exemplary structure after formation of field effect transistors on a semiconductor substrate according to a first embodiment of the present disclosure.

Referring to FIG. 1, a first exemplary structure according to a first embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^{5}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{5}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 770 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A staircase region 300 for subsequently forming stepped terraces of electrically conductive layers can be provided between the memory array region 100 and the peripheral device region 200.

Figure 2:
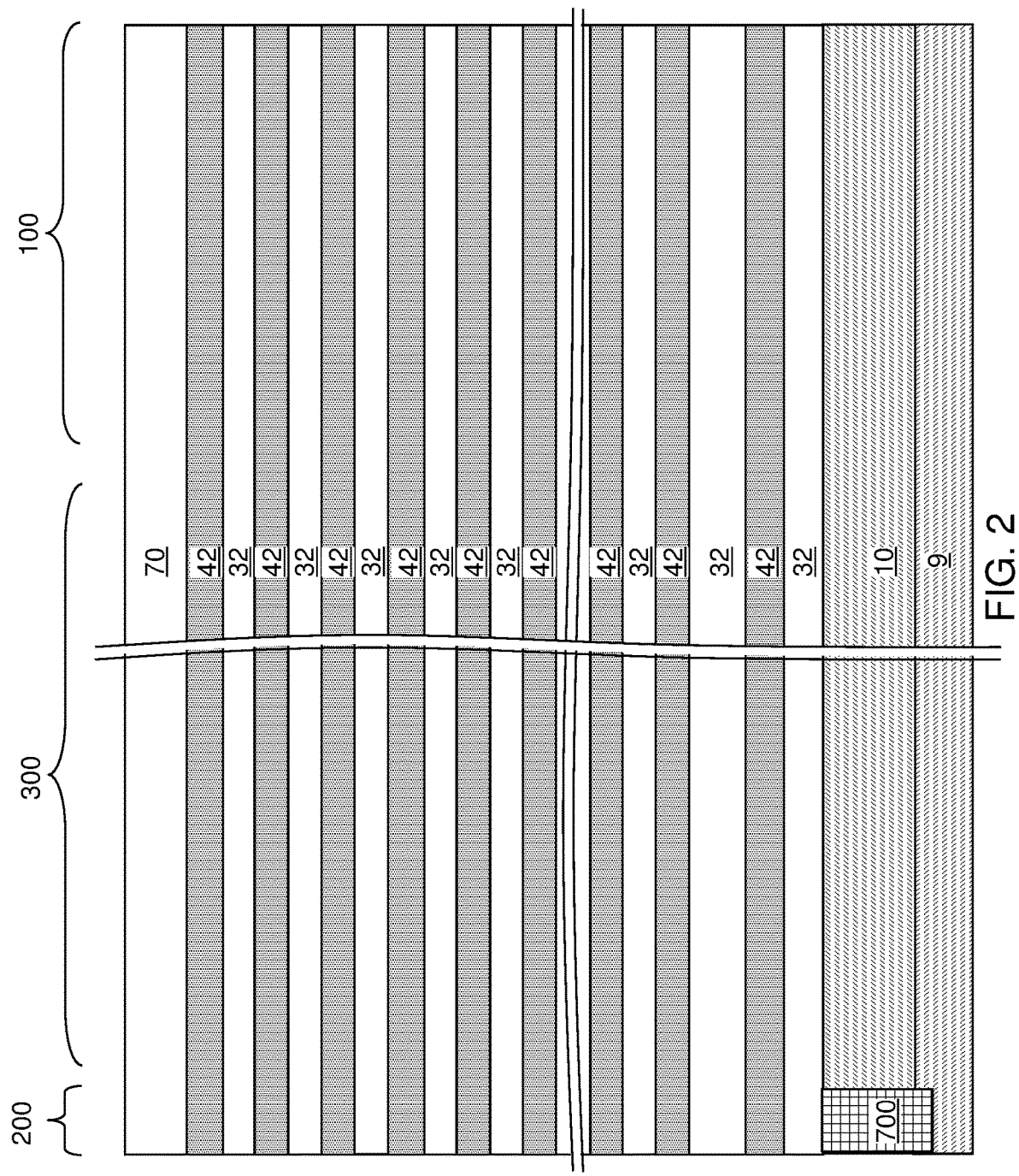
FIG. 2 is a vertical cross-sectional view of the first exemplary structure after formation of a vertically alternating sequence of continuous insulating layers and continuous spacer material layers according to the first embodiment of the present disclosure.

Referring to FIG. 2, a stack of an alternating plurality of first material layers (which can be insulating layers 32) and second material layers (which can be spacer layers 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as a vertically alternating sequence (32, 42). In one embodiment, the vertically alternating sequence (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the vertically alternating sequence (32, 42) can have a uniform thickness that is substantially invariant within each respective sacrificial material layer 42.

While the present disclosure is described employing an embodiment in which the spacer material layers 42 are sacrificial material layers that are subsequently replaced with electrically conductive layers, embodiments are expressly contemplated herein in which the spacer material layers are formed as electrically conductive layers (e.g., as metal, metal alloy and/or heavily doped polysilicon word lines). In this case, steps for replacing the sacrificial material layers with electrically conductive layers can be omitted.

Optionally, an insulating cap layer 70 can be formed over the vertically alternating sequence (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Referring to FIG. 3, stepped surfaces are formed at a peripheral region of the vertically alternating sequence (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the vertically alternating sequence (32, 42) are removed through formation of the stepped surfaces. A "stepped cavity" refers to a cavity having stepped surfaces.

The terrace region is formed in the staircase region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the vertically alternating sequence (32, 42) laterally extends farther than any overlying sacrificial material layer 42 within the vertically alternating sequence (32, 42) in the terrace region. The terrace region includes stepped surfaces of the vertically alternating sequence (32, 42) that continuously extend from a bottommost layer within the vertically alternating sequence (32, 42) to a topmost layer within the vertically alternating sequence (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Referring to FIGS. 4A and 4B, line trenches can be formed through the insulating cap layer 70 and the vertically alternating sequence (32, 42), for example, by application and patterning of a photoresist layer (not shown) over the vertically alternating sequence (32, 42), and transfer of the pattern in the photoresist layer through the insulating cap layer 70 and the vertically alternating sequence (32, 42) employing an anisotropic etch process. The anisotropic etch process can employ the semiconductor material layer 10 as a stopping structure. For example, the etch chemistry of the anisotropic etch process can be selected to etch through the first and second materials of the vertically alternating sequence (32, 42), and to be selective to the material of the semiconductor material layer 10. The bottom surface of each line trench can be formed on a topmost surface or a recessed top surface of the semiconductor substrate layer 10. The line trenches can have a uniform width, which can be in a range from 25 nm to 150 nm, such as from 40 nm to 100 nm, although lesser and greater widths can also be employed. The photoresist layer can be subsequently removed, for example, by ashing.

The line trenches can laterally extend straight through the memory array region 100 along a first horizontal direction hd1, and can be laterally spaced apart along a second horizontal direction hd2 that is perpendicular to the first horizontal direction. The vertically alternating sequence (32, 42) can be divided into multiple discrete portions including at least one strip that laterally extend along the first horizontal direction hd1 located between a respective neighboring pair of line trenches that laterally extend along the first horizontal direction hd1. Each patterned discrete portion of the vertically alternating sequence (32, 42) is herein referred to as an alternating stack (32, 42) of insulating layers 32 and spacer material layers (which can be sacrificial material layers 42).

Multiple patterned strips of the alternating stack (32, 42) can be formed in the memory array region 100 such that each strip of the alternating stack (32, 42) laterally extends along the first horizontal direction hd1. Neighboring pair of line trenches can merge in the staircase region 300 so that multiple laterally-extending strips of the alternating stack (32, 42) are connected to a common portion of an alternating stack (32, 42) including stepped surfaces in the staircase region 300. In case two staircase regions 300 are located on opposite sides of the memory array region 100, the strips of the alternating stacks (32, 42) can be sequentially numbered with integers (such as 1, 2, 3, etc.) along the second horizontal direction hd2, and every odd-numbered strips of the alternating stack (32, 42) can be connected to a respective patterned portion of the alternating stack (32, 42) located in one of the staircase regions 300, and every even-numbered strips of the alternating stack (32, 42) can be connected to a respective patterned portion of the alternating stack (32, 42) located in another of the staircase regions 300.

Each line trench can be filled with a sacrificial fill structure, which is subsequently modified and then removed. Thus, the sacrificial fill structures that are formed in the line trenches at this process step are herein referred to as in-process sacrificial fill structures. The in-process sacrificial fill structures include a sacrificial fill material rail 144' and optionally include a liner layer 142'. If the final device includes the etch stop liner (e.g., as will be described below with reference to FIGS. 12E and 12F), then the in-process sacrificial fill structures include only sacrificial fill material rail 144'. If the liner comprises an etch stop sacrificial material which is removed during processing, then the in-process sacrificial fill structures (142', 144') include the etch stop sacrificial liner layer 142' in addition to the sacrificial fill material rail 144'. The in-process sacrificial fill structures (142', 144') including the liner layer 142' are described below for brevity. Each in-process sacrificial fill structure (142', 144') can be formed by conformally depositing an etch stop sacrificial material on physically exposed surfaces of the line trenches, and by filling remaining volumes of the line trenches with a sacrificial fill material. Excess portions of the etch stop sacrificial material and the sacrificial fill material can be removed from above the horizontal plane including the top surface of the insulating cap layer 70 by a planarization process, which can employ chemical mechanical planarization or a recess etch. Each remaining portion of the etch stop sacrificial material a line trench constitutes the etch stop sacrificial liner layer 142', and each remaining portion of the sacrificial fill material in a line trench constitutes the sacrificial fill material rail 144'. Each sacrificial fill material rail 144' is a sacrificial fill material portion that laterally extends with a uniform or substantially uniform vertical cross-sectional shape along vertical planes that are perpendicular to the lengthwise direction of the sacrificial material portion. Each contiguous combination of an etch stop sacrificial liner layer 142' and a sacrificial fill material rail 144' constitutes an in-process sacrificial fill structure (142', 144') that fills a respective line trench.

The sacrificial fill material includes a material that can be removed selective to the etch stop sacrificial material. For example, the etch stop sacrificial liner layers 142' can include undoped silicate glass, silicon oxycarbide, or a dielectric metal oxide (such as aluminum oxide), and the sacrificial fill material rails 144' can include borosilicate glass, borophosphosilicate glass, porous or non-porous organosilicate glass, or a silicon-germanium alloy. In an illustrative example, the etch stop sacrificial liner layers 142' can include undoped silicate glass, and the sacrificial fill material rails 144' can include borosilicate glass or borophosphosilicate glass.

Generally, each of the in-process sacrificial fill structures (142', 144') comprises a respective etch stop sacrificial liner layer 142' contacting sidewalls of the alternating stacks of insulating layers 32 and spacer material layers (such as the sacrificial material layers 42), and comprises a respective sacrificial fill material rail 144' that is laterally spaced from most proximal ones of the alternating stacks (32, 42) by a respective etch stop sacrificial liner layer 142'. The thickness of the etch stop sacrificial liner layer 142' can be in a range from 5 nm to 30 nm, although lesser and greater thicknesses can also be employed. If the etch stop sacrificial liner layer 142' comprises silicon oxide, then it preferably has a greater thickness than a combined thickness of a blocking dielectric layer and a tunneling dielectric layer that will be described below.

Referring to FIGS. 5A and 5B, a lithographic material stack (not shown) including at least a photoresist layer can be formed over the insulating cap layer 70 and the retro-stepped dielectric material portion 65, and can be lithographically patterned to form openings over the memory array region 100. The openings in the photoresist layer can be arranged as rows that laterally extend along the first horizontal direction hd1 and overlies a respective one of the in-process sacrificial fill structures (142', 144'). In one embodiment, the pattern of the openings can be selected that the periphery of each opening in the photoresist layer overlies both lengthwise sidewalls of a respective underlying in-process sacrificial fill structure (142', 144').

The pattern of the openings in the photoresist layer can be transferred through the insulating cap layer 70 and the vertically alternating sequence (32, 42) by at least one anisotropic etch that employs the patterned photoresist layer as an etch mask. Portions of the alternating stack (32, 42) underlying the openings in the patterned photoresist layer are etched to form memory openings 49. As used herein, a "memory opening" refers to a structure in which memory elements, such as a memory stack structure, is subsequently formed. Optionally, the photoresist layer may include additional openings in the staircase region, and support openings (not shown) may be formed through the retro-stepped dielectric material portion 65 and the underlying portions of the alternating stacks (32, 42) during the anisotropic etch process. The memory openings 49 are formed through the insulating cap layer 70 and the entirety of the alternating stack (32, 42) in the memory array region 100.

The memory openings 49 extend through the entirety of the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 can be substantially vertical, or can be tapered. The photoresist layer can be subsequently removed, for example, by ashing.

The memory openings 49 can extend from the top surface of the alternating stack (32, 42) to at least the horizontal plane including the topmost surface of the semiconductor material layer 10. In one embodiment, an overetch into semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 may be coplanar with the topmost surface of the semiconductor material layer 10.

Each of the memory openings 49 may include a sidewall (or a plurality of sidewalls) that extends substantially perpendicular to the topmost surface of the substrate. A two-dimensional array of memory openings 49 can be formed in the memory array region 100. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

Each memory opening 49 cuts through a respective one of the in-process sacrificial fill structures (142', 144'). In one embodiment, the memory openings 49 can be formed such that edges of memory openings 49 that extend along the second horizontal direction hd2 cut through a respective segment of the sacrificial fill material rails 144' and sidewalls of remaining portions of the sacrificial fill material rails 144' are physically exposed to the memory openings 49. In one embodiment, each memory opening 49 can have a pair of straight sidewalls that laterally extend along the second horizontal direction hd2 and are laterally spaced apart along the first horizontal direction hd1 and cuts through a respective one of the in-process sacrificial fill structures (142', 144'). Further, each memory opening 49 can have a pair of concave sidewalls that are adjoined to respective edges of the pair of straight sidewalls. The pair of concave sidewalls face each other, and are laterally spaced apart from each other along the second horizontal direction hd2. Alternatively, each memory opening 49 may have a circular horizontal cross sectional shape or any other suitable shape.

Each in-process sacrificial fill structures (142', 144') is divided into a plurality discrete sacrificial material portions. The discrete sacrificial material portions include sacrificial pillar structures (142, 144) that are located between each neighboring pair of memory openings 49 that are laterally spaced along the first horizontal direction hd1. Each sacrificial pillar structure (142, 144) includes an etch stop sacrificial liner (or a permanent etch stop liner) 142 that is a patterned portion of a respective etch stop sacrificial liner layer 142', and includes a sacrificial fill material portion 144 that is a patterned portion of a respective sacrificial fill material rail 144'. Sidewalls of two sacrificial pillar structures (142, 144) can be physically exposed in the adjacent memory openings 49.

Generally, laterally alternating sequences of sacrificial pillar structures (142, 144) and memory openings 49 can be formed through the alternating stacks (32, 42). Each of the laterally alternating sequences extends along the first horizontal direction hd1. The vertically alternating sequence (32, 42) can be divided into the alternating stacks (32, 42) of insulating layers 32 and spacer material layers (such as sacrificial material layers 42) by the laterally alternating sequences of the sacrificial pillar structures (142, 144) and the memory openings 49.

FIGS. 6A-6H illustrate structural changes in a memory opening 49, which is one of the memory openings 49 in the first exemplary structure of FIGS. 5A and 5B. The same structural change occurs simultaneously in each of the other memory openings 49 and in each of the support opening (if present).

Referring to FIG. 6A, a memory opening 49 in the exemplary device structure of FIGS. 5A and 5B is illustrated. The memory opening 49 extends through the insulating cap layer 70, the alternating stack (32, 42), and optionally into an upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 6B, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions. Alternatively or additionally, the blocking dielectric layer 52 can include a dielectric semiconductor compound such as silicon oxide, silicon oxynitride, silicon nitride, or a combination thereof. The thickness of the blocking dielectric layer 52 can be in a range from 1 nm to 20 nm, although lesser and greater thicknesses can also be employed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 6C, the optional first semiconductor channel layer 601, the tunneling dielectric layer 56, the charge storage layer 54, and the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the semiconductor material layer 10 can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the semiconductor material layer 10 by a recess distance. A tunneling dielectric layer 56 is located over the charge storage layer 54. A set of a blocking dielectric layer 52, a charge storage layer 54, and a tunneling dielectric layer 56 in a memory opening 49 constitutes an in-process memory film 50', which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Referring to FIG. 6D, a second semiconductor channel layer 602 can be deposited directly on the semiconductor surface of the semiconductor material layer 10 and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 6E, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 6F, the horizontal portion of the dielectric core layer 62L can be removed, for example, by a recess etch from above the top surface of the second semiconductor channel layer 602. Further, the material of the dielectric core layer 62L can be vertically recessed selective to the semiconductor material of the second semiconductor channel layer 602 into each memory opening 49 down to a depth between a first horizontal plane including the top surface of the insulating cap layer 70 and a second horizontal plane including the bottom surface of the insulating cap layer 70. Each remaining portion of the dielectric core layer 62L constitutes a dielectric core 62.

Referring to FIG. 6G, a doped semiconductor material having a doping of a second conductivity type can be deposited within each recessed region above the dielectric cores 62. The second conductivity type is the opposite of the first conductivity type. For example, if the first conductivity type is p-type, the second conductivity type is n-type, and vice versa. The dopant concentration of the doped semiconductor material can be in a range from $5.0 \times 10^{19}/cm^3$ to $2.0 \times 10^{21}/cm^3$, although lesser and greater dopant concentrations can also be employed. The doped semiconductor material can be, for example, doped polysilicon.

Excess portions of the deposited semiconductor material can be removed from above the top surface of the insulating cap layer 70, for example, by chemical mechanical planarization (CMP) or a recess etch. Each remaining portion of the semiconductor material having a doping of the second conductively type constitutes a drain region 63. The horizontal portion of the second semiconductor channel layer 602 located above the top surface of the insulating cap layer 70 can be concurrently removed by a planarization process. Each remaining portion of the second semiconductor channel layer 602 can be located entirety within a memory opening 49.

Each remaining portion of the doped semiconductor material having a doping of the second conductivity type constitutes a drain region 63. Each adjoining pair of a first semiconductor channel layer 601 and a second semiconductor channel layer 602 can collectively form an in-process vertical semiconductor channel 60' through which electrical current can flow when a vertical NAND device including the in-process vertical semiconductor channel 60' is turned on. A tunneling dielectric layer 56 is surrounded by a charge storage layer 54, and laterally surrounds a portion of the in-process vertical semiconductor channel 60'. Each adjoining set of a tunneling dielectric layer 56, a charge storage layer 54, and a blocking dielectric layer 52 collectively constitute an in-process memory film 50', which includes a vertical stack of memory elements that can store a respective data bit with a macroscopic retention time. As used herein, a macroscopic retention time refers to a retention time suitable for operation of a memory device as a permanent memory device such as a retention time in excess of 24 hours. In alternative embodiments, a backside gate dielectric layer 52 may not be formed in each memory opening 49, and may be subsequently formed in backside recesses that are formed by removal of the sacrificial material layers 42 at a subsequent processing step.

Each combination of an in-process memory film 50' and an in-process vertical semiconductor channel 60' within a memory opening 49 constitutes an in-process memory stack structure 55'. The in-process memory stack structure 55' is a combination of a semiconductor channel 60', a tunneling dielectric layer 56, a plurality of memory elements as embodied as portions of the charge storage layer 54, and a blocking dielectric layer 52.

In-process memory opening fill structures 58' are formed in the memory openings 49 directly on the sidewalls of the sacrificial pillar structures (142, 144), which include remaining portions of the sacrificial fill material rails 144'. Each of the in-process memory opening fill structures 58' comprises an in-process memory film 50' and an in-process vertical semiconductor channel 60'. Each combination of an in-process memory stack structure 55', a dielectric core 62, and a drain region 63 within a memory opening 49 is herein referred to as an in-process memory opening fill structure 58'. If present, each support opening can be filled with a respective support pillar structure.

Referring to FIGS. 7A-7C, the first exemplary structure is illustrated after formation of the in-process memory opening fill structures 58' within the memory openings 49. An instance of an in-process memory opening fill structure 58' can be formed within each memory opening 49 of the structure of FIGS. 5A and 5B. An instance of the support pillar structure (not shown) may be formed within each support opening (if present) of the structure of FIGS. 5A and 5B.

Each in-process memory stack structure 55' includes an in-process vertical semiconductor channel 60', which may comprise multiple semiconductor channel layers (601, 602), and an in-process memory film 50'. The in-process memory film 50' may comprise a tunneling dielectric layer 56 laterally surrounding the in-process vertical semiconductor channel 60', a vertical stack of charge storage regions (as embodied as a charge storage layer 54) laterally surrounding the tunneling dielectric layer 56, and an optional blocking dielectric layer 52.

Referring to FIGS. 8A-8C, remaining portions of the sacrificial film material rails 144' (which include all of the sacrificial fill material portions 144) can be removed selective to the etch stop sacrificial liners 142 and the outermost layers in the in-process memory opening fill structures 58' (such as the blocking dielectric layers 52) employing a selective etch process. The selective etch process etches the material of the sacrificial fill material portions 144 selective to the in-process memory films 50' and the etch stop sacrificial liners 142. Thus, portions of the sacrificial pillar structures (142, 144) are removed selective to the in-process memory opening fill structures 58'.

In an illustrative example, if the sacrificial fill material portions 144 include borosilicate glass or borophosphosilicate glass, and if the etch stop sacrificial liners 142 include densified undoped silicate glass or silicon oxycarbide, then a vapor phase clean (VPC) etch using a hydrofluoric acid ("HF") vapor can be employed to etch the sacrificial fill material portions 144 selective to the material of the etch stop sacrificial liners 142 with a selectivity greater than 10, such as greater than 50. The HF vapor can provide etch selectivity greater than 10, such as greater than 50 between borosilicate glass and densified undoped silicate glass or silicon oxycarbide, i.e., can etch borosilicate glass at an etch rate that is at least 10 times, such as at least 50 times higher than the etch rate of densified undoped silicate glass of silicon oxycarbide.

Cavities 143 can be formed in volumes from which the remaining portions of the sacrificial fill material rails 144' are removed. In one embodiment, each neighboring pair of in-process memory opening fill structures 58' that are laterally spaced along the first horizontal direction hd1 can be laterally spaced from each other by a cavity 143. An etch stop sacrificial liner 142 having a U-shape and outer sidewalls of the neighboring pair of in-process memory opening fill structures 58' can be physically exposed to the cavity 143.

Referring to FIGS. 9A-9D, a first isotropic etch process can be performed, which etches materials of the in-process memory films 50'. At least one first isotropic etchant is provided into the cavities 143 formed by removal of the sacrificial fill material portions 144 (which are portions of the sacrificial pillar structures (142, 144)). For example, the first isotropic etch process can apply a sequence of isotropic etchants to sequentially etch physically exposed portions of the blocking dielectric layers 52, the charge storage layers 54, and the tunneling dielectric layers 56. In one embodiment, a sequence of wet etch steps can be employed for the first isotropic etch process. The first isotropic etch process divides each of the in-process memory films 50' into a respective pair of a first memory film 50A and a second memory film 50B. The first memory films 50A and the second memory films 50B are herein collectively referred to as memory films 50. The materials of the in-process memory films 50' are isotropically etched during the various steps of the first isotropic etch process, and the isotropic etch front forms concave sidewalls on remaining portions of the in-process memory films 50'. In one embodiment, each memory film 50 can have a pair of physically exposed concave sidewalls, which are herein referred to first concave sidewalls 131. A pair of first concave sidewalls 131 of a first memory film 50A and a second memory film 50B located in a same memory opening 49 can be laterally spaced from each other along the second horizontal direction hd2 by a first lateral separation distance lsd1, which can be greater than a trench width tw, which is the same as the lateral distance between a parallel pair of sidewalls of a line trench (i.e., the width of the line trench).

A second isotropic etch process can be performed, which etches materials of the in-process vertical semiconductor channels 60'. At least one second isotropic etchant is provided into the cavities 143 formed by removal of the sacrificial fill material portions 144. For example, the second isotropic etch process can apply an isotropic etchant to etch physically exposed portions of the second semiconductor channel layers 602 and the first semiconductor channel layer 602. In an illustrative example, the second isotropic etch process can include a wet etch process employing hot trimethyl-2 hydroxyethyl ammonium hydroxide ("hot TMY") or tetramethyl ammonium hydroxide (TMAH). The second isotropic etch process divides each of the in-process vertical semiconductor channels 60' into a respective pair of a first vertical semiconductor channel 60A and a second vertical semiconductor channel 60B. The first vertical semiconductor channels 60A and the second vertical semiconductor channels 60B are herein collectively referred to as vertical semiconductor channels 60. The materials of the in-process vertical semiconductor channels 60' are isotropically etched during the second isotropic etch process, and the isotropic etch front forms concave sidewalls on remaining portions of the in-process vertical semiconductor channels 60'. In one embodiment, each vertical semiconductor channel 60 can have a pair of physically exposed concave sidewalls, which are herein referred to second concave sidewalls 132. A pair of second concave sidewalls 132 of a first vertical semiconductor channel 60A and a second vertical semiconductor channel 60B located in a same memory opening 49 can be laterally spaced from each other along the second horizontal direction hd2 by a second lateral separation distance lsd2, which can be greater than the first lateral separation distance lsd1.

The etch stop sacrificial liners 142 protect the alternating stack (32, 42) from etching during the first and second isotropic etch processes described above. The protection of the alternating stack (e.g., an alternating stack of silicon oxide and silicon nitride layers) from the isotropic etch processes by the etch stop sacrificial liners is advantageous because it reduces etch damage to the alternating stack.

Planar segments 133 of the sidewall of each dielectric core 62 can be physically exposed to the cavities 143 after the second isotropic etch process. Each contiguous combination of a first memory film 50A and the first vertical semiconductor channel 60A constitutes a first memory stack structure 55A. Each contiguous combination of a second memory film 50B and the second vertical semiconductor channel 60B constitutes a second memory stack structure 55B. The first memory stack structures 55A and the second memory stack structures 55B are collectively referred to as memory stack structures 55.

Each of the memory openings 49 comprises a respective memory opening fill structure 58 that includes a dielectric core 62, a first vertical semiconductor channel 60A located on a first segment of a sidewall of the dielectric core 62, a second vertical semiconductor channel 50B located on a second segment of the sidewall of the dielectric core 52 and is physically disjoined from (i.e., is not in direct contact with, and is spaced from) the first vertical semiconductor channel 60A, a first memory film 50A contacting the first vertical semiconductor channel 60A, and a second memory film 50B contacting the second vertical semiconductor channel 60B. The first segment of the sidewall of the dielectric core 62 and the second segment of the sidewall of the dielectric core 62 can be laterally spaced apart along the second horizontal direction hd2, and can have a respective convex profile in a horizontal cross-sectional view.

In a first aspect of the first embodiment in which the spacer material layers 42 as formed comprise electrically conductive layers (i.e., metal, metal alloy or heavily doped polysilicon word lines), the steps described below with respect to FIGS. 10A to 11C are omitted, and the cavities 143 are filled with dielectric fill structures 148, such as silicon oxide structures, as shown in FIGS. 12E and 12F. In this case, the etch stop liners 142 are retained in the final device. In a second aspect of the first embodiment in which the cavities 143 are not used to provide etchant which selectively etches away the sacrificial material layers 42 to form recesses, the steps described below with respect to FIGS. 10A to 11C are also omitted, and the cavities 143 are filled with dielectric fill structures 148, such as silicon oxide structures, as shown in FIGS. 12E and 12F. Instead, alternative additional openings or trenches are formed through the alternating stack (32, 42) to provide an etchant which etches away the sacrificial material layers 42 to form recesses which are subsequently filled with electrically conductive layers (e.g., word lines) through the alternative additional openings or trenches. In this case, the etch stop liners 142 are retained in the final device.

In a third aspect of the first embodiment in which the cavities 143 are used to provide etchant which selectively etches away the sacrificial material layers 42 to form recesses, the steps described below with respect to FIGS. 10A to 11C are performed. Referring to FIGS. 10A-10C, the etch stop sacrificial liners 142 can be removed to physically expose sidewalls of the insulating layers 32 and the sacrificial material layers 42 of the alternating stacks (32, 42). In one embodiment, removal of the etch stop sacrificial liners 142 can be performed after the second isotropic etch process, after the first isotropic etch process and before the second isotropic etch process, or concurrently with the first isotropic etch process. Generally, the material of the etch stop sacrificial liners 142 can be etched without significantly etching the material of the insulating layers 32 or the material of the dielectric cores 62. Thus, the sacrificial pillar structures (142, 144) can be completely removed.

An isotropic etchant that selectively etches the second material of the sacrificial material layers 42 with respect to the first material of the insulating layers 32 can be introduced into the cavities 143, for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor into the cavities 143. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of memory stack structures 55. In this case, each backside recess 43 can define a space for receiving a respective word line for the memory stack structures 55. Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Referring to FIGS. 11A-11C, a backside blocking dielectric layer (not shown) can be optionally formed on the physically exposed surfaces of the first exemplary structure by a conformal deposition process. The thickness of the backside blocking dielectric layer, if present, can be in a range from 1 nm to 15 nm, such as 2 to 6 nm, although lesser and greater thicknesses can also be employed. At least one metallic material can be subsequently deposited. For example, the at least one metallic material can include a metallic barrier layer and a metallic fill material.

The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof, or can include a conductive metallic carbide material such as TiC, TaC, WC, or a stack thereof. The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material can consist essentially of at least one elemental metal. The at least one elemental metal of the metallic fill material can be selected, for example, from tungsten, cobalt, ruthenium, titanium, and tantalum. In one embodiment, the metallic fill can consist essentially of a single elemental metal such as tungsten.

A plurality of electrically conductive layers 46 can be formed in the plurality of backside recesses 43, and a continuous electrically conductive material layer can be formed on the sidewalls of each cavity 143. Each electrically conductive layer 46 includes a portion of the metallic barrier layer and a portion of the metallic fill material that are located between a vertically neighboring pair of dielectric material layers such as a pair of insulating layers 32. The continuous electrically conductive material layer includes a continuous portion of the metallic barrier layer and a continuous portion of the metallic fill material that are located in the cavities 143 or above the insulating cap layer 70.

An unfilled void can be present within the volume of each cavity 143. The deposited metallic material of the continuous electrically conductive material layer is etched back from the sidewalls of each cavity 143 and from above the insulating cap layer 70, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices. A pair of memory stack structures 55 can be formed within each memory opening 49. In the second aspect of the first embodiment in which the cavities 143 are not used to provide etchant which selectively etches away the sacrificial material layers 42 to form recesses, alternative additional openings or trenches are formed through the alternating stack (32, 42) to provide an etchant which etches away the sacrificial material layers 42 to form recesses 43 which are then filled with the electrically conductive layers 46 through the alternative additional openings or trenches.

Referring to FIGS. 12A-12D, a dielectric material can be deposited in the cavities 143 by a conformal deposition process, according to the third aspect of the first embodiment. The dielectric material can include undoped silicate glass or a doped silicate glass. Portions of the dielectric material that fills the cavities include dielectric pillar structures 148. Thus, the volumes from which the sacrificial pillar structures (142, 144) are removed with dielectric pillar structures 148. Horizontal portions of the dielectric material that overlie the insulating cap layer 70 may be removed by a planarization process (such as a chemical mechanical planarization process), or may be incorporated into the insulating cap layer 70.

FIGS. 12E and 12F illustrate structures of the first and second aspects of the first embodiment in which the etch stop liners 142 are retained in the cavities 143. The cavities 142 are filled with the dielectric fill structures 148 which contact the etch stop liners 142, as shown in FIGS. 12E and 12F. In this case, the etch stop liners 142 are retained in the final device.

Referring to all aspects of the first embodiment illustrated in FIGS. 12A to 12F, laterally alternating sequences of memory opening fill structures 58 and dielectric pillar structures 148 can vertically extend through the alternating stacks of the insulating layers 32 and the electrically conductive layers, and can laterally extend along the first horizontal direction hd1. Each of the memory openings 49 comprises a respective memory opening fill structure 58 that includes a dielectric core 62, a first vertical semiconductor channel 60A located on a first segment of a sidewall of the dielectric core 62, a second vertical semiconductor channel 60B located on a second segment of the sidewall of the dielectric core 62 and is physically disjoined from the first vertical semiconductor channel 60A, a first memory film 50A contacting the first vertical semiconductor channel 60A, and a second memory film 50B contacting the second vertical semiconductor channel 60B. The dielectric core 62 contacts a pair of dielectric pillar structures 148 among the dielectric pillar structures 148 of the laterally alternating sequences.

In one embodiment, the pair of dielectric pillar structures 148 comprises a first dielectric pillar structure 148A contacting a third segment of the sidewall of the dielectric core 62; and a second dielectric pillar structure 149B contacting a fourth segment of the sidewall of the dielectric core 62. The third segment and the fourth segment laterally extend along the second horizontal direction hd1.

In one embodiment, the first segment of the sidewall of the dielectric core 62 and the second segment of the sidewall of the dielectric core 62 are laterally spaced apart along the second horizontal direction hd2 and have a respective convex profile in a horizontal cross-sectional view.

In one embodiment, the pair of dielectric pillar structures (148A, 148B) in contact with the dielectric core 62 comprises a first dielectric pillar structure 148A and a second dielectric pillar structure 148B. The first dielectric pillar structure 148A comprises a pair of first convex sidewalls 151 that contacts concave sidewalls of the first memory film 50A and the second memory film 50B, and comprises a pair of second convex sidewalls 152 that contact concave sidewalls of the first vertical semiconductor channel 60A and the second vertical semiconductor channel 60B. Each dielectric pillar structure 148 can have a planar segment 153 located within a two-dimensional vertical plane and contacting a respective dielectric core 62.

In one embodiment, the pair of first convex sidewalls 151 is laterally spaced apart from each other along the second horizontal direction hd2 by a first lateral separation distance lsd1, and the pair of second convex sidewalls 152 are laterally spaced apart from each other along the second horizontal direction hd2 by a second lateral separation distance lsd2 that is greater than the first lateral separation distance lsd1. In one embodiment, a pair of electrically conductive layers 46 among the electrically conductive layer 46 is laterally spaced along the second horizontal direction hd2 by the respective memory opening fill structure 58, the first dielectric pillar structure 148A, and the second dielectric pillar structure 148B. The minimum lateral separation distance between the pair of electrically conductive layers 46 along the second horizontal direction hd2 can be the same as the trench width tw, and is less than the first lateral separation distance lsd1.

In one embodiment, the first memory film 50A comprises an outer sidewall contacting a sidewall of one of the memory openings 49 and an inner sidewall that is locally parallel to the outer sidewall due to a uniform thickness of the first memory film 50A. A center segment of the inner sidewall of the first memory film 50A contacts an outer sidewall of the first vertical semiconductor channel 60A. A peripheral segment of the inner sidewall of the first memory film 50A contacts a sidewall of the first dielectric pillar structure 148A that adjoins one of the pair of first convex sidewalls 151 and adjoins one of the pair of second convex sidewalls 152.

In one embodiment, each of the pair of dielectric pillar structures 148 comprises a pair of planar sidewalls that extend along the first horizontal plane hd1 and disposed between neighboring pairs of electrically conductive layers 46 that are laterally spaced apart along the second horizontal direction hd2.

In one embodiment, each of the pair of dielectric pillar structures 148 comprises a pair of convex sidewalls 154 that face, and/or contact, concave sidewalls 144 of neighboring pairs of electrically conductive layers 46 that are laterally spaced apart along the second horizontal direction hd2.

In one embodiment, a maximum lateral dimension of the dielectric core 62 along the second horizontal direction hd2 is greater than a maximum lateral dimension of the dielectric core 62 along the first horizontal direction hd1. The first segment of the sidewall of the dielectric core 62 and the second segment of the sidewall of the dielectric core 62 comprise convex surfaces, and segments of the dielectric core 62 that contact the pair of dielectric pillar structures comprises planar vertical surfaces (which can be surfaces of the planar segments 133 contained in two-dimensional Euclidean vertical planes) that are parallel to the second horizontal direction hd2.

Each dielectric core 62 can be laterally bounded by a sidewall that continuously extends around the respective dielectric core 62. In one embodiment, a first dielectric pillar structure 148A can contact a third segment (which can be a planar segment 133) of the sidewall of the dielectric core 62, and a second dielectric pillar structure 148B can contact a fourth segment (which can be another planar segment 133) of the sidewall of the dielectric core 62. The third segment and the fourth segment can laterally extend along the second horizontal direction hd2.

Referring to FIGS. 13A-13C, at least one interconnect-level dielectric layer can be formed over the insulating cap layer 70 and the retro-stepped dielectric material portion 65. Various metal interconnect structures can be formed through the at least one interconnect-level and the retro-stepped dielectric material portion 65. The various metal interconnect structures can include drain contact via structures 88 contacting a top surface of a respective one of the drain regions 63, and word line contact via structures 86 contacting a top surface of a respective one of the electrically conductive layers 46. Peripheral device contact via structures (not shown) can be formed through the retro-stepped dielectric material portion 65 directly on respective nodes of the at least one semiconductor device 700 in the peripheral region 200. The metal interconnect structures can include metal lines such as bit lines 98 that laterally extend along the second horizontal direction hd2 and contact a respective subset of the drain contact via structures 88. Further, the metal lines can include word-line-connection metal lines 96 that provide electrical connection to the word line contact via structures 86.

A pair of memory stack structures (55A, 55B) can be formed within each memory opening 49. A first memory stack structure 55A can be located on a first segment of a sidewall of a dielectric core 62 and can contact sidewalls of insulating layers 42 within a first alternating stack of insulating layers 32 and electrically conductive layers 46 located on one side of a laterally alternating sequence of memory opening fill structures 58 and dielectric pillar structures 148. A second memory stack structure 55B can be located on a second segment of a sidewall of a dielectric core 62 and can contact sidewalls of insulating layers 42 within a second alternating stack of insulating layers 32 and electrically conductive layers 46 located on another side of a laterally alternating sequence of memory opening fill structures 58 and dielectric pillar structures 148. The first memory stack structure 55A and the second memory stack structure 55B provide two vertical NAND strings within a single memory opening 49. A first vertical semiconductor channel 60A and a second vertical semiconductor channel 60B can contact a common drain region 63 at a respective top end, and can be connected to each other at a bottom end by a horizontal semiconductor material portion that underlies the dielectric core 62, which can be the material of the second semiconductor channel layer 60L.

Referring to FIGS. 14A-14C, a second exemplary structure according to a second embodiment of the present disclosure can be derived from the first exemplary structure of FIG. 3 by forming an array of discrete openings in the memory array region instead of forming the line trenches described in reference to FIGS. 4A and 4B. The array of discrete openings can include rows of discrete openings. Each discrete opening can vertically extend through the insulating cap layer 70 and each layer within the vertically alternating sequence (32, 42) of the insulating layers 32 and the spacer material layers (such as the sacrificial material layers 42). Each row of discrete openings laterally extend along the first horizontal direction hd1, and neighboring rows of discrete openings can be laterally spaced apart along the second horizontal direction hd2. Optionally, additional line trenches can be formed in each staircase region 300 and at peripheral regions of the memory array region 100. Alternatively, these additional line trenches may be omitted.

The array of discrete openings and the line trenches can be formed simultaneously by applying a photoresist layer over the insulating cap layer 70, by lithographically patterning the photoresist layer to form openings having the shapes of the discrete openings and the optional line trenches to be subsequently formed through the vertically alternating sequence, and by anisotropically etching the vertically alternating sequence (32, 42) employing the patterned photoresist layer as an etch mask. Each discrete opening and each line trench can vertically extend to the substrate (9, 10). The photoresist layer can be subsequently removed, for example, by ashing. Each row of discrete openings can be formed as a periodic one-dimensional array of discrete openings having a uniform pitch. In one embodiment, each row of discrete openings can have the same pitch along the first horizontal direction hd1. In one embodiment, the pitch of each row of discrete openings can be in a range from 50 nm to 400 nm, although lesser and greater pitches can also be employed. The lateral dimension of each discrete opening along the first horizontal direction hd1 can be in a range from 40% to 70% of the pitch of a row of discrete opening. The lateral spacing between each neighboring pair of discrete openings within each row of discrete openings can be less than the lateral dimension of a memory opening to be subsequently formed along the first horizontal direction hd1.

Each discrete opening and each line trench can be filled with a respective sacrificial fill structure, which is subsequently modified and then removed. The sacrificial fill structures include in-process sacrificial pillar structures (242, 244') formed in the discrete openings and optional rail-shaped sacrificial fill structures (242, 144) formed in the optional line trenches (i.e., if the line trenches are present). The in-process sacrificial pillar structures (232, 144) are sacrificial fill structures that are subsequently modified, i.e., in-process sacrificial fill structures. Each in-process sacrificial pillar structure (242, 244') includes an etch stop sacrificial liner 242 that lines all surfaces of a respective discrete opening and an in-process sacrificial fill material portion 244' located within the etch stop sacrificial liner 242. Each rail-shaped sacrificial fill structure (242, 144) can include an etch stop sacrificial liner 242 that lines lengthwise sidewalls and a bottom surface of a respective line trench and a sacrificial fill material portion 144 having a shape of a rail. The material composition and the thickness of each etch stop sacrificial liner 242 can be the same as the material composition and the thickness of each etch stop sacrificial liner layer 142' of the first exemplary structure. The material composition of the in-process sacrificial fill material portions 244' and the sacrificial fill material portions 144 can be the same as the material composition of the sacrificial fill material rails 144' in the first exemplary structure.

Referring to FIGS. 15A-15C, a lithographic material stack (not shown) including at least a photoresist layer can be formed over the insulating cap layer 70 and the retro-stepped dielectric material portion 65, and can be lithographically patterned to form openings over the memory array region 100. The openings in the photoresist layer can be arranged as rows that laterally extend along the first horizontal direction hd1. Each row of openings in the photoresist layer can overlie a respective row of in-process sacrificial pillar structures (242, 244'). Each row of openings in the photoresist layer can have a same pitch, which can be the same as the pitch of the in-process sacrificial pillar structures (242, 244') along the first horizontal direction hd1. Each row of openings in the photoresist layer can be laterally offset along the first horizontal direction hd1 from the underlying row of in-process sacrificial pillar structures (242, 244') by one half of the pitch. Each opening in the photoresist layer overlaps with a neighboring pair of in-process sacrificial pillar structures (242, 244'), or with an in-process sacrificial pillar structure (242, 244') and a rail-shaped sacrificial fill structure (242, 144). In one embodiment, each opening in the photoresist layer overlaps with segments of etch stop sacrificial liners 242 within a neighboring pair of in-process sacrificial pillar structures (242, 244'), or within an in-process sacrificial pillar structure (242, 244') and a rail-shaped sacrificial fill structure (242, 144).

The pattern of the openings in the photoresist layer can be transferred through the insulating cap layer 70 and the vertically alternating sequence (32, 42) by at least one anisotropic etch that employs the patterned photoresist layer as an etch mask. Portions of the vertically alternating sequence (32, 42) underlying the openings in the patterned photoresist layer are etched to form memory openings 49. Optionally, the photoresist layer may include additional openings in the staircase region, and support openings (not shown) may be formed through the retro-stepped dielectric material portion 65 and the underlying portions of the vertically alternating sequence (32, 42) during the anisotropic etch process. The memory openings 49 are formed through the insulating cap layer 70 and each layer of the vertically alternating sequence (32, 42) in the memory array region 100.

Each memory opening cuts through a segment of each etch stop sacrificial liner 242 within a neighboring pair of in-process sacrificial pillar structures (242, 244'), or within an in-process sacrificial pillar structure (242, 244') and a rail-shaped sacrificial fill structure (242, 144). Each etch stop sacrificial liner 242 within an in-process sacrificial pillar structures (242, 244') is etched at two segments that are laterally spaced apart along the first horizontal direction hd2 during the anisotropic etch process that forms the memory openings 49. Two vertically extending regions of each in-process sacrificial fill material portions 244' can be etched by the anisotropic etch process, and each remaining portion of the in-process sacrificial fill material portions 244' is herein referred to as a sacrificial fill material portion 244. Further, each segment of an etch stop sacrificial liner 242 within a rail-shaped sacrificial fill structure (242, 144) that is located in proximity to an in-process sacrificial pillar structures (242, 244') can be cut by a respective memory opening 49 during the anisotropic etch process.

Each contiguous combination of a remaining portion of an etch stop sacrificial liner 242 and a sacrificial fill material portion 244 is herein referred to as a sacrificial pillar structure (242, 244). Two sidewall segments of a sacrificial fill material portion 244 within each sacrificial pillar structure (242, 244) can be physically exposed to the memory openings 49. Each etch stop sacrificial liner 242 within the sacrificial pillar structures (242, 244) can have two side openings that laterally extend through the levels of each layer within the alternating stacks (32, 42). Each etch stop sacrificial liner 242 can have a U-shaped vertical cross-sectional profile with two side openings that are exposed to a pair of memory openings 49.

The memory openings 49 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 may be coplanar with the topmost surface of the semiconductor material layer 10.

Each of the memory openings 49 may include a sidewall (or a plurality of sidewalls) that extends substantially perpendicular to the topmost surface of the substrate. A two-dimensional array of memory openings 49 can be formed in the memory array region 100. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 can be extend to a top surface of the substrate semiconductor layer 9.

The combination of the sacrificial pillar structures (242, 244), the memory openings 49, and the rail-shaped sacrificial fill structure (242, 144) divide the vertically alternating sequence of the insulating layers 32 and the spacer material layers (such as sacrificial material layers 42) into multiple discrete portions, each of which constitutes an alternating stack of patterned insulating layers 32 and patterned spacer material layers (such as patterned sacrificial material layers 42). Multiple patterned strips of the alternating stack (32, 42) can be formed in the memory array region 100 such that each strip of the alternating stack (32, 42) laterally extends along the first horizontal direction hd1. Multiple laterally-extending strips of the alternating stack (32, 42) may be connected to a common portion of an alternating stack (32, 42) including stepped surfaces in the staircase region 300. In case two staircase regions 300 are located on opposite sides of the memory array region 100, the strips of the alternating stacks (32, 42) can be sequentially numbered with integers (such as 1, 2, 3, etc.) along the second horizontal direction hd2, and every odd-numbered strips of the alternating stack (32, 42) can be connected to a respective patterned portion of the alternating stack (32, 42) located in one of the staircase regions 300, and every even-numbered strips of the alternating stack (32, 42) can be connected to a respective patterned portion of the alternating stack (32, 42) located in another of the staircase regions 300.

Generally, laterally alternating sequences of sacrificial pillar structures (242, 244) and memory openings 49 can be formed through the alternating stacks (32, 42). Each of the laterally alternating sequences extends along the first horizontal direction hd1. The vertically alternating sequence (32, 42) can be divided into the alternating stacks (32, 42) of insulating layers 32 and spacer material layers (such as sacrificial material layers 42) by the laterally alternating sequences of the sacrificial pillar structures (242, 244) and the memory openings 49.

Referring to FIGS. 16A-16C, the processing steps of FIGS. 6A-6G can be performed to form an in-process memory opening fill structure 58' within each of the memory openings 59. Each combination of an in-process memory film 50' and an in-process vertical semiconductor channel 60' within a memory opening 49 constitutes an in-process memory stack structure 55'. The in-process memory stack structure 55' is a combination of a semiconductor channel 60', a tunneling dielectric layer 56, a plurality of memory elements as embodied as portions of the charge storage layer 54, and a blocking dielectric layer 52.

In-process memory opening fill structures 58' are formed in the memory openings 49 directly on the sidewalls of the sacrificial pillar structures (242, 244). Each of the in-process memory opening fill structures 58' comprises an in-process memory film 50' and an in-process vertical semiconductor channel 60'. Each combination of an in-process memory stack structure 55', a dielectric core 62, and a drain region 63 within a memory opening 49 is herein referred to as an in-process memory opening fill structure 58'. If present, each support opening can be filled with a respective support pillar structure.

Each in-process memory stack structure 55' includes an in-process vertical semiconductor channel 60', which may comprise multiple semiconductor channel layers (601, 602), and an in-process memory film 50'. The in-process memory film 50' may comprise a tunneling dielectric layer 56 laterally surrounding the in-process vertical semiconductor channel 60', a vertical stack of charge storage regions (as embodied as a charge storage layer 54) laterally surrounding the tunneling dielectric layer 56, and an optional blocking dielectric layer 52.

Referring to FIGS. 17A-17C, the processing steps of FIGS. 8A-8C can be performed. The various sacrificial fill material portions (144, 244) within the sacrificial pillar structures (242, 244) and the rail-shaped sacrificial fill structure (242, 144) can be removed selective to the etch stop sacrificial liners 242 and the outermost layers in the in-process memory opening fill structures 58' (such as the blocking dielectric layers 52) employing an isotropic etch process. The isotropic etch process etches the material of the sacrificial fill material portions (144, 244) selective to the in-process memory films 50' and the etch stop sacrificial liners 242. Thus, portions of the sacrificial pillar structures (242, 144) are removed selective to the in-process memory opening fill structures 58'.

In an illustrative example, if the sacrificial fill material portions (144, 244) include borosilicate glass or borophosphosilicate glass, and if the etch stop sacrificial liners 242 include densified undoped silicate glass, a mixture of hydrofluoric acid and a solvent can be employed to etch the sacrificial fill material portions (144, 244) selective to the material of the etch stop sacrificial liners 242 with a selectivity greater than 50. Cavities 143 can be formed in volumes from which the sacrificial fill material portions (144, 244) are removed. In one embodiment, each neighboring pair of in-process memory opening fill structures 58' that are laterally spaced along the first horizontal direction hd1 can be laterally spaced from each other by a cavity 143. An etch stop sacrificial liner 242 having a U-shape and outer sidewalls of the neighboring pair of in-process memory opening fill structures 58' can be physically exposed to the cavity 143.

Referring to FIGS. 18A-18D, the processing steps of FIGS. 9A-9D can be performed. Specifically, a first isotropic etch process can be performed, which etches materials of the in-process memory films 50'. The first isotropic etch process divides each of the in-process memory films 50' into a respective pair of a first memory film 50A and a second memory film 50B. The first memory films 50A and the second memory films 50B are herein collectively referred to as memory films 50. The materials of the in-process memory films 50' are isotropically etched during the various steps of the first isotropic etch process, and the isotropic etch front forms concave sidewalls on remaining portions of the in-process memory films 50'. In one embodiment, each memory film 50 can have a pair of physically exposed concave sidewalls, which are herein referred to first concave sidewalls 131. A pair of first concave sidewalls 131 of a first memory film 50A and a second memory film 50B located in a same memory opening 49 can be laterally spaced from each other along the second horizontal direction hd2 by a first lateral separation distance lsd1, which can be greater than a minimum lateral separation distance between a neighboring pair of sacrificial material layers 42 that are laterally spaced apart along the second horizontal direction hd2.

A second isotropic etch process can be performed, which etches materials of the in-process vertical semiconductor channels 60'. At least one second isotropic etchant is provided into the cavities 143 formed by removal of the sacrificial fill material portions 144. The second isotropic etch process divides each of the in-process vertical semiconductor channels 60' into a respective pair of a first vertical semiconductor channel 60A and a second vertical semiconductor channel 60B. The first vertical semiconductor channels 60A and the second vertical semiconductor channels 60B are herein collectively referred to as vertical semiconductor channels 60. The materials of the in-process vertical semiconductor channels 60' are isotropically etched during the second isotropic etch process, and the isotropic etch front forms concave sidewalls on remaining portions of the in-process vertical semiconductor channels 60'. In one embodiment, each vertical semiconductor channel 60 can have a pair of physically exposed concave sidewalls, which are herein referred to second concave sidewalls 132. A pair of second concave sidewalls 132 of a first vertical semiconductor channel 60A and a second vertical semiconductor channel 60B located in a same memory opening 49 can be laterally spaced from each other along the second horizontal direction hd2 by a second lateral separation distance lsd2, which can be greater than the first lateral separation distance lsd1.

The etch stop sacrificial liners 242 protect the alternating stack (32, 42) from etching during the first and second isotropic etch processes described above. The protection of the alternating stack (e.g., an alternating stack of silicon oxide and silicon nitride layers) from the isotropic etch processes by the etch stop sacrificial liners is advantageous because it reduces etch damage to the alternating stack.

Planar segments 133 of the sidewall of dielectric core 62 can be physically exposed to the cavities 143 after the second isotropic etch process. Each contiguous combination of a first memory film 50A and the first vertical semiconductor channel 60A constitutes a first memory stack structure 55A. Each contiguous combination of a second memory film 50B and the second vertical semiconductor channel 60B constitutes a second memory stack structure 55B. The first memory stack structures 55A and the second memory stack structures 55B are collectively referred to as memory stack structures 55.

Each of the memory openings 49 comprises a respective memory opening fill structure 58 that includes a dielectric core 62, a first vertical semiconductor channel 60A located on a first segment of a sidewall of the dielectric core 62, a second vertical semiconductor channel 50B located on a second segment of the sidewall of the dielectric core 52 and is physically disjoined from the first vertical semiconductor channel 60A, a first memory film 50A contacting the first vertical semiconductor channel 60A, and a second memory film 50B contacting the second vertical semiconductor channel 60B. The first segment of the sidewall of the dielectric core 62 and the second segment of the sidewall of the dielectric core 62 can be laterally spaced apart along the second horizontal direction hd2, and can have a respective convex profile in a horizontal cross-sectional view.

Referring to FIGS. 19A-19C, the processing steps of FIGS. 10A-10C can be performed to remove etch stop sacrificial liners 242. Alternatively, the etch stop liners 242 may be retained in the final device similar to the configuration shown in FIGS. 12E and 12F if the cavities 143 are not used to replace sacrificial material layers 42 with electrically conductive layers 46.

Referring to FIG. 20, an isotropic etchant that selectively etches the second material of the sacrificial material layers 42 with respect to the first material of the insulating layers 32 can be introduced into the cavities 143, for example, employing an etch process. Backside recesses 43 are formed in volumes from which the sacrificial material layers 42 are removed.

Referring to FIG. 21, an optional backside blocking dielectric layer, a metallic barrier layer, and a metallic fill material can be deposited in the backside recesses 43 and at peripheral portions of the cavities 143 by performing the processing steps of FIGS. 11A-11C. A plurality of electrically conductive layers 46 can be formed in the plurality of backside recesses 43, and a continuous electrically conductive material layer can be formed on the sidewalls of each cavity 143.

An unfilled void can be present within the volume of each cavity 143. The deposited metallic material of the continuous electrically conductive material layer is etched back from the sidewalls of each cavity 143 and from above the insulating cap layer 70, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46. A pair of memory stack structures 55 can be formed within each memory opening 49.

Referring to FIGS. 22A-22D, a dielectric material can be deposited in the cavities 143 by a conformal deposition process. The dielectric material can include undoped silicate glass or a doped silicate glass. Portions of the dielectric material that fills the cavities include dielectric pillar structures 148. Thus, the volumes from which the sacrificial pillar structures (142, 144) are removed with dielectric pillar structures 148. Horizontal portions of the dielectric material that overlie the insulating cap layer 70 may be removed by a planarization process (such as a chemical mechanical planarization process), or may be incorporated into the insulating cap layer 70.

Laterally alternating sequences of memory opening fill structures 58 and dielectric pillar structures 148 can vertically extend through the alternating stacks of the insulating layers 32 and the electrically conductive layers, and can laterally extend along the first horizontal direction hd1. Each of the memory openings 49 comprises a respective memory opening fill structure 58 that includes a dielectric core 62, a first vertical semiconductor channel 60A located on a first segment of a sidewall of the dielectric core 62, a second vertical semiconductor channel 60B located on a second segment of the sidewall of the dielectric core 62 and is physically disjoined from the first vertical semiconductor channel 60A, a first memory film 50A contacting the first vertical semiconductor channel 60A, and a second memory film 50B contacting the second vertical semiconductor channel 60B. The dielectric core 62 contacts a pair of dielectric pillar structures 148 among the dielectric pillar structures 148 of the laterally alternating sequences.

In one embodiment, the pair of dielectric pillar structures 148 comprises a first dielectric pillar structure 148A contacting a third segment of the sidewall of the dielectric core 62; and a second dielectric pillar structure 149B contacting a fourth segment of the sidewall of the dielectric core 62. The third segment and the fourth segment laterally extend along the second horizontal direction hd1.

In one embodiment, the first segment of the sidewall of the dielectric core 62 and the second segment of the sidewall of the dielectric core 62 are laterally spaced apart along the second horizontal direction hd2 and have a respective convex profile in a horizontal cross-sectional view.

In one embodiment, the pair of dielectric pillar structures (148A, 148B) in contact with the dielectric core 62 comprises a first dielectric pillar structure 148A and a second dielectric pillar structure 148B. The first dielectric pillar structure 148A comprises a pair of first convex sidewalls 151 that contacts concave sidewalls of the first memory film 50A and the second memory film 50B, and comprises a pair of second convex sidewalls 152 that contact concave sidewalls of the first vertical semiconductor channel 60A and the second vertical semiconductor channel 60B. Each dielectric pillar structure 148 can have a planar segment 153 located within a two-dimensional vertical plane and contacting a respective dielectric core 62.

In one embodiment, the pair of first convex sidewalls 151 is laterally spaced apart from each other along the second horizontal direction hd2 by a first lateral separation distance lsd1, and the pair of second convex sidewalls 152 are laterally spaced apart from each other along the second horizontal direction hd2 by a second lateral separation distance lsd2 that is greater than the first lateral separation distance lsd1. In one embodiment, a pair of electrically conductive layers 46 among the electrically conductive layer 46 is laterally spaced along the second horizontal direction hd2 by the respective memory opening fill structure 58, the first dielectric pillar structure 148A, and the second dielectric pillar structure 148B.

In one embodiment, the first memory film 50A comprises an outer sidewall contacting a sidewall of one of the memory openings 49 and an inner sidewall that is locally parallel to the outer sidewall due to a uniform thickness of the first memory film 50A. A center segment of the inner sidewall of the first memory film 50A contacts an outer sidewall of the first vertical semiconductor channel 60A. A peripheral segment of the inner sidewall of the first memory film 50A contacts a sidewall of the first dielectric pillar structure 148A that adjoins one of the pair of first convex sidewalls 151 and adjoins one of the pair of second convex sidewalls 152.

In one embodiment, each of the pair of dielectric pillar structures 148 comprises a pair of planar sidewalls that extend along the first horizontal plane hd1 and disposed between neighboring pairs of electrically conductive layers 46 that are laterally spaced apart along the second horizontal direction hd2.

In one embodiment, each of the pair of dielectric pillar structures 148 comprises a pair of convex sidewalls 154 that face, and/or contact, concave sidewalls 144 of neighboring pairs of electrically conductive layers 46 that are laterally spaced apart along the second horizontal direction hd2.

In one embodiment, a maximum lateral dimension of the dielectric core 62 along the second horizontal direction hd2 is greater than a maximum lateral dimension of the dielectric core 62 along the first horizontal direction hd1. The first segment of the sidewall of the dielectric core 62 and the second segment of the sidewall of the dielectric core 62 comprise convex surfaces, and segments of the dielectric core 62 that contact the pair of dielectric pillar structures comprises planar vertical surfaces (which can be surfaces of the planar segments 133 contained in two-dimensional Euclidean vertical planes) that are parallel to the second horizontal direction hd2.

Each dielectric core 62 can be laterally bounded by a sidewall that continuously extends around the respective dielectric core 62. In one embodiment, a first dielectric pillar structure 148A can contact a third segment (which can be a planar segment 133) of the sidewall of the dielectric core 62, and a second dielectric pillar structure 148B can contact a fourth segment (which can be another planar segment 133) of the sidewall of the dielectric core 62. The third segment and the fourth segment can laterally extend along the second horizontal direction hd2.

Referring to FIGS. 23A-23C, at least one interconnect-level dielectric layer can be formed over the insulating cap layer 70 and the retro-stepped dielectric material portion 65. Various metal interconnect structures can be formed through the at least one interconnect-level and the retro-stepped dielectric material portion 65. The various metal interconnect structures can include drain contact via structures 88 contacting a top surface of a respective one of the drain regions 63, and word line contact via structures 86 contacting a top surface of a respective one of the electrically conductive layers 46. Peripheral device contact via structures (not shown) can be formed through the retro-stepped dielectric material portion 65 directly on respective nodes of the at least one semiconductor device 700 in the peripheral region 200. The metal interconnect structures can include metal lines such as bit lines 98 that laterally extend along the second horizontal direction hd2 and contact a respective subset of the drain contact via structures 88. Further, the metal lines can include word-line-connection metal lines 96 that provide electrical connection to the word line contact via structures 86.

A pair of memory stack structures (55A, 55B) can be formed within each memory opening 49. A first memory stack structure 55A can be located on a first segment of a sidewall of a dielectric core 62 and can contact sidewalls of insulating layers 42 within a first alternating stack of insulating layers 32 and electrically conductive layers 46 located on one side of a laterally alternating sequence of memory opening fill structures 58 and dielectric pillar structures 148. A second memory stack structure 55B can be located on a second segment of a sidewall of a dielectric core 62 and can contact sidewalls of insulating layers 42 within a second alternating stack of insulating layers 32 and electrically conductive layers 46 located on another side of a laterally alternating sequence of memory opening fill structures 58 and dielectric pillar structures 148. The first memory stack structure 55A and the second memory stack structure 55B provide two vertical NAND strings within a single memory opening 49. A first vertical semiconductor channel 60A and a second vertical semiconductor channel 60B can contact a common drain region 63 at a respective top end, and can be connected to each other at a bottom end by a horizontal semiconductor material portion that underlies the dielectric core 62, which can be the material of the second semiconductor channel layer 602.

Generally, the various embodiments of the present disclosure provide a three-dimensional memory device that comprises: alternating stacks of insulating layers 32 and electrically conductive layers 46 located over a substrate (9, 10), wherein each of the alternating stacks (32, 46) laterally extend along a first horizontal direction hd1 and neighboring pairs of the alternating stacks (32, 46) are laterally spaced apart along a second horizontal direction by laterally alternating sequences of memory openings 49 and dielectric pillar structures 148, wherein each of the memory openings 49 comprises a respective memory opening fill structure 58 that includes a dielectric core 62, a first vertical semiconductor channel 60A located on a first segment of a sidewall of the dielectric core 62, a second vertical semiconductor channel 60B located on a second segment of the sidewall of the dielectric core 62 and is physically disjoined from the first vertical semiconductor channel 60B, a first memory film 50A contacting the first vertical semiconductor channel 60A, and a second memory film 50B contacting the second vertical semiconductor channel 60B; and the dielectric core 62 contacts a pair of dielectric pillar structures 148 among the dielectric pillar structures 148 of the laterally alternating sequences.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
alternating stacks of insulating layers and electrically conductive layers located over a substrate, wherein each of the alternating stacks laterally extend along a first horizontal direction and neighboring pairs of the alternating stacks are laterally spaced apart along a second horizontal direction by laterally alternating sequences of memory openings and dielectric pillar structures, wherein:
each of the memory openings comprises a respective memory opening fill structure that includes a dielectric core, a first vertical semiconductor channel located on a first segment of a sidewall of the dielectric core, a second vertical semiconductor channel located on a second segment of the sidewall of the dielectric core and is physically disjoined from the first vertical semiconductor channel, a first memory film contacting the first vertical semiconductor channel, and a second memory film contacting the second vertical semiconductor channel; and
the dielectric core contacts a pair of dielectric pillar structures among the dielectric pillar structures of the laterally alternating sequences.

2. The three-dimensional memory device of claim 1, wherein the pair of dielectric pillar structures comprises:
a first dielectric pillar structure contacting a third segment of the sidewall of the dielectric core; and
a second dielectric pillar structure contacting a fourth segment of the sidewall of the dielectric core, wherein the third segment and the fourth segment laterally extend along the second horizontal direction.

3. The three-dimensional memory device of claim 1, wherein the first segment of the sidewall of the dielectric core and the second segment of the sidewall of the dielectric core are laterally spaced apart along the second horizontal direction and have a respective convex profile in a horizontal cross-sectional view.

4. The three-dimensional memory device of claim 1, wherein:
the pair of dielectric pillar structures in contact with the dielectric core comprises a first dielectric pillar structure and a second dielectric pillar structure;
the first dielectric pillar structure comprises a pair of first convex sidewalls that contacts concave sidewalls of the first memory film and the second memory film, and comprises a pair of second convex sidewalls that contact concave sidewalls of the first vertical semiconductor channel and the second vertical semiconductor channel.

5. The three-dimensional memory device of claim 4, wherein:
the pair of first convex sidewalls is laterally spaced apart from each other along the second horizontal direction by a first lateral separation distance; and
the pair of second convex sidewalls are laterally spaced apart from each other along the second horizontal direction by a second lateral separation distance that is greater than the first lateral separation distance.

6. The three-dimensional memory device of claim 5, wherein:
a pair of electrically conductive layers among the electrically conductive layers are laterally spaced along the second horizontal direction by the respective memory opening fill structure, the first dielectric pillar structure, and the second dielectric pillar structure; and
a minimum lateral separation distance between the pair of electrically conductive layers along the second horizontal direction is less than the first lateral separation distance.

7. The three-dimensional memory device of claim 4, wherein:
the first memory film comprises an outer sidewall contacting a sidewall of one of the memory openings and an inner sidewall that is locally parallel to the outer sidewall:
a center segment of the inner sidewall of the first memory film contacts an outer sidewall of the first vertical semiconductor channel; and
a peripheral segment of the inner sidewall of the first memory film contacts a sidewall of the first dielectric pillar structure that adjoins one of the pair of first convex sidewalls and adjoins one of the pair of second convex sidewalls.

8. The three-dimensional memory device of claim 1, wherein each of the pair of dielectric pillar structures comprises a pair of planar sidewalls that extend along the first horizontal plane and disposed between neighboring pairs of electrically conductive layers that are laterally spaced apart along the second horizontal direction.

9. The three-dimensional memory device of claim 1, wherein each of the pair of dielectric pillar structures comprises a pair of convex sidewalls that face concave sidewalls of neighboring pairs of electrically conductive layers that are laterally spaced apart along the second horizontal direction.

10. The three-dimensional memory device of claim 1, wherein:
the respective memory opening fill structure comprises a drain region contacting a top end of the first vertical semiconductor channel and a top end of the second vertical semiconductor channel; and
a bottom end of the first vertical semiconductor channel and a bottom end of the second vertical semiconductor channel contacts a semiconductor material portion located at a bottom of, or underneath, one of the memory openings that includes the respective memory opening fill structure.

11. The three-dimensional memory device of claim 1, wherein:
a maximum lateral dimension of the dielectric core along the second horizontal direction is greater than a maximum lateral dimension of the dielectric core along the first horizontal direction;
the first segment of the sidewall of the dielectric core and the second segment of the sidewall of the dielectric core comprise convex surfaces; and
segments of the dielectric core that contact the pair of dielectric pillar structures comprises planar vertical surfaces that are parallel to the second horizontal direction.

12. The three-dimensional memory device of claim 1, wherein:
each of the first memory film and the second memory film comprises a layer stack including a charge storage layer and a tunneling dielectric layer;
each of the alternating stacks comprises a respective staircase region containing stepped surfaces of a respective alternating stack; and
layer contact via structures contact a top surface of a respective one of the electrically conductive layers of the alternating stacks in each of the staircase regions.

13. A method of forming a three-dimensional memory device, comprising:
forming a vertically alternating sequence of continuous insulating layers and continuous spacer material layers over a substrate;

forming laterally alternating sequences of sacrificial pillar structures and memory openings through the vertically alternating sequence, wherein Each of the laterally alternating sequences extends along a first horizontal direction and the vertically alternating sequence is divided into alternating stacks of insulating layers and spacer material layers by the laterally alternating sequences of the sacrificial pillar structures and the memory openings;

forming in-process memory opening fill structures in the memory openings, wherein each of the in-process memory opening fill structures comprises an in-process memory film and an in-process vertical semiconductor channel;

removing portions of the sacrificial pillar structures selective to the in-process memory opening fill structures;

dividing each of the in-process memory films into a respective pair of a first memory film and a second memory film; and dividing each of the in-process vertical semiconductor channels into a respective pair of a first vertical semiconductor channel and a second vertical semiconductor channel.

14. The method of claim 13, wherein:

performing a first etch process that etches materials of the in-process memory films by providing at least one first etchant into cavities formed by removal of the portions of the sacrificial pillar structures, wherein the first etch process divides each of the in-process memory films into the respective pair of the first memory film and the second memory film; and performing a second etch process that etches portions of the in-process vertical semiconductor channels by providing a second etchant into the cavities, wherein the second etch process divides each of the in-process vertical semiconductor channels into the respective pair of the first vertical semiconductor channel and the second vertical semiconductor channel.

15. The method of claim 14, further comprising:

forming in-process sacrificial fill structures through the vertically alternating sequence; and forming an array of memory openings through the vertically alternating sequence after formation of the in-process sacrificial fill structures, wherein:

the array of memory openings etches through portions of the in-process sacrificial fill structures; and remaining portions of the in-process sacrificial fill structures comprise the sacrificial pillar structures.

16. The method of claim 15, wherein:

the method comprises forming line trenches laterally extending along the first horizontal direction through the vertically alternating sequence;

the in-process sacrificial fill structures comprise trench fill sacrificial structures formed in the line trenches; and the sacrificial pillar structures comprise portions of the in-process sacrificial fill structures that remain after formation of the memory openings.

17. The method of claim 15, wherein:

the method further comprises forming a two-dimensional array of discrete openings through the vertically alternating sequence;

the in-process sacrificial fill structures comprise in-process sacrificial pillar structures that are formed in the two-dimensional array of discrete openings; and the sacrificial pillar structures comprise portions of the in-process sacrificial pillar structures that remain after formation of the memory openings.

18. The method of claim 13, wherein:

each of the in-process sacrificial fill structures comprises a respective etch stop liner contacting sidewalls of the alternating stacks of insulating layers and spacer material layers and comprises a respective sacrificial fill material rail that is laterally spaced from most proximal ones of the alternating stacks by the respective etch stop liner; and the memory openings are formed such that edges of memory openings that extend along the second horizontal direction cut through a respective segment of the sacrificial fill material rails and sidewalls of remaining portions of the sacrificial fill material rails are physically exposed to the memory openings.

19. The method of claim 18, wherein:

the in-process memory opening fill structures are formed directly on the sidewalls of remaining portions of the sacrificial fill material rails; and the method further comprises removing the remaining portions of the sacrificial fill material rails after formation of the in-process memory opening fill structures employing a selective etch process that etches a material of the sacrificial fill material rails selective to the in-process memory films and the etch stop liners.

20. The method of claim 19, wherein:

the continuous spacer material layers comprise a sacrificial material; and the method further comprises:

replacing the spacer material layers with electrically conductive layers after removal of the sacrificial pillar structures; and filling volumes from which the sacrificial pillar structures are removed with dielectric pillar structures.

* * * * *